United States Patent
Motoyoshi

(10) Patent No.: US 12,463,078 B2
(45) Date of Patent: Nov. 4, 2025

(54) MICRO-ELEMENT, ALIGNMENT SYSTEM AND ASSEMBLING METHOD

(71) Applicant: TOHOKU-MICROTEC CO., LTD., Sendai (JP)

(72) Inventor: Makoto Motoyoshi, Sendai (JP)

(73) Assignee: TOHOKU-MICROTEC CO., LTD., Sendai (JP)

(*) Notice: Subject to any disclaimer, the term of this patent is extended or adjusted under 35 U.S.C. 154(b) by 85 days.

(21) Appl. No.: 18/483,564

(22) Filed: Oct. 10, 2023

(65) Prior Publication Data

US 2024/0404864 A1    Dec. 5, 2024

Related U.S. Application Data

(63) Continuation of application No. PCT/JP2023/020603, filed on Jun. 2, 2023.

(51) Int. Cl.
*H01L 23/00* (2006.01)
*H01L 21/67* (2006.01)
*H01L 21/683* (2006.01)

(52) U.S. Cl.
CPC .... *H01L 21/6835* (2013.01); *H01L 21/67144* (2013.01); *H01L 24/63* (2013.01);
(Continued)

(58) Field of Classification Search
CPC ... H01L 2224/95144; H01L 2224/8112; H01L 2224/81121; H01L 2224/81143;
(Continued)

(56) References Cited

U.S. PATENT DOCUMENTS

| | | | |
|---|---|---|---|
| 8,138,868 B2 | 3/2012 | Arnold | |
| 8,334,152 B2 * | 12/2012 | Speier | H01L 21/6836 438/26 |

(Continued)

FOREIGN PATENT DOCUMENTS

| | | |
|---|---|---|
| JP | 2004-340696 A | 12/2004 |
| JP | 2012-256737 A | 12/2012 |

(Continued)

OTHER PUBLICATIONS

Yifan Wu, et al., Full Color-Realization of Micro-LED Display, Nanomaterials, Oct. 2020, pp. 1-33, vol. 2482, Basel, Switzerland.
(Continued)

*Primary Examiner* — David A Zarneke
(74) *Attorney, Agent, or Firm* — Polsinelli PC

(57) ABSTRACT

An alignment system arranges a plurality of micro-elements at positions on a mounting substrate, the micro-elements are equal in dimension and shape. The alignment system encompasses a rough alignment-apparatus including a picker having capturing-probes, each of which having a capturing-face and a magnetic-force applying portion provided on the capturing-face, and a base-plate on which the capturing-probes are arrayed with an array-pattern. In the alignment system, each of the magnetic-force applying portions applies magnetic lines on the magnetic-force receptor to capture one of the micro-elements.

4 Claims, 24 Drawing Sheets

(52) U.S. Cl.
CPC .............. *H01L 24/65* (2013.01); *H01L 24/73* (2013.01); *H01L 24/80* (2013.01); *H01L 24/95* (2013.01); *H01L 2221/68309* (2013.01); *H01L 2221/68313* (2013.01); *H01L 2221/68354* (2013.01); *H01L 2221/68368* (2013.01); *H01L 2224/95144* (2013.01)

(58) Field of Classification Search
CPC ... H01L 2224/8212; H01L 2224/82121; H01L 2224/82143; H01L 2224/8312; H01L 2224/83121; H01L 2224/83143; H01L 2224/8412; H01L 2224/84121; H01L 2224/84143; H01L 24/63; H01L 24/65–67; H01L 24/73; H01L 24/80; H01L 24/95
See application file for complete search history.

(56) References Cited

U.S. PATENT DOCUMENTS

| | | | |
|---|---|---|---|
| 8,518,204 B2 * | 8/2013 | Hu | H01L 24/95 156/273.1 |
| 8,586,410 B2 | 11/2013 | Arnold et al. | |
| 10,147,622 B2 * | 12/2018 | Wu | H01L 24/81 |
| 2010/0015730 A1 * | 1/2010 | Lian | G06K 19/07749 438/106 |
| 2012/0313236 A1 | 12/2012 | Wakiyama et al. | |
| 2017/0148650 A1 | 5/2017 | Wu et al. | |
| 2017/0330857 A1 * | 11/2017 | Zou | H01L 24/83 |
| 2022/0384225 A1 | 12/2022 | Motoyoshi | |
| 2023/0178280 A1 * | 6/2023 | Kim | H01L 23/544 700/219 |
| 2024/0381531 A1 * | 11/2024 | Chaji | H05K 13/0015 |

FOREIGN PATENT DOCUMENTS

| | | |
|---|---|---|
| KR | 10-2022-0077522 A | 6/2022 |
| WO | 2022/249431 A1 | 12/2002 |

OTHER PUBLICATIONS

Extended European Search Report (EESR) dated Feb. 10, 2025 for EP 23806162.6 (12 pgs.).

* cited by examiner

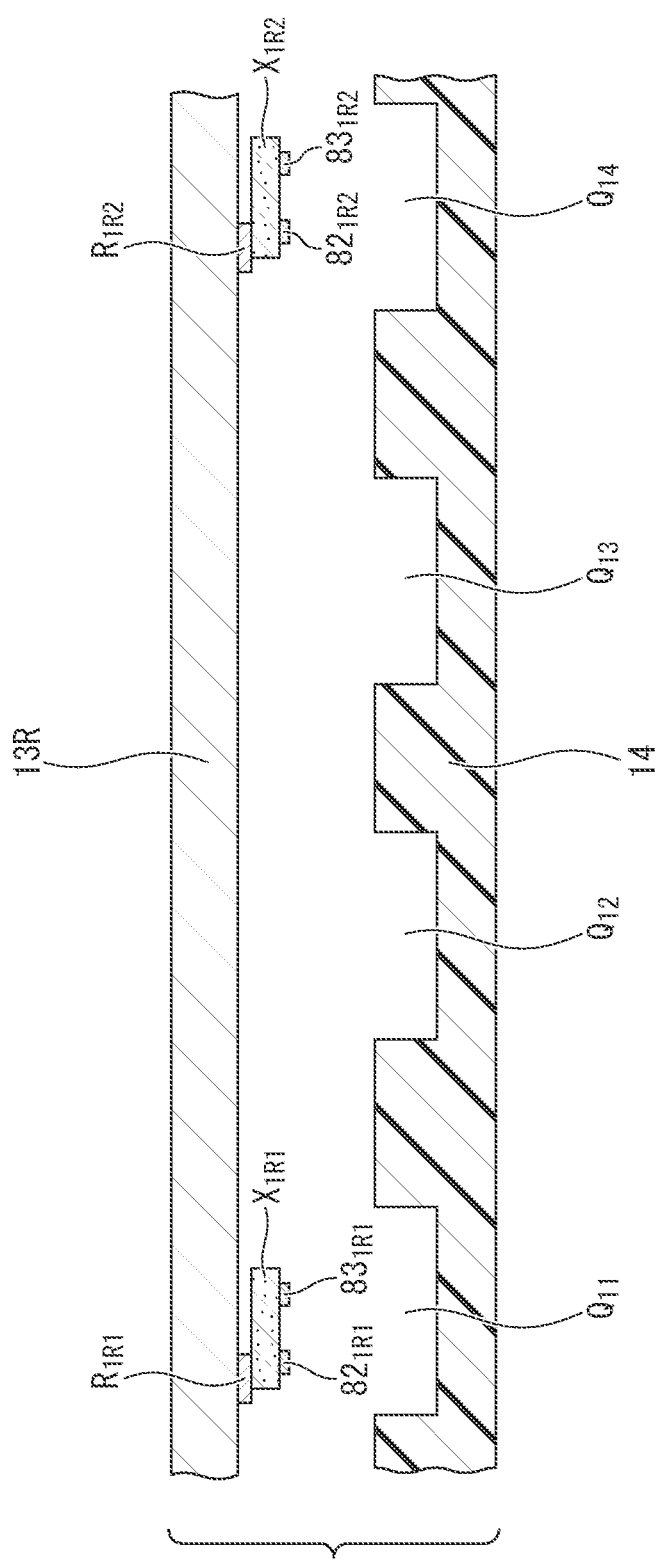
F I G. 8B $\delta_1 \neq \delta_2 \neq \delta_3$

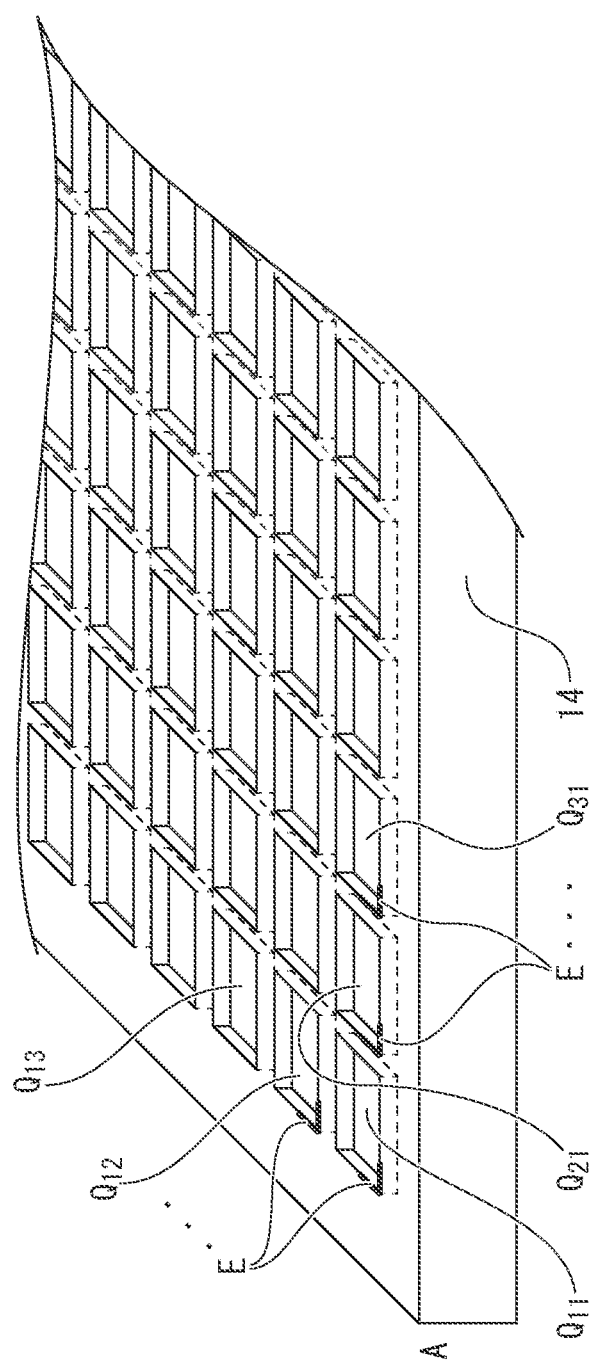

MICRO-ELEMENT, ALIGNMENT SYSTEM AND ASSEMBLING METHOD

CROSS REFERENCE TO RELATED APPLICATIONS

This is a continuation of pending International Application No. PCT/JP2023/020603 with an international filing date of Jun. 2, 2023, which designated the United States, titled "Micro-Element, Alignment System and Assembling Method", which is incorporated entirely herein by reference.

BACKGROUND OF THE INVENTION

Field of the Invention

The present invention relates to a micro-element implemented by a minute chip having the maximum diagonal-length on a principal-face is about one mm or less, and an alignment system of the micro-elements and an assembling method using the alignment system. Specifically, the present invention pertains to the alignment system and the assembling method that are preferable for hybrid assembly of a large number of micro-elements having different structures and various orientations with a microscopic-minuteness and high-precision.

Description of the Related Art

Micro-elements such as mini-LEDs, micro-LEDs and the like are attracting a large attention as next-generation display-apparatuses, which are suitable for applications in large-scale display-apparatuses such as outdoor display-apparatuses, in augmented reality (AR) glasses and in display-apparatuses of portable telephones, due to the features of high brightness, high contrast and the like. For example, a micro-LED display for portable telephone is a self-light-emitting display device, which is established by an array of pixels, each of pixels is constructed by a set of micro-LED chips for emitting lights with different wavelengths of R (Red), G (Green) and B (Blue) colors, one latus-length of each of the micro-LED chips is about 50 micrometers or less, respectively. By driving each of the micro-LED chips of R, G and B colors in respective pixels, a merit that a display having fast response speed, microscopic-minuteness/high-precision, high viewing-angle with low electric power consumption can be achieved, compared with liquid crystal displays (for example, see W. Yifan, et al., "Full-Color Realization of Micro-LED Displays", Nanomaterials, October 2020, Vol. 2482, p. 1-33).

Each of light-emitting layers in micro-LED chips for emitting R, G and B colors (hereinafter abbreviated as "RGB-colors") is made of semiconductor material having different forbidden-band width e.g, respectively. Therefore, a monolithic integration of the micro-LED elements made of different semiconductor materials on a single chip is difficult. Pixels with RGB-colors, or the micro-LED chips having different structures with different semiconductor materials shall be individually manufactured, and therefore, a hybrid integration of micro-LED chips made of different semiconductor materials or different structures is necessary for constructing a display apparatus. A problem to-be-solved in the hybrid integration lies in a high throughput technology and equipment for assembling a large number of micro-LED chips. Therefore, a minute/high-precise technology and a minute/high-precise equipment for assembling micro-element chips, each having the maximum diagonal-length of about several tens of micrometers or less, are required, for example.

Exempli causa, for transferring a large number of micro-LED chips, each having a latus-length of about 15 micrometers and an electrode width of three micrometers, to a target back-plane, an alignment-accuracy of ±1.5 micrometers or less is required for respective micro-LED chips. However, the alignment-accuracy specification of existing transfer-equipment—pick & place scheme—is far below the above requirement. For example, the alignment-accuracy is about 35 micrometers in range, at a throughput of 20,000 chips per hour. On the other hand, under a technology circumstance in which the number of pixels in liquid crystal display is being increasing, and a larger screen is being progressing, the improvements of yield and throughput must be achieved. Thus, a development of microscopic-minute assembling technology for collectively transporting and assembling a large number of micro-LED chips with high-precision on one occasion, without reducing the yield and the throughput, is desired.

In an earlier micro-LED display, the micro-LED chips are picked up by a stamp method from a position of LED wafer, using intermolecular forces and mounted on a display panel. Regarding the LED wafer, a multi-level structure including an n-type conductivity layer, a light-emitting layer, a p-type conductivity layer, and the like is sequentially crystal-grown on a substrate such as a sapphire substrate, by using a crystal growth method such as metal-organic chemical vapor deposition (MOCVD). However, a light-emitting intensity and a wavelength are sensitively changed owing to thickness-variations of the respective layers implementing the multi-level structure. Thus, when the micro-LED chips diced from the LED wafer are picked up simultaneously to be assembled on the panel, film thickness distributions at a time of crystal growth will appear on the display as unevenness. Also, central values of light-emitting wavelengths vary between different wafers. Therefore, a procedure including a sequence of processes is required, such that the micro-LED chips are diced randomly from a plurality of LED wafers, the micro-LED chips are further shuffled, and after shuffling, the micro-LED chips are bonded on a driving panel of the display at a precision of several micrometers.

As recited in WO 2022/249431A, the present inventor already proposed a microscopic-minute/high-precise assembling technology that can collectively align a plurality of micro-elements such as micro-LED chips and the like on one occasion, with microscopic-minuteness and high-precision by a simple apparatus configuration, without reducing yield and throughput, by using an alignment tray. In the method of the invention described by WO 2022/249431A, one of quadruple circumscribing-ridges possessed by the micro-element is selected as a mover-to-be-mated. And one of quadruple inscribed-ridges implemented by quadruple side-wall planes in each of concaves in the alignment tray is selected as an interface-ridge. Then, each of circumscribing-ridges serving as the mover-to-be-mated (hereafter, called "a ridge-to-be-mated") is displaced toward the corresponding interface-ridges to determine an array position in a lump.

However, when the micro-elements are shuffled, the relationship between a top face and a bottom face is reversed, and rotations are generated in which the ridge-to-be-mated is varied within a range of ±45 degrees centered at 90 degrees, within a range of ±45 degrees centered at 180 degrees, or within a range of ±45 degrees centered at 270 degrees, and the micro-elements are orientated in random chip-orientation. That is, the circumscribing-ridges selected as the ridge-to-be-mated of the micro-element are present at quadruple locations when the circumscribing-ridges are viewed from the top face of the micro-element, and present at quadruple locations when the circumscribing-ridges are viewed from the bottom face of the micro-element. Thus, when the ridge-to-be-mated is selected, there are a total of eight locations of arbitrariness. Therefore, when the micro-elements are picked up by the earlier stamp method and the like while the orientation is ignored, a problem that an effective achievement of the spirit in the invention described by WO 2022/249431A is difficult becomes clear. That is, after the micro-elements are randomly shuffled, in such a way that the relationship between the top face and the bottom face is reversed, or that the positions of the circumscribing-ridges are rotated in a range of ±45 degrees with respect to reference orientations of 90 degrees, 180 degrees, 270 degrees or the like to generate random chip-orientations, the micro-elements cannot be aligned in the desired chip-orientation in a scheduled orientation range, even if the micro-elements are put into the alignment tray described in WO 2022/249431A, by the earlier micro-element capturing-technology.

SUMMARY OF THE INVENTION

A first aspect of the present invention inheres in a micro-element encompassing a functional face, a bottom face parallel to the functional face, a plurality of circumscribing-ridges connecting the functional and bottom faces, and a magnetic-force receptor allocated at a limited site on the functional face. In the micro-element pertaining to the first aspect, positions of a particular circumscribing-ridge elected among the plurality of circumscribing-ridges and the functional face are identified by the magnetic-force receptor.

A second aspect of the present invention inheres in an alignment system configured to arrange a plurality of micro-elements of the first aspect at scheduled positions on a mounting substrate, the micro-elements are equal in dimension and shape. The alignment system pertaining to the second aspect encompasses a rough alignment-apparatus including a picker having (a) a plurality of capturing-probes, each of which having a capturing-face made of flat plane and a magnetic-force applying portion provided on the capturing-face, and (b) a base-plate on which the plurality of capturing-probes is arrayed with a predetermined array-pattern. In the alignment system pertaining to the second aspect, each of the magnetic-force applying portions applies magnetic lines on the magnetic-force receptor to capture one of the micro-elements, respectively.

A third aspect of the present invention inheres in an assembling method including (a) shuffling a group of a plurality of micro-elements, which are equal in dimension and shape, each of which has a functional face, a bottom face parallel to the functional face and circumscribing-ridges connecting the functional and bottom faces, (b) inserting a plurality of capturing-probes, each of which having a magnetic-force applying portion provided on each of capturing-faces made of flat planes, into the group of the plurality of micro-elements, and applying magnetic lines spreading from each of the magnetic-force applying portions to a magnetic-force receptor provided at a particular position of the functional face, and thereby picking up the micro-elements, whose number is equal to a number of the capturing-probes; and (c) arraying the micro-elements picked up by the capturing-probes on a mounting substrate, and assembling the micro-elements on the mounting substrate.

BRIEF DESCRIPTION OF THE DRAWINGS

FIG. 8B is a process-flow cross-sectional view, which corresponds to a cross-sectional view taken along a plane D in FIG. 8A and illustrates a situation in which a first transport-tray capturing a plurality of micro-elements is transported to a location above the precise alignment-tray.

FIG. 11B is a view in which a part of the precise alignment-tray in FIG. 11A is enlarged.

DETAILED DESCRIPTION OF THE EMBODIMENTS

Figure 1:
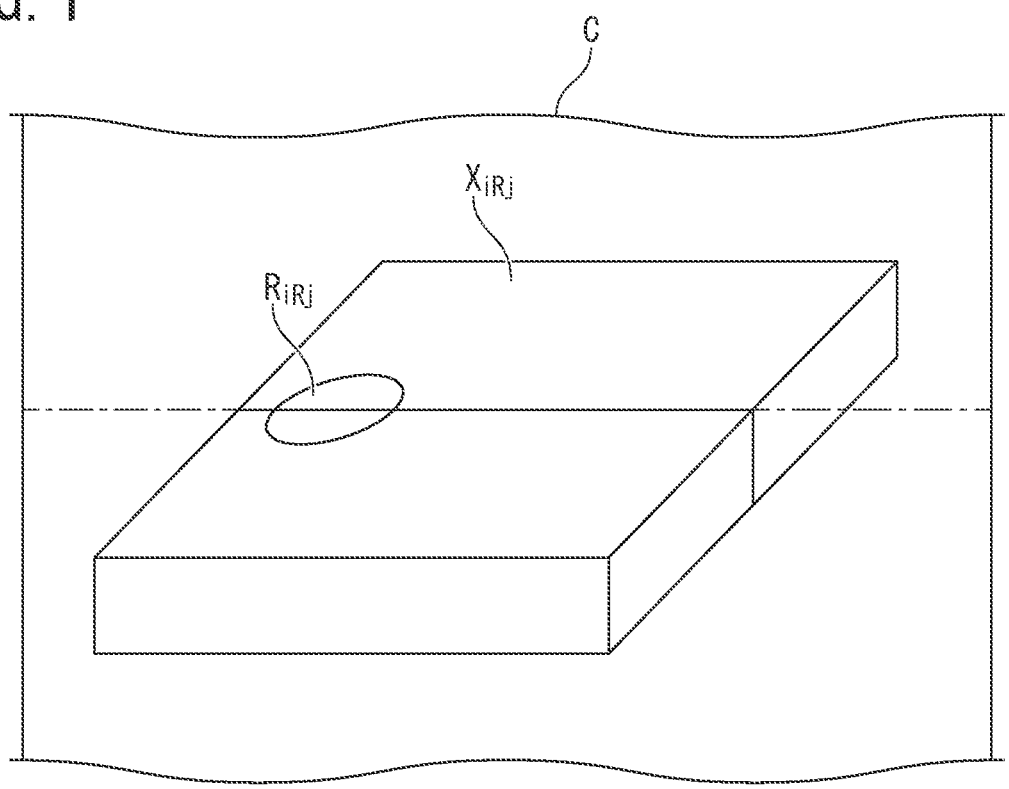
FIG. 1 is a bird's-eye view explaining an outline of a structure of a micro-element pertaining to a representative embodiment, representing a technical idea of the present invention.

Hereinafter, a representative embodiment, which represents a technical idea of the present invention will be described with reference to the drawings. In the following description of the drawings for the representative embodiment, the same or similar parts are denoted by the same or similar reference numerals. However, it should be noted that the drawings are schematic, the relationship between the thickness and the planar dimension, the ratio of the size of each member, and the like may be different from the actual one. Therefore, specific thicknesses, dimensions, sizes, and the like should be determined more variously by considering the gist of the technical ideas that can be understood from the following description. In addition, it should also be understood that the respective drawings are illustrated with the dimensional relationships and proportions different from each other.

In addition, the representative embodiment described below exemplify methods for concretizing the technical idea of the present invention and apparatuses used in the methods, and the technical idea of the invention does not specify the material, shape, structure, arrangement and the like of the elements, and the procedures of the methods, and the like described below. The technical idea of the present invention is not limited to the content described in the representative embodiment, and various modifications can be made within the technical scope defined by the claims. For example, the "upper" and "lower" are converted to the "right" and "left" if observed by rotating the object by 90°, and inverted to the "lower" and "upper" if observed by rotating 180°, of course.

Micro-Elements

As micro-elements pertaining to a representative embodiment representing a technical idea of the present invention, a set of a first micro-element (red-LED) $X_{iRj}$, a second micro-element (green-LED) $X_{iGj}$ and a third micro-element (blue-LED) $X_{iBj}$, which have an identical dimension, and are equal in shape, will be explained as examples. The red-LED, the green-LED and the blue-LED differ from each other in light-emitting wavelengths. Thus, the first, second and third micro-elements are made of different semiconductor materials, and have different structures, which disables the monolithic integration. Therefore, in the example of the set of the first micro-element $X_{iRj}$, the second micro-element $X_{iGj}$ and the third micro-element $X_{iBj}$, a large number of micro-elements, or 10,000 to 20,000 or more micro-elements, for example are hybrid integrated on a mounting substrate. By the way, in the present specification of the present application, "the same dimension and the same shape" means that the first, second and third micro-elements are confusingly similar in outer shape and appearance, except for colors of chips.

"Different structure" shall mean the difference in physical structure and chemical structure, and shall include not only the difference in semiconductor material but also the difference in impurity concentration and the difference in thickness of the respective layers of an n-type conductivity layer, a light-emitting layer and a p-type conductivity layer which implement a semiconductor element. Moreover, the different structure shall include the difference in electrode materials, the difference in depth of contact layers to which the electrode materials are contacted, the difference in structures of alloys between the electrode materials and the contact layers, and the like. Whether the multi-level structure encompassing the n-type conductivity layer, the light-emitting layer and the p-type conductivity layer is a single-hetero junction structure or a double-hetero junction structure shall correspond to the differences in structures. As the first micro-element $X_{iRj}$ implementing the set of the micro-elements pertaining to the representative embodiment, a minute rectangular chip is exemplified which has a three-dimensional shape whose principal-faces parallel to each other are rectangular or square as illustrated in FIG. 1. However, the chip shape is merely exemplified, and the principal-faces parallel to each other may be hexagonal or the like.

In the micro-element implemented by plate-shaped cuboid and cubes as illustrated in FIG. 1, "the principal-faces" are two plains each of which is larger in area than each of quadruple side-faces defining the thickness of the micro-element. If the principal-face is rectangular or square, out of the quadruple side-faces of the micro-element, the side-faces adjacent to each other intersect at right angle. If the micro-elements are cuboid or cube, concaves $Q_{11}$, $Q_{12}$, $Q_{13}$, $Q_{21}$, - - -, $Q_{31}$, - - - provided in a precise alignment-tray 14 illustrated in FIG. 8A and the like as described later are required to be rectangular. However, if the principal-face is hexagonal, even the shape of the concave viewed from above the precise alignment-tray 14 is required to be hexagonal. In addition, the precise alignment-tray 14 illustrated in FIG. 8A or the like corresponds to the alignment tray described in WO 2022/249431A.

When each of the first micro-element $X_{iRj}$, the second micro-element $X_{iGj}$ and the third micro-element $X_{iBj}$ has a three-dimensional shape close to a cube (regular hexahedron), directions for measuring the thickness of the micro-element can be defined along triple directions. In the first micro-element $X_{iRj}$ pertaining to the representative embodiment, among sextuple faces possessed by the three-dimensional shape, if a particular single face is assigned as "the first functional face" and an opposite face parallel to the first functional face shall be defined as "the first bottom face", and the definition for the shape close to the cube can be extended to the case of the cube. Similarly, in the second micro-element $X_{iGj}$ pertaining to the representative embodiment, among sextuple faces possessed by the three-dimensional shape, if a particular single face is assigned as "the second functional face" and an opposite face parallel to the second functional face shall be defined as "the second bottom face", and the definition can be extended to the case of the cube. Also, in the third micro-element $X_{iBj}$, among sextuple faces possessed by the three-dimensional shape, a particular single face is assigned as "the third functional face" and an opposite face parallel to the third functional face shall be defined as "the third bottom face", and the definition can be extended to the case of the cube.

If the above extended definition is applied to a light-emitting element such as LED and the like, each of "the first to third functional faces" is a face for emitting light, which is an important function as the light-emitting element. If the above extended definition is applied to a light-receiving element, each of "the first to third functional faces" is a face for receiving light, which is an important function as the light-receiving element. Hypothetically, if first to third bottom faces opposite to the corresponding first to third top faces are assigned oppositely as the first to third functional faces, the respective first to third micro-elements cannot exhibit the own functions. Also, for example, if an array is implemented by first light-receiving elements having the same forbidden-band width as the first micro-element $X_{iRj}$, second light-receiving elements having the same forbidden-band width as the second micro-element $X_{iGj}$ and third light-receiving elements having the same forbidden-band width as the third micro-element $X_{iBj}$, and the lights emitted from the first micro-elements $X_{iRj}$, the second micro-elements $X_{iGj}$ and the third micro-elements $X_{iBj}$ are received by the array, a color image sensor having a high sensitivity can be provided.

In the present specification, if "the first to third micro-elements" are not required to be separately distinguished, the first to third micro-elements are comprehensively expressed simply as "the micro-element". Similarly, if "the first to third functional faces" and "the first to third bottom faces" are not required to be separately distinguished, the nomenclature is comprehensively expressed simply as "the functional face" and "the bottom face". As the micro-elements pertaining to the representative embodiment, the set of the micro-elements embracing different-structured red-LED, green-LED and blue-LED is exemplified for the sake of convenience. However, as to the micro-elements required for hybrid assembling, there may be a case that even micro-elements of a single kind are targeted. In the case that the micro-elements of the single kind are subjected, the subject micro-element shall be expressed as "the micro-element". For example, emitting or receiving ultrasonic waves is an important function for an ultrasonic element, then a plane emitting or receiving the ultrasonic waves shall be assigned as the functional face in a case of the ultrasonic element. For example, in case of a capacitive micromachined ultrasonic transducer (cMUT) based upon micro electro mechanical system (MEMS) technology, a planar geometry of the functional face is regular hexagon, in many cases. In the case of cMUT, an enlargement of frequency band can be achieved, by arraying different-structured cMUTs, in which materials or physical properties such as Young's modulus and the like of a vibration electrode, or thickness of the vibration electrode is varied. If the functional face and the bottom face are reversely selected in cMUT, the function execution of the ultrasonic element as the micro-element becomes impossible. A set of a high-frequency cMUT and a low-frequency cMUT corresponds to a set of micro-elements of two kinds, which includes "a first micro-element" and "a second micro-element".

When the three-dimensional shape of the micro-element pertaining to the representative embodiment is a cube or cuboid, the functional and bottom faces are connected through quadruple circumscribing-ridges. In the invention described by WO 2022/249431A, one of the quadruple circumscribing-ridges possessed by the micro-element is required to be selected as a ridge-to-be-mated. However, if the micro-elements are shuffled, unless a rotation angle of the micro-element can be recognized, assignment as the designed ridge-to-be-mated among quadruple circumscribing-ridges is impossible. "The rotation angle of the micro-element" can be defined as an angle whose rotation center extends along the normal direction of the functional face, the rotation center passes through a position at center of gravity in the micro-element. "The first ridge-to-be-mated" is selected from quadruple ridges, which are respectively defined at locations where the quadruple side-faces of the first micro-elements $X_{iRj}$ intersect orthogonally in the three-dimensional Euclidean space. And therefore, one of ridges is defined as a mover-to-be-mated in WO 2022/249431A. Similarly, "the second ridge-to-be-mated" is selected from the quadruple ridges, which are respectively defined at locations where the quadruple side-faces of the second micro-elements $X_{iGj}$ intersect orthogonally in the three-dimensional Euclidean space. Also, "the third ridge-to-be-mated" is selected from the quadruple ridges, which are respectively defined at locations where the quadruple side-faces of the third micro-element $X_{iBj}$ intersect orthogonally in the three-dimensional Euclidean space. Additionally, in a case when "the first to third micro-elements" and "the first to third ridges-to-be-mated" are not required to be separately distinguished, both are comprehensively expressed merely as "the micro-element" and "the ridge-to-be-mated".

Even if errors which span in a range of ±45 degrees are admitted, in a case of cube, because the three-dimensional shape includes sextuple faces, 6*4=24 arbitrariness are induced. In a case of flat cuboid, 2*4=8 arbitrariness are induced. Hypothetically, even if an upward normal vector of the first functional face of the first micro-element $X_{iRj}$ is correctly selected in an upper direction in FIG. 8B, unless the orientations of an anode electrode $82_{1R1}$ to a cathode $83_{1R1}$ that are disposed on the first bottom face of the first micro-element $X_{iRj}$ are correct, the anode electrode $82_{1R1}$ and the cathode $83_{1R1}$ cannot be mounted on the mounting substrate, or the polarity of the anode to the cathode is incorrectly reversed. In a situation when a polarization plane of the first micro-element $X_{iRj}$ is important and problematic, a crystallographic orientation of the first micro-element is required to be correctly selected. Similarly, in a case when the functional face exhibits a flat-plate structure of regular hexagonal shape, even if errors spanning in a range of ±60 degrees are admitted, 2*6=12 arbitrariness is induced.

FIG. 1 is a model view schematically illustrating a first micro-element $X_{iRj}$ serving as a red-LED that is scheduled to be mounted on a micro-LED display, as one example of the micro-element pertaining to the representative embodiment. FIG. 1 illustrates a bird's-eye view obliquely viewing "the first functional face" that is defined as a face performing the function of the first micro-element $X_{iRj}$ serving as a light-emitting element. In addition, with regard to a second micro-element $X_{iGj}$ serving as a green-LED and a third micro-element $X_{iBj}$ serving as a blue-LED, which are scheduled to be mounted on the same micro-LED display, the second micro-element $X_{iGj}$ and the third micro-element $X_{iBj}$ are equal to the first micro-element $X_{iRj}$ in dimension and shape (outer appearance), except that semiconductor materials (structures) are different. Thus, the explanations overlapping with FIG. 1 are omitted. For example, semiconductor materials such as gallium aluminum arsenide $(Ga_{1-x}Al_xAs)$ and aluminum gallium indium phosphide $((Al_{1-x}Ga_x)_{1-y}In_yP)$ are mainly used for a light-emitting layer of the first micro-element $X_{iRj}$.

Figure 2A:
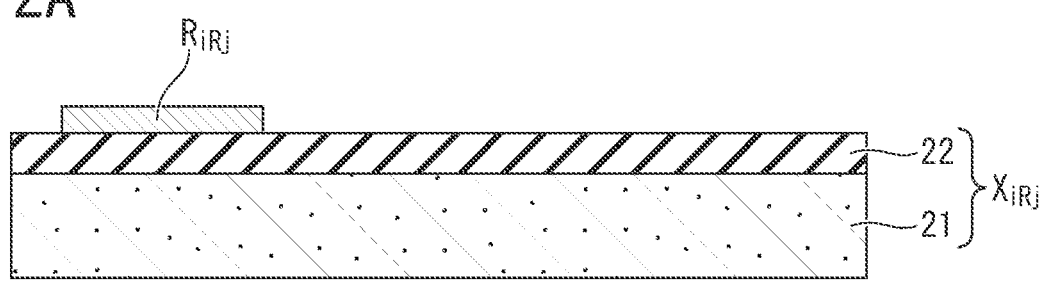
FIG. 2A is a cross-sectional view taken along a plane C represented by FIG. 1.
Figure 2B:
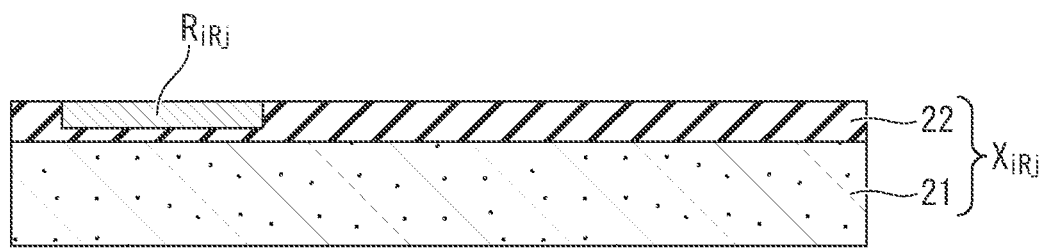
FIG. 2B is a cross-sectional view of another structure corresponding to FIG. 1 taken along the plane C.
Figure 5:
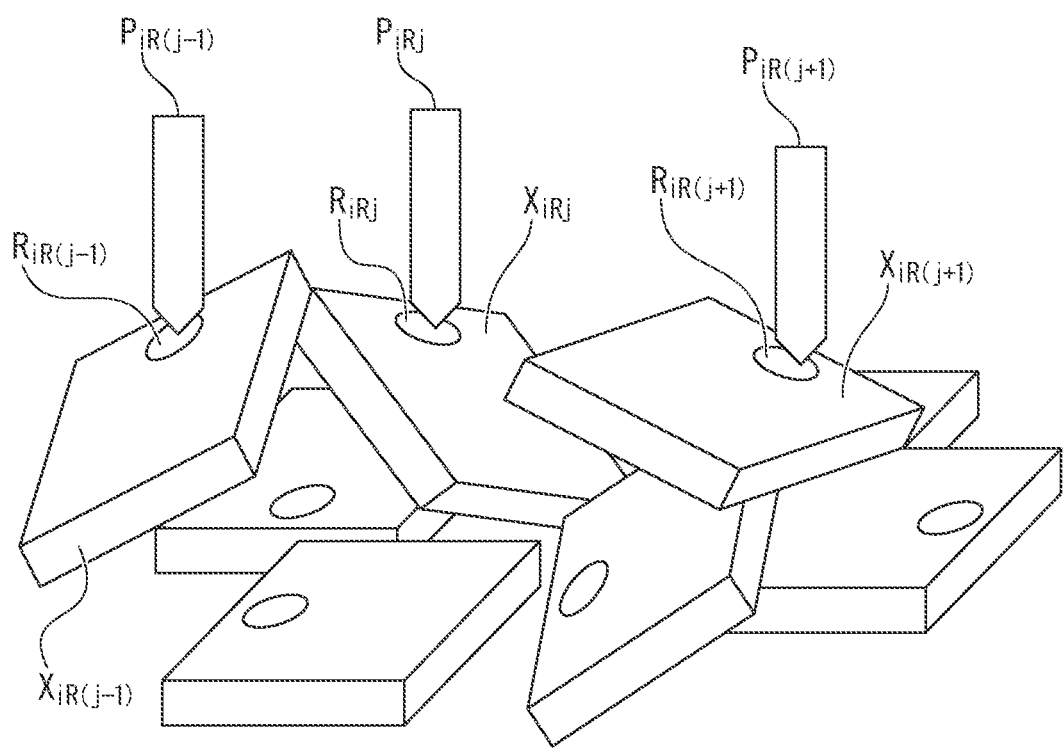
FIG. 5 is a schematic bird's-eye view explaining transient configurations of first micro-elements, which are being picked up by inserted triple first capturing-probes, the triple first capturing-probes are inserted into a mountain of a plurality of the first micro-elements being shuffled after dicing process to provide respective chip regions defined on a wafer, succeeding to the completion of crystal growth, each of the triple first capturing-probes captures one of the corresponding first micro-elements, respectively.

On the other hand, semiconductor materials such as indium gallium nitride $(In_{1-x}Ga_xN)$, $(Al_{1-x}Ga_x)_{1-y}In_yP$, and zinc telluride (ZnTe) are repeatedly re-used for a light-emitting layer of the second micro-element $X_{iGj}$. The mole fractions x and y are different with regard to the $(Al_{1-x}Ga_x)_{1-y}In_yP$ of the first micro-element $X_{iRj}$ and the $(Al_{1-x}Ga_x)_{1-y}In_yP$ of the second micro-element $X_{iGj}$. Semiconductor materials such as gallium nitride (GaN) and $In_{1-x}Ga_xN$ are repeatedly re-used for a light-emitting layer of the third micro-element $X_{iBj}$. The mole fractions x are different with regard to the $In_{1-x}Ga_xN$ of the light-emitting layer of the first micro-element $X_{iRj}$ and the $In_{1-x}Ga_xN$ of the light-emitting layer of the third micro-element $X_{iBj}$. The explanations of the following FIGS. 2A-2B to 5 are explained by focusing to the first micro-element $X_{iRj}$. However, except that the semiconductor materials are different, the explanations are similar with regard to the second micro-element $X_{iGj}$ and the third micro-element $X_{iBj}$. Thus, with regard to FIGS. 2A-2B to 5, duplicative explanations are omitted similarly to the case of FIG. 1.

FIG. 1 exemplifies a case that the first functional face of the first micro-element $X_{iRj}$ is rectangle having quadruple latera. However, the planar shape of the first functional face of the first micro-element $X_{iRj}$ may be square, rectangle or polygons such as pentagon, hexagon or the like. As defined in the beginning of the present specification, "the micro-element" means the element in which the maximum diagonal-length on the functional face is one mm or less. In a case of square or rectangle, since double diagonal-lengths are equal, both become the maximum diagonal-length. In a case of regular pentagon, since quintuple diagonal-lengths are equal, all of the diagonal-lengths become the maximum diagonal-length. In a case of regular hexagon, triple maximum diagonal-lengths are defined, and sextuple diagonal-lengths are defined which are shorter than the maximum diagonal-length. In a case of regular heptagon, octuple maximum diagonal-lengths are defined, and sextuple diagonal-lengths are defined which are shorter than the maximum diagonal-length.

In a case when the functional face is rectangle having quadruple latera, a particular latus is defined as "an identification latus" among the quadruple latera. And, a pattern of a first magnetic-force receptor $R_{iRj}$ as illustrated in FIG. 1 is locally arranged at a peripheral site on a functional face, the site locating in the vicinity of the identification latus. Even if the functional face is pentagon or greater polygons, a particular latus among multiple latera implementing the polygons is similarly defined as "an identification latus". And, at a peripheral site on a functional face, the site locating in the vicinity of the identification latus, a circular pattern of first magnetic-force receptor $R_{iRj}$ is locally arranged on the first micro-element $X_{iRj}$. In FIG. 1, although the circular pattern of the first magnetic-force receptor $R_{iRj}$ is provided on the first micro-element $X_{iRj}$ at the peripheral site located near the center of the identification latus, the instance illustrated in FIG. 1 is merely an illustrative exemplification. A position of the first magnetic-force receptor $R_{iRj}$ is not limited to the vicinity of the center of the identification latus. The first magnetic-force receptor $R_{iRj}$ can be disposed at any location available on the functional face, as far as an allocation rule is determined in such a way that pattern locations of the first magnetic-force receptors $R_{iRj}$ can be described in relation with the identification latus defined on the first micro-element $X_{iRj}$. Therefore, the identification latus can be uniquely defined, even if the first magnetic-force receptor $R_{iRj}$ is elected at any location on the functional face.

In the first micro-element $X_{iRj}$ pertaining to the representative embodiment, a site occupying an area required to perform the main function of the first micro-element $X_{iRj}$ is defined as "a first function-performing occupation (FPO) site" in the first functional face. For example, in a case of a light-emitting element such as LED and the like, a light-emitting face corresponds to the FPO site, and in a case of a light-receiving element, a light-receiving face corresponds to the FPO site. Hypothetically, in a condition in which a shielding film is used for the light-emitting face for some reason to perform the function as the light-emitting element, a site defined by a window portion in the shielding film becomes "the first FPO site". In a case of an ultrasonic element, an emitting area or receiving area of ultrasonic waves corresponds to the FPO site. Similarly, in the second micro-element $X_{iGj}$, in the second functional face, an active area performing the main function of the second micro-element $X_{iGj}$ is defined as "a second FPO site". Also, in the third micro-element $X_{iBj}$, in the third functional face, an active area performing the main function of the third micro-element $X_{iBj}$ is defined as "a third FPO site". And, when "the first to third FPO sites" are not required to be separately distinguished, the nomenclature is comprehensively expressed simply as "the FPO site". Also, the micro-element targeted in the present invention may be a module (composite element) in which a plurality of semiconductor elements or MEMS elements are incorporated into a minute mold structure whose maximum diagonal-length is one mm or less, further 700 micrometers or less. For example, in a case when the micro-element as the module (composite element) includes triple light-emitting elements inside the mold structure, triple FPO sites are defined on a single functional face serving as a plane of the mold structure. Also, in a case when the micro-element as the module includes quadruple light-emitting elements inside the mold structure, quadruple FPO sites are defined in a single functional face.

The first magnetic-force receptor $R_{iRj}$ may be allocated in a limited site elected in unoccupied spaces, or unoccupied assets remaining in the periphery of the first functional face, the unoccupied assets are generated in a peripheral space after removing the first FPO site from the first functional face, while the first magnetic-force receptor $R_{iRj}$ being made related to the first identification latus. For example, if the first FPO site is circular shape, differently from the illustrative exemplification illustrated in FIG. 1, quadruple corners of a rectangular first functional face become candidate unoccupied assets, which are suitable for allocating the first magnetic-force receptor $R_{iRj}$ requested from a viewpoint of area-occupation efficiency. Even for the second micro-element $X_{iGj}$ and the third micro-element $X_{iBj}$, positions and patterns (sizes and shapes) of "a second magnetic-force receptor" and "a third magnetic-force receptor" shall be defined, respectively, based upon an allocation rule like the first micro-element $X_{iRj}$. And, in the present specification, in a condition that "the first to third micro-elements" and "the first to third magnetic-force receptors" are not required to be separately distinguished, the nomenclatures are comprehensively expressed merely as "the micro-element" and "the magnetic-force receptor". In a case that a minute composite element in which a plurality of semiconductor elements and a plurality of MEMS elements are incorporated into a single molded structure, whose maximum diagonal-length is one mm or less, is used as the micro-element, a large number of micro-elements of a single kind are produced by hybrid assembly process, they are expressed as "the micro-element" and "the magnetic-force receptor". In a case that a single composite element includes triple light-emitting elements, and triple FPO sites are defined on a single functional face, the candidate unoccupied assets, in which the magnetic-force receptors can be arranged, are increased. Similarly, if the single composite element includes quadruple light-emitting elements, and quadruple FPO sites are defined, the candidate unoccupied assets, in which the magnetic-force receptors can be arranged, are increased.

The magnetic-force receptor can be implemented by ferromagnetic thin films composed of elements elected from a group including, for example, iron (Fe), cobalt (Co), nickel (Ni), manganese (Mn), gadolinium (Gd), terbium (Tb) and dysprosium (Dy). Also, the magnetic-force receptor can be implemented by a thin film made of alloy including elements elected from the group of the above ferromagnetic materials, for example, Fe—Co based, Fe—Ni based, Fe—Si based, Fe—Dy—Tb based, Fe—Ga based, or Fe—Si—Al based alloy, or a stacked film encompassing different layers, each of which made of an element or elements elected from the group of the above ferromagnetic materials.

The basic technical idea of the micro-element of the representative embodiment inheres in a structure encompassing a semiconductor chip 21 and an insulating film 22 stacked on the semiconductor chip 21, as exemplified in FIG. 2A. The semiconductor chip 21 made of $Ga_{1-x}Al_xAs$ and the like implements the first micro-element $X_{iRj}$, and the insulating film 22 is made of a silicon oxide film ($SiO_2$ film), a resin film and the like. The insulating film 22 may be a composite film composed of dielectric films of double or more kinds and may include a multi-layer film composed of various layers having different objectives. FIG. 2A is an illustrative exemplification, and if the insulating film 22 is a composite film, a structure is allowed in which the resin film existing in the uppermost layer extends from the first functional face to include the sites other than the first functional face, and cover and seal the sites other than the first functional face. Focusing to the structure exemplified in FIG. 2A, at first, on the insulating film 22 illustrated in FIG. 2A, a ferromagnetic thin film of Fe, Co, and the like is deposited on entire plane by a vacuum evaporation method, a sputtering method, a sol-gel method, a chemical vapor deposition (CVD) method, a pulse laser deposition (PLD) method, plating, or the like. And, the ferromagnetic thin film may be selectively etched by using a photolithography technique and the pattern of the first micro-element $X_{iRj}$ may be delineated. The selective etching of the ferromagnetic thin film may be carried out by performing dry-etching or wet-etching with a photo-resist film as an etching mask after delineating the photo-resist film by the photolithography technique. For the dry etching, a reactive ion etching (RIE) method, using trifluoro-methane ($CHF_3$), methane ($CH_4$), carbon tetrafluoride ($CF_4$) or the like, can be employed.

Also, aqueous solutions of inorganic or organic acids, such as ferric chloride ($FeCl_3$) solution and the like, can be used for selective wet etching of the ferromagnetic thin films. In addition, as illustrated in FIG. 2B, the pattern of the first magnetic-force receptor $R_{iRj}$ may be locally arranged by embedding the ferromagnetic thin film into a groove, such as a damascene groove and the like, which is cut on a surface of the insulating film 22, and then flattening the surface by chemical mechanical polishing (CMP). FIG. 2B is merely an illustrative exemplification, and if the insulating film 22 is a composite film including a resin film, a structure in which a resin film existing in the uppermost layer will cover and encapsulate for including the sites other than the first functional face can be allowed, like the situation illustrated in FIG. 2A. However, in view of the easiness of the rotational motion of the first micro-element $X_{iRj}$ at a time of orientation-adjustment process illustrated in FIG. 6B and the like, which will be described later, a structure in which the pattern of the first magnetic-force receptor $R_{iRj}$ protrudes beyond a level of a top surface of the insulating film 22 is preferable as illustrated in FIG. 2A. As illustrated in FIG. 2B, even if the ferromagnetic thin film is buried in the insulating film 22, after the process-step of CMP and the like, the surface of the insulating film 22 may be slightly etched to construct a stepped configuration in which the top face of the first magnetic-force receptor $R_{iRj}$ slightly protrudes from the surface of the insulating film 22.

Figure 6A:
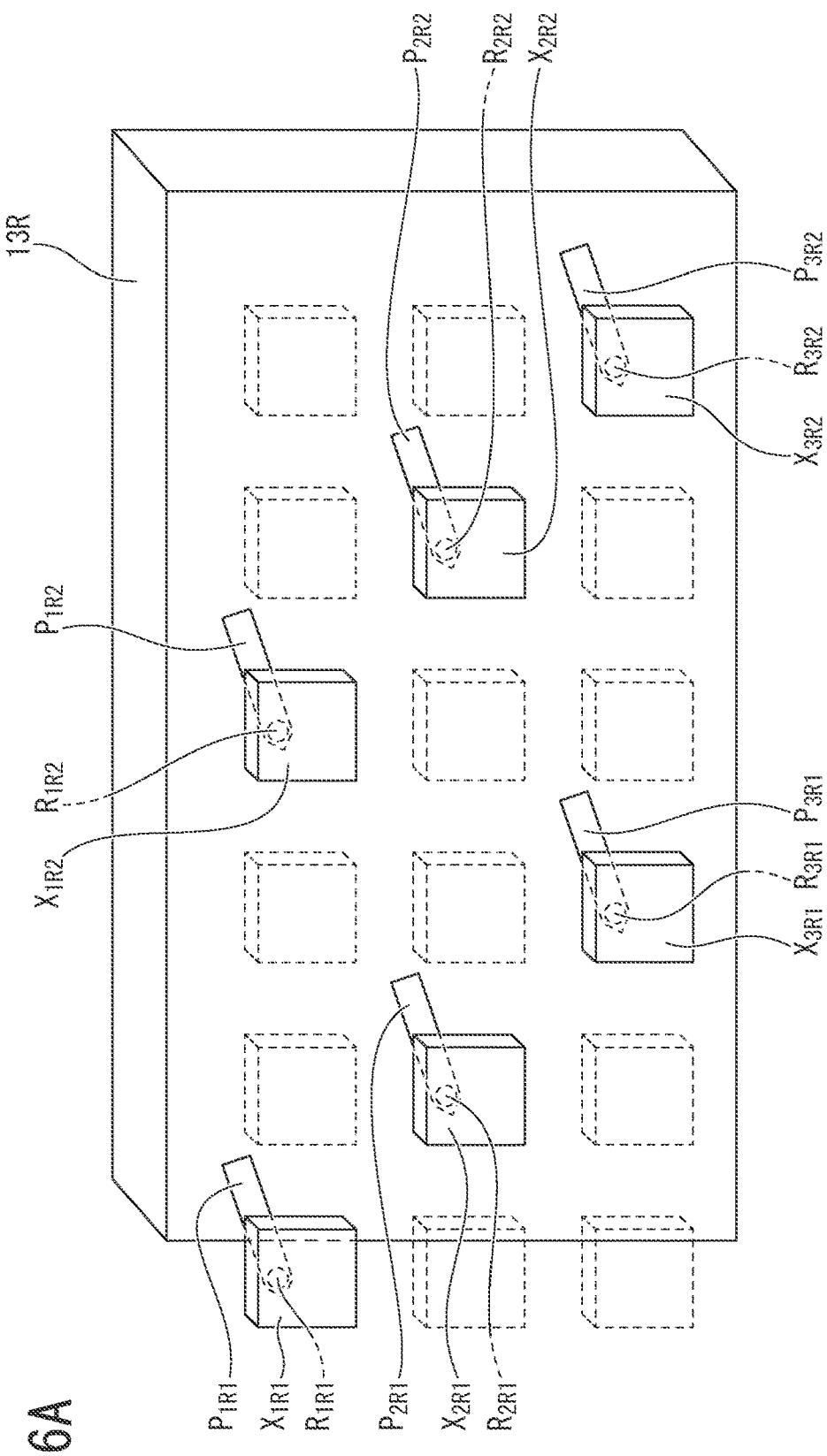
FIG. 6A is a schematic bird's-eye view explaining a situation after the fine adjustments of chip-orientations when a first picker implementing a rough alignment-apparatus in an alignment system pertaining to the representative embodiment representing the technical idea of the present invention rotate chips by gravity so that first micro-element serving as red-LEDs exhibit chip-orientations located within a desirable range.
Figure 6B:
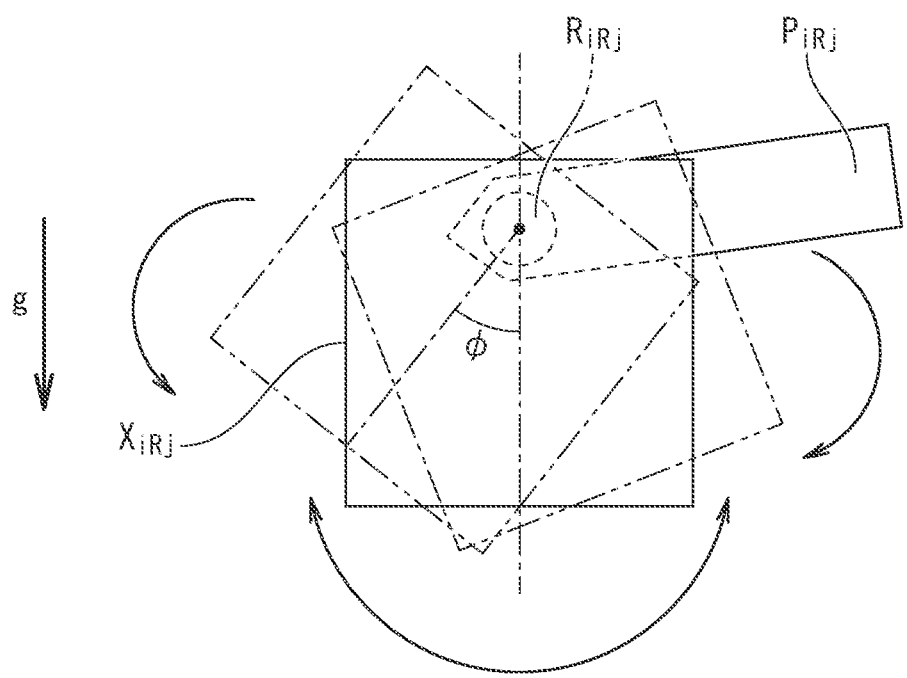
FIG. 6B is a front view schematically illustrating a process in which the pitch axis of the reference coordinate system (r, p, y) is defined at the tip of the first capturing-probe, the first micro-element is pitch-rotated around the pitch-axis by gravity, and the chip-orientation of the first micro-element is finely adjusted, and the first micro-elements at pseudo-capturing stages prior to the adjustment are illustrated with double-dotted lines.

If the first functional face of the first micro-element $X_{iRj}$ is square, selection of a particular latus among the quadruple latera as the first identification latus is rudimentary free. However, determination of a rule, ascribable to the relation to a precise alignment-tray 14, which will be explained in FIG. 8A and the like, which will be described later, is necessary. If the first functional face of the first micro-element $X_{iRj}$ is regular polygon such as regular pentagon or more, selections of a particular latus among plurality of latera implementing the regular polygon as the first identification latus is rudimentary free. On the other hand, if the first functional face of the first micro-element $X_{iRj}$ is rectangular, the selection of a particular latus from a couple of short latera as the first identification latus can provide a technical merit. That is, the technical merit such that a process of the fine adjustment by chip-orientation rotation of the first micro-element $X_{iRj}$, as illustrated in FIGS. 6A and 6B and the like, which will be described later will become easy, and that a throwing process into the concaves in the precise alignment-tray, after the above fine adjustment will becomes easy can be achieved.

By the way, in the present specification, "the chip-orientation" of the first micro-element $X_{iRj}$ means a direction of a normal vector of the first functional face, and a direction of three-dimensional vector from a barycenter position of the chip to a particular circumscribing-ridge--the ridge-to-be-mated as recited in WO 2022/249431A—among plural circumscribing-ridges connecting the first functional and bottom faces. The direction of the normal vector of the first functional face is defined to be selected as an upper direction along the C-plane in FIG. 1, in the example illustrated in FIG. 1. Regarding the second micro-element $X_{iGj}$ and the third micro-element $X_{iBj}$ and the like, the meaning of the chip-orientations is similarly defined. If the first functional face of the first micro-element $X_{iRj}$ is a scalene polygon having major and minor axes, a selection of any one short latus as the first identification latus will make the adjusting process of the chip-orientation of the first micro-element $X_{iRj}$ easier, and furthermore, will make the throwing process into the precise alignment-tray easier. Besides, in a case of a module in which a plurality of semiconductor elements and the like are incorporated into a single structured body, a direction of a normal vector of a functional face of the module and a direction of a vector from a barycenter position of the module to a ridge-to-be-mated, which is selected from plural circumscribing-ridges connecting the functional and bottom faces of the module, are similarly defined as "a module orientation". And, when "the chip-orientation" and "the module orientation" are not distinguished, both are simply called "an orientation".

The first magnetic-force receptor $R_{iRj}$ becomes smaller in area, because the first magnetic-force receptor $R_{iRj}$ is required to be arranged in the unoccupied space in the periphery of the first functional face that does not serve as an obstacle for the first FPO site. The area of the first magnetic-force receptor $R_{iRj}$ depends on a required magnetic-force strength, which depends on a suction force determined by a relationship between the first magnetic-force receptor $R_{iRj}$ and the first micro-element $X_{iRj}$. However, a minimum necessary area is preferable, which can maintain the required magnetic attracting force. Because a friction force serving as a resistive force against the pitch-rotation can be reduced by a smaller area, which is defined on only portion of the pattern of the first magnetic-force receptor $R_{iRj}$, the pattern contacts with a first capturing-probe $P_{iRj}$, and if the first micro-element $X_{iRj}$ pitch-rotates around a pitch-axis "p" by a torque caused by gravity "g", as illustrated in FIG. 6B and the like. The pattern of the first magnetic-force receptor $R_{iRj}$ is not limited to a circle, and may be polygons such as regular hexagon, regular octagon, regular dodecagon, and regular icosagon and the like. However, in view of the easiness and sureness of the pitch-rotation in the orientation-adjustment process illustrated in FIG. 6B and the like, regular polygon having a greater number of angular corners, which becomes close to a circle, is preferable for the pattern of the first magnetic-force receptor $R_{iRj}$. Even if the pattern of the first magnetic-force receptor $R_{iRj}$ is regular polygon at a mask level, when focusing to a finished pattern of a photolithographic step, the regular polygon having the greater number of angular corners becomes circular. Thus, when a manufacturing step is considered, the regular polygon having the greater number of angular corners becomes a geometric figure equivalent to a circle.

Figure 3A:
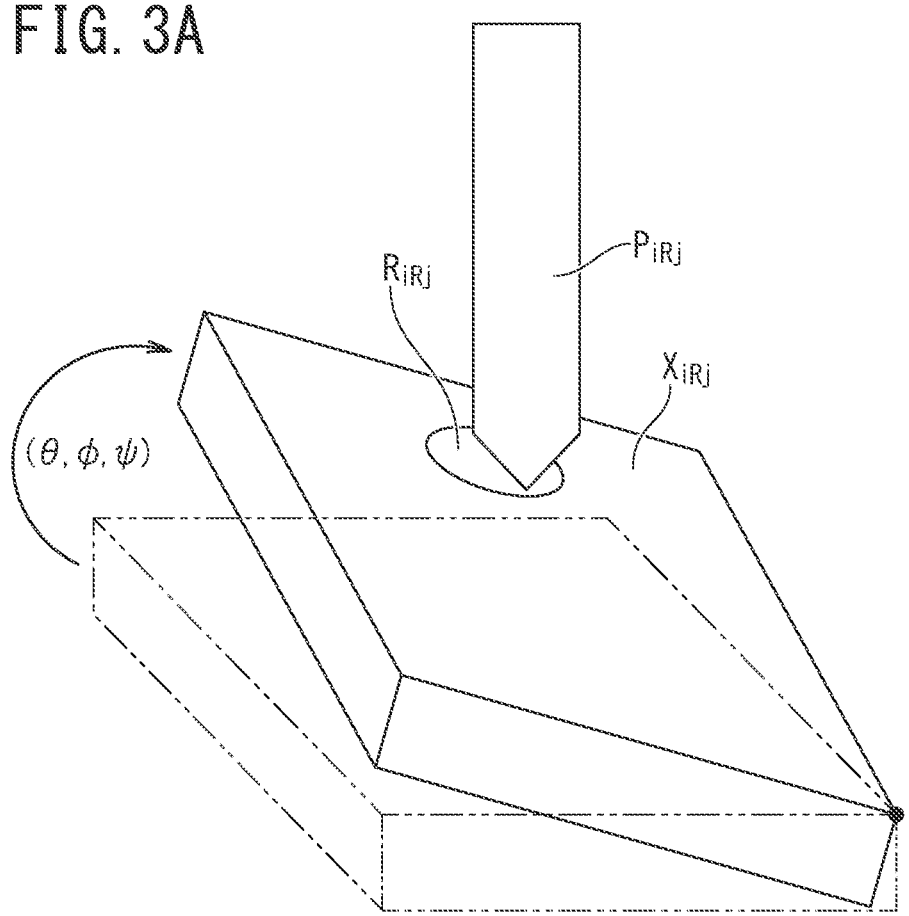
FIG. 3A is a bird's-eye view schematically illustrating a transient configuration in which the first micro-element is being picked up by a first capturing-probe, under a condition that a first magnetic-force applying (MFA) portion approaches to a first magnetic-force receptor arranged on a first micro-element, the first magnetic-force receptor is existing at the closest position to the first MFA portion disposed at a tip of a first capturing-probe.

FIG. 3A schematically illustrates a transient configuration of the first micro-element $X_{iRj}$ being allocated at the closest position to a first magnetic-force applying (MFA) portion provided at the tip of the first capturing-probe $P_{iRj}$, as the first MFA portion is approaching to the first magnetic-force receptor $R_{iRj}$, and the first micro-element $X_{iRj}$ is being picked up by the first capturing-probe $P_{iRj}$. That is, as to the first micro-element $X_{iRj}$, while the tip of the first capturing-probe $P_{iRj}$ is approaching to the first magnetic-force receptor $R_{iRj}$ and a first magnetic lines spread from the first MFA portion has influence on the first magnetic-force receptor $R_{iRj}$, the first magnetic lines cause only the functional face side of the first micro-element $X_{iRj}$ to be sucked, and gradually, the functional face side is strongly picked up. Therefore, the strength of the first magnetic lines is set to a strength which enables clear identification of the functional and bottom faces of the first micro-element $X_{iRj}$, and is set to a strength which enables the clear-selective sucking-action. The strength which enables clear identification of the functional and bottom faces" is an enough strength required to capture the first magnetic-force receptor $R_{iRj}$, even if the first capturing-probe $P_{iRj}$ approaches from a side of top face, in a situation in which the chip is provided in an orientation that the functional face is assigned to a bottom face and the bottom face is assigned to the top plane. In FIG. 3A, the chip-orientation of the original first micro-elements $X_{iRj}$ is indicated by double-dotted lines, while solid line indicates a chip-orientations of the first micro-elements $X_{iRj}$ being attracted to be picked up by the first magnetic lines spread from the first MFA portion. And, the first micro-element $X_{iRj}$ is three-dimensionally rotated by the magnetic-force, so as to change an intrinsic rotation of the Euler angles $(\theta, \varphi, \Psi)$ in object coordinate system, and the first micro-element $X_{iRj}$ is attracted and picked up by the first magnetic lines spread from the first MFA portion.

Figure 3B:
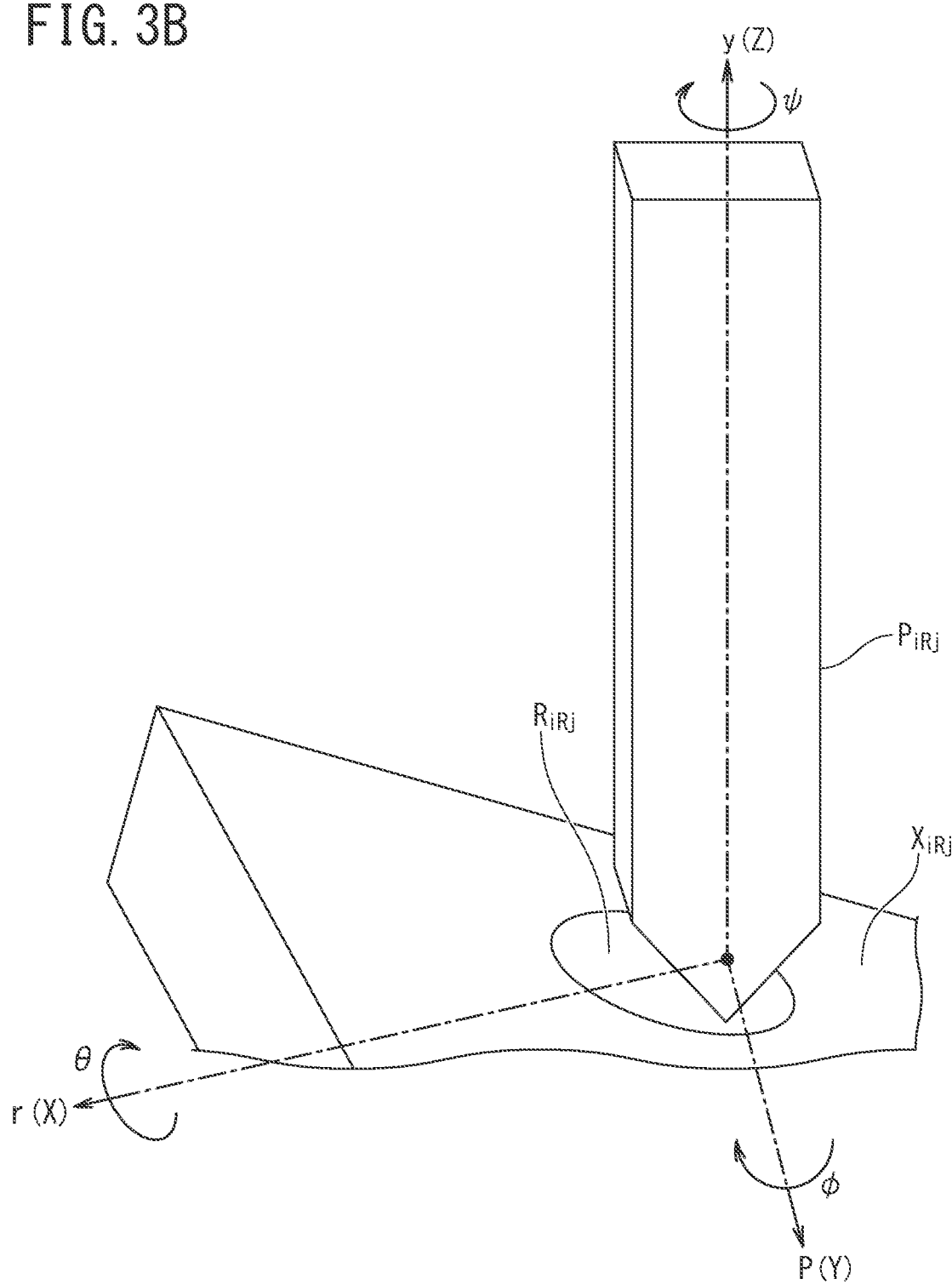
FIG. 3B is a bird's eye view explaining a roll-axis "r" in X-axis direction, a pitch-axis "p" in Y-axis direction and a yaw-axis "y" in a Z-axis direction, which are defined to the tip of the first capturing-probe.

FIG. 3B illustrates an extrinsic rotation as to a roll-axis "r" along X-axis direction, a pitch-axis "p" along Y-axis direction and a yaw-axis "y" along a Z-axis in a reference coordinate system (r, p, y). The reference coordinate system (r, p, y) is defined at the tip of the first capturing-probe $P_{iRj}$, which represents a three-dimensional shape. As well, "the pitch-axis", "the roll-axis" and "the yaw-axis" are defined after an exemplary coordinate system (r, p, y) employed in airplanes and automobiles in FIG. 3B, in which the roll-axis is taken along the X-axis, the pitch-axis is taken along the Y-axis and the yaw-axis is taken along the Z-axis. A plane at the tip of the first capturing-probe $P_{iRj}$ to which the pitch-axis "p" is orthogonal is defined as "a pitch plane". While the tip of the first capturing-probe $P_{iRj}$ approaches the first magnetic-force receptor $R_{iRj}$, the magnetic-force causes the first micro-element $X_{iRj}$ to perform a roll-rotation of a roll-angle $\theta$ with respect to the roll-axis "r", a pitch-rotation of a pitch-angle $\theta$ with respect to the pitch-axis "p", and a yaw rotation of a yaw angle $\Psi$ with respect to the yaw-axis "y".

FIGS. 3A and 3B schematically illustrate a manner of transient configuration in the halfway of the three-dimensional rotation by the magnetic-force, which is expressed by the Euler angles $(\theta, \varphi, \Psi)$, because the first magnetic-force receptor $R_{iRj}$ provided on the functional face side of the first micro-element $X_{iRj}$ is selected by the first magnetic lines. Finally, a first capturing-face 125 (see FIG. 4B) of flat plane locally provided at the tip of the first capturing-probe $P_{iRj}$ and the first functional face of the first micro-element $X_{iRj}$ becomes in parallel, and the first capturing-face 125 and the first magnetic-force receptor $R_{iRj}$ are in close contact, which results in a stable state of "provisional-capturing stage". The provisional-capturing stage is a stage in which the functional and bottom faces of the first micro-element $X_{iRj}$ are clearly identified, thereby prohibiting the inversion-error between top and bottom faces.

In the present specification, a transient stage in which the first capturing-face 125 and the first functional face are not in parallel as illustrated in FIGS. 3A and 3B is referred to "a pseudo-capturing stage", which is distinguished from provisional-capturing stage in which the magnetic-force causes the first capturing-face 125 and the first functional face to be in parallel. The first capturing-face 125 at recessed structure illustrated in FIG. 4B is merely an illustrative exemplification. For example, if a first capturing-face is provided at a vertically-cut end-face of a cylinder, and the first magnetic-force receptor $R_{iRj}$ are in close contact with the end-face of the cylinder, the first functional face of the first micro-element $X_{iRj}$ shall be assigned to a plane orthogonal to a central axis along a longitudinal direction of the cylinder. Furthermore, if a first capturing-face is provided at an obliquely-cut end-face of a cylinder, and the first magnetic-force receptor $R_{iRj}$ are in close contact with the obliquely-cut end-face of the cylinder, the first functional face of the first micro-element $X_{iRj}$ shall be assigned to the plane obliquely intersecting the central axis along a longitudinal direction of the cylinder.

Figure 7A:
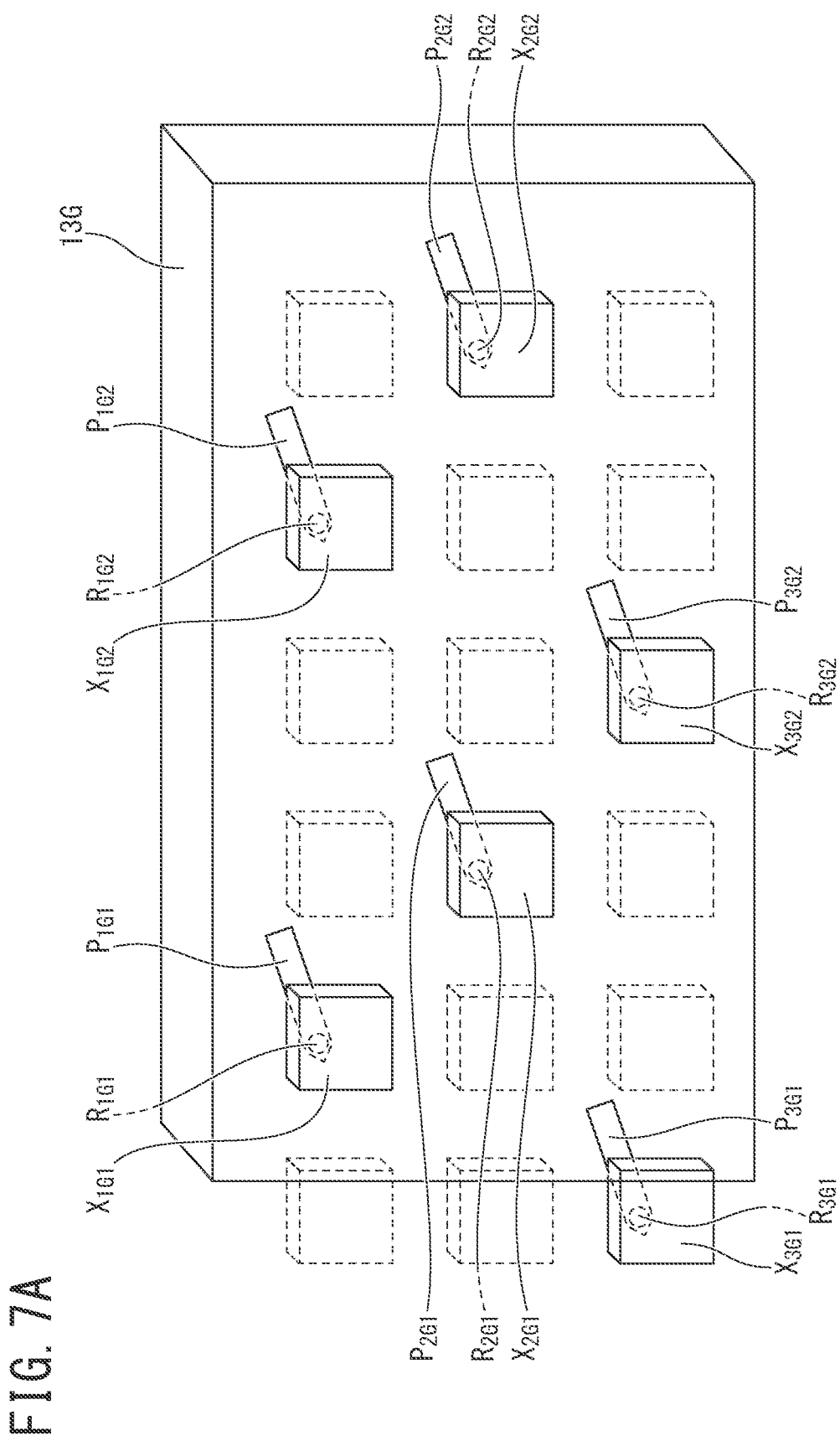
FIG. 7A is a schematic bird's-eye view explaining a situation after the fine adjustment of chip-orientations when a second picker implementing the rough alignment-apparatus in the alignment system pertaining to the representative embodiment rotates chips by gravity so that second micro-element serving as green-LEDs exhibit chip-orientations located within a desirable range.
Figure 7B:
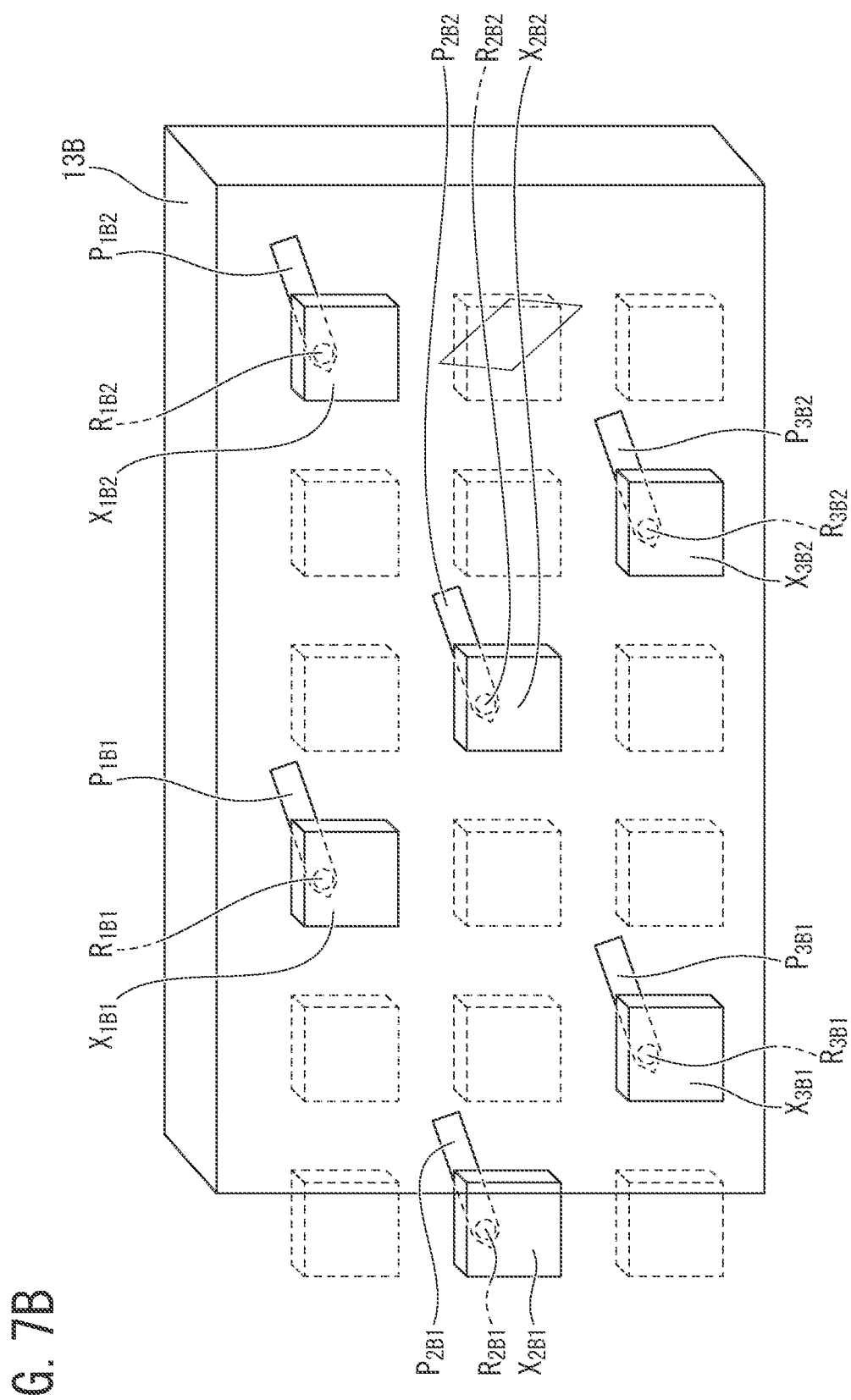
FIG. 7B is a schematic bird's-eye view explaining a situation after the fine adjustment of chip-orientations when a third picker implementing the rough alignment-apparatus in the alignment system pertaining to the representative embodiment rotates chips by gravity so that third micro-element serving as blue-LEDs exhibit chip-orientations located within a desirable range.

In provisional-capturing stage in which the first capturing-face 125 and the first functional face are in parallel, ascribable to the first magnetic-force receptor $R_{iRj}$, the first micro-element $X_{iRj}$ is picked up at the tip of the first capturing-probe $P_{iRj}$, prohibiting the inversion-error between the top and bottom faces of the chip for the first micro-element $X_{iRj}$. However, as to the chip-orientation of the first micro-element $X_{iRj}$ in provisional-capturing stage, there is a possibility that the chip-orientation of the first micro-element $X_{iRj}$ may be rotated by about 180 degrees from a scheduled optimal direction for the precise alignment-tray 14 illustrated in FIG. 8A and the like. Therefore, if a first micro-element $X_{iRj}$ exists at the tip of the first capturing-probe $P_{iRj}$, the first micro-element $X_{iRj}$ is rotated by about ±45 degrees or more, in provisional-capturing stage, the chip-orientation of the first micro-element $X_{iRj}$ is required to be adjusted so that a rotation angle belongs in a range of ±45 degrees or less, before the first micro-element $X_{iRj}$ is put into the precise alignment-tray 14. FIGS. 6A, 7A and 7B illustrate examples respectively, in which the chip-orientations are finely adjusted, in cases that the circular patterns of the first magnetic-force receptors $R_{iRj}$ are provided at the peripheral sites allocated in the vicinities near the centers of the first identification latera. However, the above instances illustrated in FIGS. 6A, 7A and 7B are merely illustrative exemplifications. As another example, if a first magnetic-force receptor $R_{iRj}$ is hypothetically disposed at a position at an end side of the first identification latus, the chip-orientation shall be finely adjusted with a direction inclined by 45 degrees from the example illustrated in FIG. 6A and the like, as another standard orientation.

As already defined, "the chip-orientation" of the first micro-element $X_{iRj}$ means the direction of the vector from the barycenter position of the chip for the first micro-element $X_{iRj}$ to the first ridge-to-be-mated, which is selected from the quadruple ridges, each of the quadruple ridges is provided by the quadruple side-faces of the first micro-element $X_{iRj}$ intersecting orthogonally in the three-dimensional Euclidean space. Similarly, "the chip-orientation" of the second micro-element $X_{iGj}$ means the direction of the vector from the barycenter position of the chip for the second micro-element $X_{iGj}$ to the second ridge-to-be-mated, which is selected from the quadruple ridges, which are respectively defined at locations where the quadruple side-faces of the second micro-element $X_{iGj}$ intersect orthogonally in the three-dimensional Euclidean space. Also, "the chip-orientation" of the third micro-element $X_{iBj}$ means the direction of the vector from the barycenter position of the chip for the third micro-element $X_{iBj}$ to the third ridge-to-be-mated, which is selected from the quadruple ridges, which are respectively defined at locations where the quadruple side-faces of the third micro-element $X_{iBj}$ intersect orthogonally in the three-dimensional Euclidean space.

In provisional-capturing stage, since the first magnetic-force receptor $R_{iRj}$ and the first capturing-face 125 are in close contact and in parallel to each other, the object coordinate system as to the intrinsic rotation that describes the random chip-orientation of the first micro-element $X_{iRj}$ is described by the reference coordinate system (r, p, y) as to the extrinsic rotation that is defined at the tip of the first capturing-probe $P_{iRj}$. In the examples illustrated in FIGS. 3A and 3B, under a condition that the error of ±45 degrees is allowed, because the 2*4=8 arbitrariness possessed by the micro-element, which represents cuboid shape, facilitates expressions for the states in provisional-capturing stages as to the reference coordinate system (r, p, y) at the first capturing-probe $P_{iRj}$, the arbitrariness is made small.

Rough Alignment-Apparatus for Alignment System

Figure 8A:
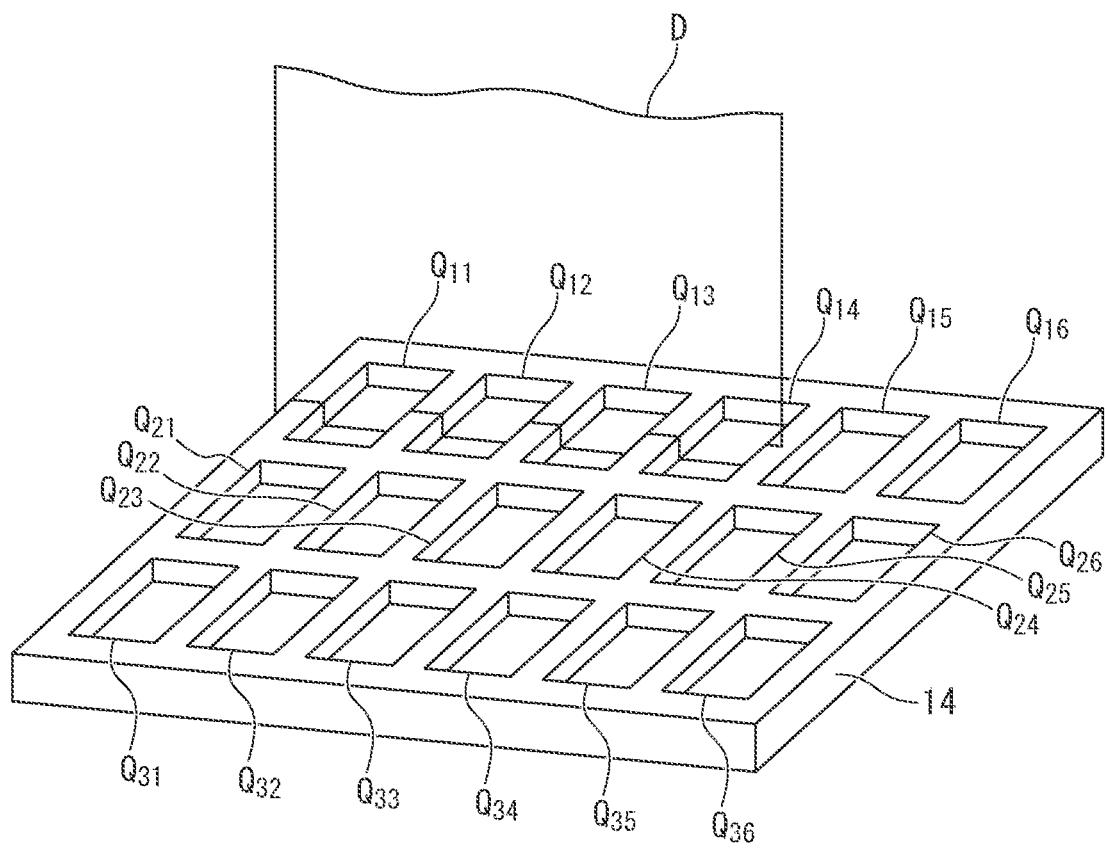
FIG. 8A is a schematic bird's-eye view explaining concaves of a precise alignment-tray used in an assembling method pertaining to the representative embodiment representing the technical idea of the present invention.

An alignment system pertaining to the representative embodiment representing the technical idea of the present invention encompasses a rough alignment-apparatus that includes a first picker 13R illustrated in FIG. 6A, a second picker 13G illustrated in FIG. 7A and a third picker 13B illustrated in FIG. 7B, and a precise alignment-apparatus including a precise alignment-tray illustrated in FIG. 8A and the like. Large number of first picker 13R illustrated in FIG. 6A and first capturing-probes $P_{iRj}$ illustrated in FIG. 3A and the like are arrayed on a first base-plate of plate-shaped cuboid. And, the first magnetic-force receptor $R_{iRj}$ illustrated in FIG. 1A is a pattern to identify the functional and bottom faces of the chip for the first micro-element $X_{iRj}$, after being picked up by the first magnetic lines spread out from the tip of the first capturing-probe $P_{iRj}$. The tip of the first capturing-probe $P_{iRj}$ is preferred to be implemented by a flat plane serving as the first capturing-face, which has an enough area for selectively dispose a pattern of a first MFA portion whose size is approximately identical to the first magnetic-force receptor $R_{iRj}$. In order to dispose the localized first MFA portion on the first capturing-face, there are two techniques of a scheme using a permanent-magnet made of soft magnetic material and a scheme using an electromagnet.

Because a structure of the tip of the first capturing-probe $P_{iRj}$ is requested to have a minute size similar to the first magnetic-force receptor $R_{iRj}$ of the first micro-element $X_{iRj}$, a smaller disc-shaped permanent-magnet is easy to be embedded in the tip of the first capturing-probe $P_{iRj}$. However, if the permanent-magnet is embedded in the tip of the first capturing-probe $P_{iRj}$, a demagnetizing process of the permanent-magnet with an alternating electric field, similarly to a magnetic recorder, is needed at a throwing step of the first micro-elements $X_{iRj}$ into concaves in the precise alignment-tray illustrated in FIG. 8B and the like, which will be described later. Moreover, when the first capturing-probe $P_{iRj}$ is repeatedly re-used, processes for magnetizing the permanent-magnet are needed.

In a configuration that the disc-shaped permanent-magnet is selectively embedded in the tip of the first capturing-probe $P_{iRj}$ to be used as the first MFA portion, as to the structure of the main body of the first capturing-probe $P_{iRj}$, a portion other than the first capturing-face shall be made of a low magnetic permeability material such as polytetrafluoroethylene (PTFE), aluminum (Al), copper (Cu) or the like. For the soft-magnetic permanent-magnet, iron (Fe)-silicon (Si) alloy, Fe-aluminum (Al) alloy, and Fe—Al—Si alloy can be used. Fe-nickel (Ni) alloy called "permalloy" and Fe-cobalt (Co) called "permendur" can also be used as the soft-magnetic permanent-magnet to be embedded in the tip of the first capturing-probe $P_{iRj}$. Moreover, amorphous material such as Fe—Si-boron (B) can also be used as the soft-magnetic permanent-magnet to be embedded in the tip of the first capturing-probe $P_{iRj}$.

Figure 4A:
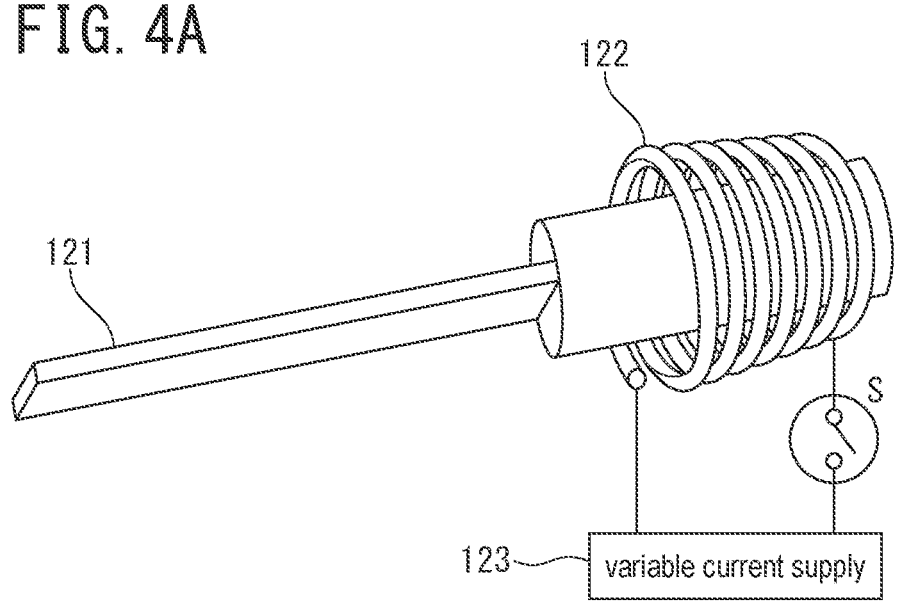
FIG. 4A is a bird's-eye view exemplifying a structure of a first capturing-probe used in an alignment system pertaining to the representative embodiment representing the technical idea of the present invention.
Figure 4B:
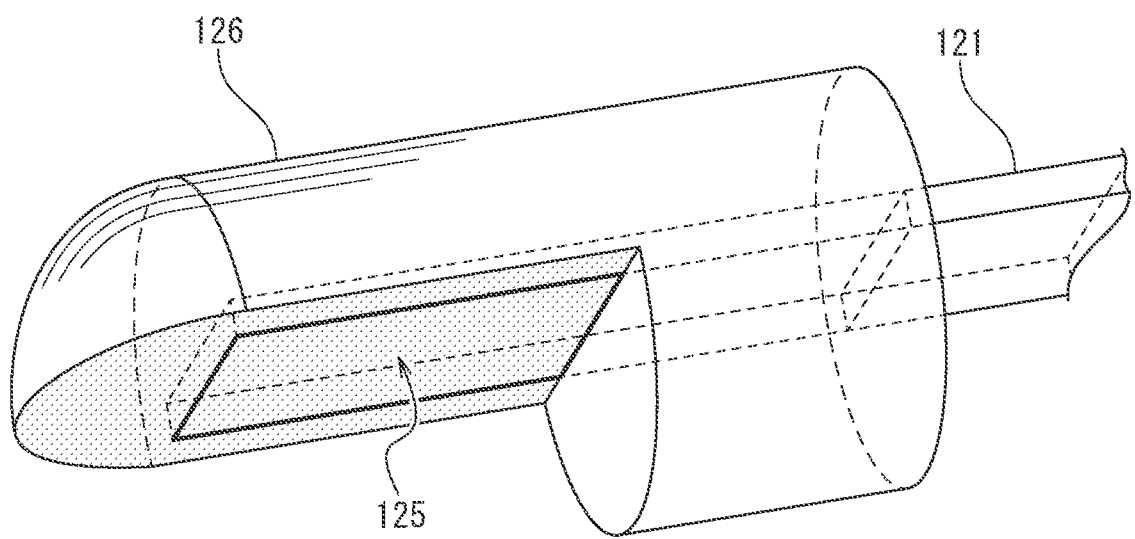
FIG. 4B is a schematic bird's-eye view explaining a first capturing-face of the first capturing-probe illustrated in FIG. 4A.

In order to remove the need of the demagnetizing/magnetizing process, as another structure of the first capturing-probe used in the alignment system pertaining to the representative embodiment, FIG. 4A illustrates an example, in which a core (iron core) 121 of an electromagnet is exposed at the first MFA portion in the tip of the first capturing-probe $P_{iRj}$. As illustrated in FIG. 4A, the first capturing-probe $P_{iRj}$ encompasses a coil 122 manufactured by MEMS technology and a core 121, which penetrates through in the inside space of the coil 122, and then, the coil 122 and the core 121 implement an electromagnet.

Because a magnetic flux density can be made higher as an outer diameter of the core 121 in the electromagnet becomes larger, the outer diameter of the core 121 is close to an inner diameter of the coil 122, at a position at which the coil 122 is directly wrapped. On the other hand, as illustrated in FIG. 4A, a left side portion of the core 121, which is separated from the portion where coil 122 directly wraps around the core 121, is plate-shaped (quadratic-prism-shaped), and the left side portion of the core 121 extends in a lower left direction. The shape of the core 121, which is quadratic-prism-shaped and extends along the lower left direction as illustrated in FIG. 4A, is merely an illustrative exemplification and is not limited to the shape illustrated in FIG. 4A. For example, if an electromagnet-enclosure 126 illustrated in FIG. 4B is assumed to be a cylinder whose end-face is flat, and an end-face of the core 121 is exposed to the end-face of the cylinder and used as the first capturing-face, the quadratic prism illustrated in FIG. 4A can be replaced with the cylinder.

In the structure of the electromagnet implementing the first capturing-probe $P_{iRj}$ used in the alignment system of the representative embodiment illustrated in FIG. 4A, a single side-face whose area is large among quadruple side-faces of cuboid (quadratic prism), serving as a portion extending in the lower left direction of the core 121, is defined as "a bottom face" of the core 121. In accordance with the definition of the bottom face, as to the structure illustrated in FIG. 4B, the bottom face can be expressed to be "level-homologized in external faces" with the first capturing-face 125 in such a way that the bottom face of the core 121 is exposed to the first capturing-face 125, which is the flat plane, and the bottom face and the first capturing-face 125 construct the same flat plane.

For the core 121 of the electromagnet, soft-magnetic material is desired such as permalloy, permendur, iron-based amorphous alloy, iron single-crystal oriented in a <100> direction that is the magnetization-easy axis, oriented electromagnetic steel sheet in which orientations of grain boundaries are aligned in the <100> direction, or iron-based nano-crystalline alloy powder. In a case of using the iron single-crystal or the oriented electromagnetic steel sheet, if the <100> direction of the single-crystal is set to the longitudinal direction of the core 121, the strength of first magnetic lines in the first capturing-face 125 separated from the position of the coil 122 can be enlarged. A variable current supply 123 and a switch S are connected in series to the coil 122 so that a current flowing through the coil 122 can be controlled by the variable current supply 123. The variable current supply 123 may be embedded in a plate-shaped cuboid, serving as the first base-plate of the first picker 13R illustrated in FIG. 6A.

Even if a structure in which the core of the electromagnet is exposed from the main body portion made of the low magnetic permeability material, the first magnetic-force receptor $R_{iRj}$ illustrated in FIG. 1 and the like is selectively picked up by magnetic-force through the first MFA portion of the first capturing-face 125, which is locally (limitedly) provided in the tip of the first capturing-probe $P_{iRj}$, in a specified face-orientation. However, in a case of the electromagnet, since leakage of the first magnetic lines are great, even if the electromagnet is covered by the low magnetic permeability material, localization of the first magnetic lines is difficult, as compared with a case of permanent-magnet. In addition, the first capturing-face 125 of the L-shaped recessed structure illustrated in FIG. 4B and the like is merely an illustrative exemplification representing an instance in which the first MFA portion of the first capturing-probe $P_{iRj}$ is constructed by the core 121 of the electromagnet. For example, a structure is allowed in which the first capturing-probe $P_{iRj}$ is constructed by a cylinder, the core 121 serving as the first MFA portion is exposed to the end-face of the cylinder, and the end-face of the cylinder is used as the first capturing-face.

In a configuration that the core 121 of the electromagnet is exposed to the first MFA portion, for example, by increasing a current flowing through the coil 122 at the pseudo-capturing stage prior to becoming provisional-capturing stage and making the strength of the first magnetic lines high, the first micro-element $X_{iRj}$ can be easily picked up. As illustrated in FIG. 4B, the outer shape of the first capturing-probe $P_{iRj}$ is designed as an anti-capturing surface as a cylindrical surface (curved surface) other than the first capturing-face 125. However, if the strength of the first magnetic lines is made high, a possibility that the other first micro-elements other than scheduled first micro-elements $X_{iRj}$ are weakly picked up by the anti-capturing surface will occur. In the case of the electromagnet, even if the electromagnet is covered by the anti-capturing surface made of the low magnetic permeability material, the first magnetic lines are leaked from the anti-capturing surface. Or, a possibility that from the side of bottom face, the capturing-face of the first capturing-probe $P_{iRj}$ captures the first magnetic-force receptor $R_{iRj}$ will occur. Considering a case that a strength of the first magnetic lines is set to be weak, for a situation that the chips are placed in an orientation in which the functional face is allocated at a side of a bottom face, if the strength is elected to a level such that the first magnetic lines cannot pick up the first magnetic-force receptor $R_{iRj}$ located on the bottom orientated face, a pick-up yield will be decreased.

The provisional-capturing stage shall be realized after a stage that the unscheduled first micro-element is made to drop out from the first capturing-probe $P_{iRj}$, following to a state that the first capturing-probe $P_{iRj}$ has moved upward, and further, being separated from a remnant group of the first micro-elements as illustrated in FIG. 5, if an unscheduled first micro-element other than the scheduled first micro-elements $X_{iRj}$ has been pseudo-picked up simultaneously. Thus, a current flowing through the coil 122 shall be decreased to a lower limit of current level, at which the scheduled first micro-elements $X_{iRj}$ will not be dropped off, the unscheduled first micro-element that has been weakly picked up by the anti-capturing surface can be removed, after a state that the first capturing-probe $P_{iRj}$ has been moved upward to be separated from the remnant group of the first micro-elements.

Even if the capturing-face of the first capturing-probe $P_{iRj}$ has captured the first magnetic-force receptor $R_{iRj}$ from the side of bottom face, by decreasing the current flowing through the coil 122, the first capturing-probe $P_{iRj}$ can remove the first micro-element, whose first magnetic-force receptor $R_{iRj}$ is captured from the side of bottom face. In addition, there is a scheme of setting the magnetic force strength of the first capturing-probe $P_{iRj}$ to a level at which the first magnetic-force receptor $R_{iRj}$, whose functional face is oriented at a bottom face, is not picked up, even if the first capturing-probe $P_{iRj}$ is made to approach from the side of top face. In the above scheme, the remaining first micro-elements $X_{iRj}$ that cannot be picked up by the first capturing-probe $P_{iRj}$ shall be again picked up by the first capturing-probe $P_{iRj}$, after an additional process for inversing the relationships between the top and bottom faces of the first micro-elements $X_{iRj}$ have been finished on the remaining first micro-elements $X_{iRj}$.

Also, in an architecture in which the electromagnet is used in the first MFA portion, if the current flowing through the coil 122 is decreased in the orientation-adjustment process illustrated in FIG. 6B, a state of a nonprovisional-captured stage can be achieved by finely adjusting the chip-orientation of the first micro-element $X_{iRj}$ at provisional-capturing stage with the pitch-rotation by gravity "g". In a structure of using the core 121 of the electromagnet, by turning off the switch S connected in series to the coil 122 and the variable current supply 123, the first micro-element $X_{iRj}$ illustrated in FIG. 8B can be dropped into the concaves, which are cut in the precise alignment-tray 14. Ferrite can be also used for the core 121. If the ferrite is used, instead of hard ferrite, soft-magnetic soft ferrite that becomes a magnet when magnetic field is applied and returns to the original state when the magnetic field is turned off is preferable.

As the architecture using the electromagnet, as illustrated in FIG. 4B, a structure can be exemplified in which the first capturing-probe $P_{iRj}$ includes the coil 122 illustrated in FIG. 4A and the electromagnet-enclosure 126 for embedding the core 121 of the coil 122. The electromagnet-enclosure 126 may be made of electrically-insulating low magnetic permeability material such as fluorine resin and the like. One end surface (the end surface on the left side in FIG. 4B) of the electromagnet-enclosure 126 is cylindrical shape having a hemi-spherical convex portion. And, a hemi-spherical convex portion and a part of the cylinder connected to the hemi-spherical convex portion exhibit an L-shaped recessed structure, in which a part of the cylinder and the hemi-spherical convex portion is notched from a lower direction to the vicinity of the center of the cylinder so that the first capturing-face 125 is exposed, as illustrated in FIG. 4B.

Figure 10:
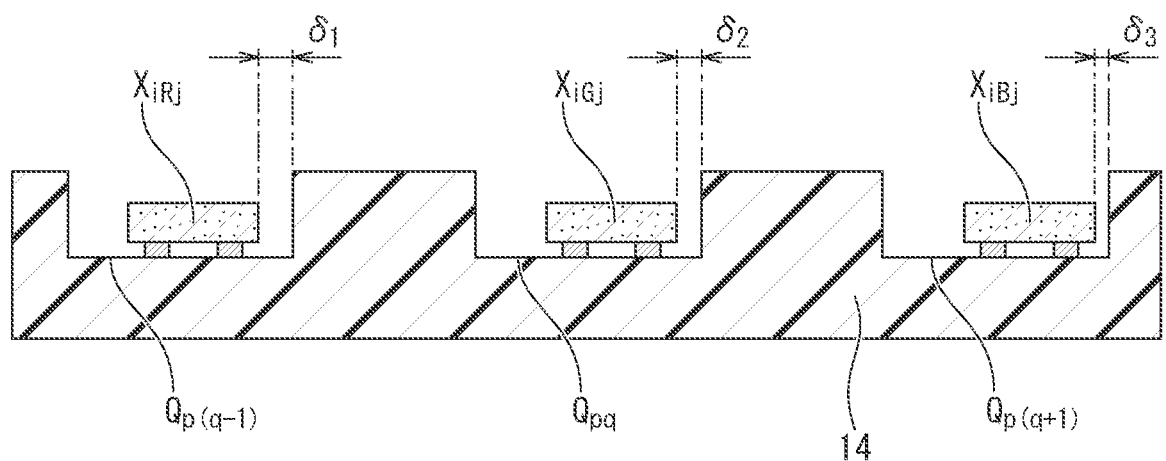
FIG. 10 is a process-flow cross-sectional view illustrating a situation in which, the first, the second and the third micro-elements are put into the concaves of the precise alignment-tray in three-separated times by employing the first, the second and the third pickers in turn, and the micro-elements are roughly arrayed in the concaves.

An area of the first capturing-face 125 in which the bottom face of the core 121 is exposed is set to be smaller than an area of the first micro-element $X_{iRj}$ serving as a capturing target. Thus, double or more of the first micro-elements $X_{iRj}$ are designed not to be picked up simultaneously by one first capturing-face 125. A distance between the first identification latus of the first functional face of the first micro-element $X_{iRj}$ and a vertical wall made of low magnetic permeability material that implements the L-shape recessed configuration, defining the end line of the first capturing-face 125, services as a parameter related to a distance $\delta_1$ between a right side-face of the first micro-element $X_{iRj}$ and a right side-wall of a concave $Q_{j(i-1)}$, which is illustrated in FIG. 10. Thus, the distance $\delta_1$ becomes larger, unless a length of the first capturing-face 125, measured in a longitudinal direction of the first capturing-probe $P_{iRj}$, is set to about two times of the value, in which a predetermined clearance length is added to a distance between the first identification latus of the first functional face of the first micro-element $X_{iRj}$ and the center of the first magnetic-force receptor $R_{iRj}$.

As mentioned above, the structure illustrated in FIG. 4B is merely an illustrative exemplification. For example, if the end surface of the electromagnet-enclosure 126 illustrated in FIG. 4B is not represents a hemi-spherical convex portion, namely the end surface is a flat end-face of the usual cylinder, and if the flat end-face is used as a first capturing-face, and if a first MFA portion is disposed on the flat end-face, the L-shape recessed configuration is unnecessary. If the end-face of the core 121 is exposed to the end-face of the cylinder to define the first MFA portion, the quadratic prism illustrated in FIG. 4A can be replaced with the cylinder, and the circular first MFA portion is exposed to the end-face of the cylinder. Thus, the distance $\delta_1$ illustrated in FIG. 10 can be made small, if the outer diameter of the circle of the exposed first MFA portion is approximately set to the outer diameter of the first magnetic-force receptor $R_{iRj}$.

Differently from the example illustrated in FIGS. 4A and 4B, if the end surface of the electromagnet-enclosure 126 is not the hemi-spherical convex portion, and the electromagnet-enclosure 126 is constructed as a cylinder having an obliquely-cut end-face (oblique face), and the oblique face is used as an elliptical first capturing-face, the first MFA portion may be disposed in the elliptical first capturing-face. Even if the end-face of the core 121 is exposed to the oblique face to assign the first MFA portion, the quadratic prism serving as the core 121 illustrated in FIG. 4A is replaced with the cylinder. And, since the elliptical first MFA portion is exposed to the end-face of the cylinder, the distance $\delta_1$ illustrated in FIG. 10 can be made small by making a long diameter of the exposed ellipse approximately identical to an outer diameter of the first magnetic-force receptor $R_{iRj}$. Or alternatively, the quadratic prism implementing the core 121 illustrated in FIG. 4A may be replaced by an elliptical cylinder having an elliptical cross-section, so that the shape of the end-face of the core 121 exposed to the oblique face becomes circular.

In the structural example illustrated in FIG. 4B, the outer shape of the first capturing-probe $P_{iRj}$ is cylindrical surface (curved surface) except for the flat first capturing-face 125 in which the bottom face of the core 121 is exposed. Regarding the first magnetic lines leaked from other than the first capturing-face 125, the unscheduled first micro-element is less likely to be picked up except on the first capturing-face 125, because a magnetic distance between the unscheduled first micro-element and the core 121 becomes relatively long. As mentioned above, even if the end-face orthogonal to the longitudinal direction of the cylinder is used as the first capturing-face, the cylindrical surface other than the first capturing-face becomes anti-capturing surface in which the magnetic distance between the unscheduled first micro-element and the core 121 is relatively long, which constructs a structure in which the unscheduled first micro-element is less likely to be picked up except on the first capturing-face. The structure in which the unscheduled first micro-element is less likely to be picked up can be applied to a case in which the end-face obliquely cutting the cylinder is used as the first capturing-face, and portions other than the first capturing-face become the anti-capturing surfaces made of the cylindrical surface.

Thus, even in the structure exemplified in FIG. 4B, or alternatively, even in other structures having a permanent-magnet and so on, the pattern of the first magnetic-force receptor $R_{iRj}$ of the first micro-element $X_{iRj}$ is sucked by the first MFA portion of the first capturing-face 125. Thus, the first identification latus can be uniquely defined, by providing the pattern of the first magnetic-force receptor $R_{iRj}$, which is made related to the first identification latus that is a particular single latus elected from quadruple latera implementing the first functional face of the first micro-element $X_{iRj}$, so that the pattern of the first magnetic-force receptor $R_{iRj}$ can be sucked by the first MFA portion. As the first magnetic-force receptor $R_{iRj}$ and the first MFA portion are in close contact, the first functional face of the first micro-element $X_{iRj}$ on which the first magnetic-force receptor $R_{iRj}$ is provided and the first capturing-face 125 in which the first MFA portion is provided are made in parallel, and the normal direction of the first functional face can be uniquely defined.

That is, as illustrated in FIGS. 3A, 3B, 5 and the like, the first functional face of the first micro-element $X_{iRj}$ and the first identification latus defined on the first functional face are picked up by the tip of the first capturing-probe $P_{iRj}$ selectively and uniquely. Since positions of the first functional face and the first identification latus can be uniquely defined, chip-orientations located within a desirable range can be selected, and uniquely determined by the first capturing-probe $P_{iRj}$ out of any chip-orientations classified into octuple regions possessed by the first micro-elements $X_{iRj}$, which are shuffled at random.

FIG. 5 schematically illustrates shuffled configurations of first micro-elements $X_{iRj(j-1)}$, $X_{iRj}$, $X_{iRj(j+1)}$, - - -, which are manufactured by dicing of the chip regions defined on a wafer, after the completion of crystal growth. And, FIG. 5 illustrates the transient configurations in which an array of first capturing-probes $P_{iRj(j-1)}$, $P_{iRj}$, $P_{iRj(j+1)}$, - - - , the structure example of which is illustrated in FIGS. 4A, 4B and the like, are moved above a mountain of the first micro-elements $X_{iRj(j-1)}$, $X_{iRj}$, $X_{iRj(j+1)}$, - - - , each of the first capturing-probes $P_{iRj(j-1)}$, $P_{iRj}$, $P_{iRj(j+1)}$, - - - tries respectively to capture each of the corresponding first micro-elements $X_{iRj(j-1)}$, $X_{iRj}$, $X_{iRj(j+1)}$, - - - . Prior to the state illustrated in FIG. 5, there is a procedure for inserting each tip of the first capturing-probes $P_{iRj(j-1)}$, $P_{iRj}$, $P_{iRj(+1)}$, - - - into the mountain of the first micro-elements $X_{iRj(j-1)}$, $X_{iRj}$, $X_{iRj(j+1)}$, - - - .

For example, in a situation in which the respective tips of the first capturing-probes $P_{iRj(j-1)}$, $P_{iRj}$, $P_{iRj(j+1)}$, - - - are inserted in the mountain of the first micro-elements $X_{iRj(j-1)}$, $X_{iRj}$, $X_{iRj(j+1)}$, - - - , so that the first micro-elements $X_{iRj(j-1)}$, $X_{iRj}$, $X_{iRj(j+1)}$, - - - are quietly agitated by the first capturing-probes $P_{iRj(j-1)}$, $P_{iRj}$, $P_{iRj(j+1)}$, - - - as if packed potatoes are frictionally washed by plate-shaped stick in a barrel. In the mountain, since the respective tips of the first capturing-probes $P_{iRj(j-1)}$, $P_{iRj}$, $P_{iRj(j+1)}$, - - - are moved, first magnetic lines spread from the respective tips seek out and suck respective first magnetic-force receptors $R_{iRj(j-1)}$, $R_{iRj}$, $R_{iRj(j+1)}$, - - - of the first micro-elements $X_{iRj(j-1)}$, $X_{iRj}$, $X_{iRj(j+1)}$, - - - located in the vicinities of the respective tips. And, when the respective tips of the first capturing-probes $P_{iRj(j-1)}$, $P_{iRj}$, $P_{iRj(j+1)}$, - - - are slightly pulled out from the mountain of the first micro-elements $X_{iRj(j-1)}$, $X_{iRj}$, $X_{iRj(j+1)}$, - - - , the transient configurations at the pseudo-capturing stage are induced as illustrated in FIG. 5.

Through a process of three-dimensional rotation of the Euler angles (θ, φ, Ψ) of the object coordinate system as illustrated in FIG. 3A, the first micro-elements $X_{iRj(j-1)}$, $X_{iRj}$, $X_{iRj(j+1)}$, - - - at a pseudo-capturing stage change to a stable state of a provisional-capturing stage. Moreover, the first micro-elements $X_{iRj(j-1)}$, $X_{iRj}$, $X_{iRj(j+1)}$, - - - at provisional-capturing stage are fed to the upper portion of the precise alignment-tray 14 exemplified in FIG. 8A and the like through a process of a nonprovisional capturing stage (see FIG. 6B) for performing a fine adjustment so that the chip-orientation approaches the optimal direction. And, the first micro-elements $X_{iRj(j-1)}$, $X_{iRj}$, $X_{iRj(j+1)}$, - - - are released from the first capturing-probes $P_{iRj(j-1)}$, $P_{iRj}$, $P_{iRj(j+1)}$, - - - , respectively, so that the first micro-elements $X_{iRj(j-1)}$, $X_{iRj}$, $X_{iRj(j+1)}$, - - - are put into the respective concaves of the precise alignment-tray 14.

As mentioned above, the rough alignment-apparatus of the alignment system of the representative embodiment encompasses the first picker 13R illustrated in FIG. 6A, the second picker 13G illustrated in FIG. 7A and the third picker 13B illustrated in FIG. 7B. At first, when focusing to the first picker 13R, an array of the first capturing-probes $P_{iRj(j-1)}$, $P_{iRj}$ and $P_{iRj(j+1)}$ that are exemplified as only triple probes in FIG. 5 are integrated to be mounted on a first base-plate with a plate-shaped cuboid illustrated in FIG. 6A as the first base-plate by using MEMS technology. That is, FIG. 6A exemplifies a structure in which first capturing-probes $P_{1R1}$, $P_{1R2}$, $P_{2R1}$, $P_{2R2}$, $P_{3R1}$ and $P_{3R2}$ for capturing first micro-elements $X_{1R1}$, $X_{1R2}$, $X_{2R1}$, $X_{2R2}$, $X_{3R1}$ and $X_{3R2}$ serving as red LEDs, in chip-orientations orientated in a desired range, are arrayed in a shape of matrix at a predetermined pitch on the first base-plate of cuboid. FIG. 6A schematically expresses a situation in which the first capturing-probes $P_{1R1}$, $P_{1R2}$, $P_{2R1}$, $P_{2R2}$, $P_{3R1}$ and $P_{3R2}$ which are equal in dimension, shape, structure and direction are integrated on the first base-plate by the technology similar to a micro-mirror array of MEMS.

In addition, attention should be paid to an expediential situation that FIG. 6A simply illustrates the sextuple first capturing-probes $P_{1R1}$, $P_{1R2}$, $P_{2R1}$, $P_{2R2}$, $P_{3R1}$ and $P_{3R2}$, in order to avoid the drawing from being complicated and large. Depending on the number of the first micro-elements—red micro-LEDs and the like—practically required by an LED display or the like, which serve as targets for assembling, the number of the first capturing-probes illustrated in FIG. 6A can be 10,000 to 1,000,000. Thus, the number of concaves $Q_{11}$, $Q_{12}$, $Q_{13}$, $Q_{21}$, - - - , $Q_{31}$, - - - arrayed in the precise alignment-tray 14 illustrated in FIG. 8A described later can be 30,000 to 3,000,000 in view of the triple colors of RGB-colors. The array pitch of the sextuple first capturing-probes $P_{1R1}$, $P_{1R2}$, $P_{2R1}$, $P_{2R2}$, $P_{3R1}$ and $P_{3R2}$, that are simplistically illustrated, shall be designed with integer times (k times) of the pitch in a row direction of the concaves $Q_{11}$, $Q_{12}$, $Q_{13}$, $Q_{21}$, - - - , $Q_{31}$, - - - of the precise alignment-tray 14 illustrated in FIG. 8A. Although k=3 in the case of the triple colors of RGB-colors, k may be a positive integer of double or more. For a display-apparatus of quadruple colors, k=4.

For example, on a first row (the uppermost row) of the principal-face of the first base-plate made of the plate-shaped block in FIG. 6A, between the left first capturing-probe $P_{1R1}$ and the right first capturing-probe $P_{1R2}$, two virtual chips (blank portions) represented by broken-lines are continuously allocated to schematically indicate a first array-pattern skipping every two chips. A stride between the left first capturing-probe $P_{1R1}$ and the right first capturing-probe $P_{1R2}$, measured along the row direction in the first array-pattern, is three times of the pitch of concaves $Q_{11}$, $Q_{12}$, $Q_{13}$, - - - along the row direction. That is, the left first capturing-probe $P_{1R1}$ is provided at the position of the concave $Q_{11}$, and the right first capturing-probe $P_{1R2}$ is provided at the position of the concave $Q_{14}$, respectively. The left first capturing-probe $P_{1R1}$ and the right first capturing-probe $P_{1R2}$ are provided as elongated bar-shaped structures, which extend obliquely in a low left direction, respectively. And, the first MFA portion at the tip of the bar-shaped first capturing-probe $P_{1R1}$ captures the first micro-element $X_{1R1}$ through the first magnetic-force receptor $R_{1R1}$ with the first magnetic lines. And, the first MFA portion of the first capturing-probe $P_{1R2}$ captures the first micro-element $X_{1R2}$ through the first magnetic-force receptor $R_{1R2}$ with the first magnetic lines. FIG. 6A illustrates a situation after the fine adjustment of the chip-orientation, while the chip is rotated by gravity "g" so that the first micro-element $X_{1R1}$ is placed in the optimal chip-orientation, via the first MFA portion at the tip of the bar-shaped first capturing-probe $P_{1R1}$. And furthermore, FIG. 6A illustrates a situation after the fine adjustment of the chip-orientation, while the chip is rotated by gravity "g" so that the first micro-element $X_{1R2}$ is placed in the optimal chip-orientation, via the first MFA portion of the first capturing-probe $P_{1R2}$.

FIG. 6B illustrates that a normal line passing through a position of the first MFA portion at the tip of the first capturing-probe $P_{iRj}$, the position corresponds to a center of the first magnetic-force receptor $R_{iRj}$, is defined as "a pitch axis" of the reference coordinate system (r, p, y). And furthermore, FIG. 6B illustrates that the first capturing-face 125 at the tip of the first capturing-probe $P_{iRj}$ is defined as "a pitch plane". That is, FIG. 6B schematically illustrates a process in which the first micro-element $X_{iRj}$ is rotated by a pitch-angle φ around the pitch axis by gravity "g", and the chip-orientation of the first micro-element $X_{iRj}$ is finely adjusted at provisional-capturing stage. A normal direction to a paper plane in FIG. 6B becomes the pitch axis of the reference coordinate system (r, p, y). For example, a chip for the first micro-elements $X_{iRj}$ is assumed to be quasi-picked up by the first MFA portion of the first capturing-probe $P_{iRj}$ by the first magnetic lines, in an inclined orientation of a rectangular chip illustrated by double-dotted lines, which is inclined in a lower left direction. In FIG. 6B, a position of a barycenter of a rectangle represented by double-dotted lines is inclined in a clockwise direction by a pitch-angle φ with respect to a plumb line indicated by dash-dotted line, the plumb line is passing through the pitch axis.

A counterclockwise torque around a rotation center, defined at a center of the first magnetic-force receptor $R_{iRj}$, is generated by gravity "g", which is applied to the barycenter of the rectangle represented by double-dotted lines, and the double-dotted lines indicate a chip-orientation at a provisional-capturing stage. As illustrated in FIG. 6B, in a situation in which the pitch axis is orthogonal to the plum line, if the magnetic-force is made slightly weaker than that of provisional-capturing stage, a free degree that enables a pitch-rotation in a pitch-angle φ direction around a fulcrum, which is defined at a position of the first magnetic-force receptor $R_{iRj}$, between the first MFA portion at the tip of the first capturing-probe $P_{iRj}$ and the first magnetic-force receptor $R_{iRj}$. That is, if the first magnetic lines spread from the first MFA portion is made slightly weak, the rectangle represented by double-dotted lines that indicates the chip-orientation at provisional-capturing stage tries to be counterclockwise rotated by the pitch-angle φ so as to become a chip-orientation of the first micro-element $X_{iRj}$ represented by solid line. As a result, the chip-orientation of the first micro-element $X_{iRj}$ becomes a nonprovisional-captured state that is finely adjusted in a direction close to the optimal chip-orientation required by design.

On the contrary, a rectangle represented by double-dotted lines is assumed to be picked up, and hypothetically, be inclined in a lower right direction as illustrated in FIG. 6B, namely a barycenter of in a provisional-capturing state is assumed to be counterclockwise inclined by the pitch-angle φ with respect to the plum line passing through the pitch axis. As to the barycenter of the rectangle represented by double-dotted lines indicating the chip-orientation at a provisional-capturing stage, a clockwise torque is generated by gravity "g" with respect a rotation center, defined at the center of the first magnetic-force receptor $R_{iRj}$. If the magnetic-force is made slightly weaker than that of provisional-capturing stage, a free degree that enables the pitch-rotation in the pitch-angle φ direction around a fulcrum, which is defined at the position of the first magnetic-force receptor $R_{iRj}$, can be set between the first MFA portion at the tip of the first capturing-probe $P_{iRj}$ and the first magnetic-force receptor $R_{iRj}$. That is, if the first magnetic lines spread from the first MFA portion is made slightly weak, the rectangle represented by double-dotted lines that indicates the chip-orientation at provisional-capturing stage tries to be clockwise rotated to become the chip-orientations of the first micro-elements $X_{iRj}$ indicated by the solid line. Thus, the above clockwise rotation results in the nonprovisional-captured state that is finely adjusted in the direction close to the optimal chip-orientation required by design.

FIGS. 6A and 6B illustrate situations in which the central axis in the longitudinal direction of the first capturing-probe $P_{iRj}$ is in parallel with the principal-face of the plate-shaped cuboid serving as the first base-plate of the first picker 13R, namely, situations of "parallel mode", or so-called closed armpit mode. On the other hand, at the step illustrated in FIG. 5 at which the tips of first capturing-probes $P_{iRj(j-1)}$, $P_{iRj}$, $P_{iRj(j+1)}$, - - - are inserted into the mountain of the first micro-elements $X_{iRj(j-1)}$, $X_{iRj}$, $X_{iRj(j+1)}$, - - -, respectively, and the first micro-elements $X_{iRj(j-1)}$, $X_{iRj}$, $X_{iRj(j+1)}$, - - - are agitated by the first capturing-probes $P_{iRj(j-1)}$, $P_{iRj}$, $P_{iRj(j+1)}$, - - - as if packed potatoes are frictionally washed by plate-shaped stick in a barrel, "a branched mode" providing a certain angle to the first capturing-probes $P_{iRj(j-1)}$, $P_{iRj}$, $P_{iRj(j+1)}$, - - - from the principal-face of the plated-shape block of cuboid serving as the first base-plate, or so-called open-armpit mode is required. That is, in order for the first magnetic lines spread from the respective tips can seek out and suck the respective first magnetic-force receptors $R_{iRj(j-1)}$, $R_{iRj}$, $R_{iRj(j+1)}$, - - - of the first micro-elements $X_{iRj(j-1)}$, $X_{iRj}$, $X_{iRj(j+1)}$, - - - located in the vicinities of the respective tips, by moving the respective tips of the first capturing-probes $P_{iRj(j-1)}$, $P_{iRj}$, $P_{iRj(j+1)}$, - - - in the mountain of the first micro-elements, according to the situation illustrated in FIG. 5, the scheme of the branched mode is more likely to increase a yield.

Figure 6C:
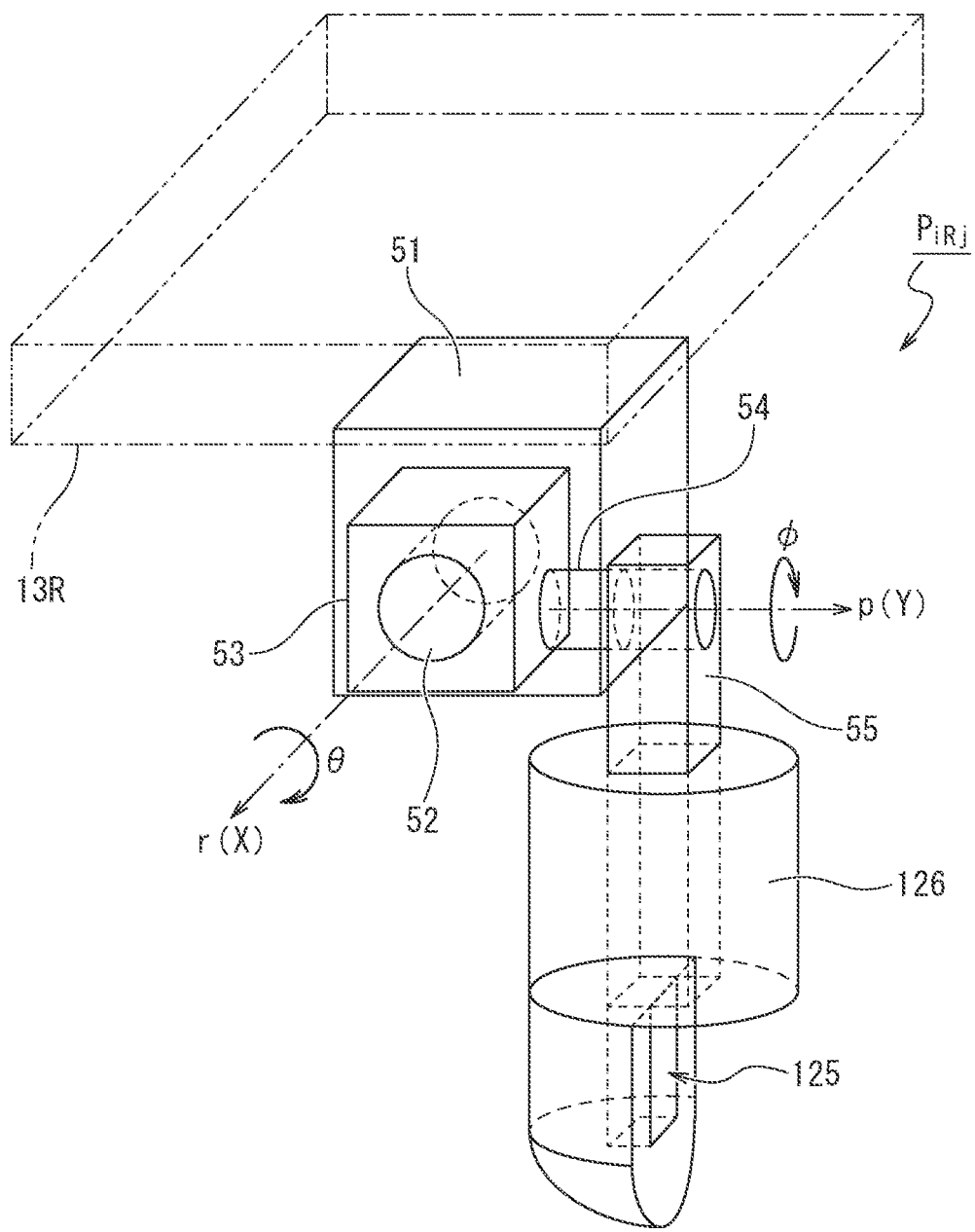
FIG. 6C is a schematic bird's-eye view, which illustrates a first base-block of the first picker with double-dotted lines and explains a relationship between the first base-block and a double-axis rotation mechanism implementing the first capturing-probe.

For easily conducting the scheme of the branched mode, a method of fixing each of the first capturing-probes $P_{iRj(j-1)}$, $P_{iRj}$, $P_{iRj(j+1)}$, - - - to the first base-plate at a certain branch-angle is convenient for users. At the branched mode, once each branch-angle of the first capturing-probes $P_{iRj(j-1)}$, $P_{iRj}$, $P_{iRj(j+1)}$, - - - is fixed, it is impossible to set the scheme of the parallel mode as illustrated in FIGS. 6A and 6B. However, in a condition that the branch-angle to each first base-plate of the first capturing-probes $P_{iRj(j-1)}$, $P_{iRj}$, $P_{iRj(j+1)}$, - - - is fixed, an orientation-adjustment process by gravity "g" equivalent to FIG. 6B can be realized, by inclining the principal-face of the first base-plate in the absolute coordinate system—global coordinate system—. That is, a face-orientation of the pitch plane illustrated in FIG. 6B can be realized by rotating the first base-plate in which each of the first capturing-probes $P_{iRj(j-1)}$, $P_{iRj}$, $P_{iRj(j+1)}$, - - - is fixed at the branch-angle around the yaw axis (y-axis), roll axis (r-axis) and pitch axis (p-axis) in the absolute coordinate system. On the other hand, in order to realize both schemes of the branched mode and the parallel mode, some rotation mechanism such as a double-axis rotation mechanism is required as exemplified in FIG. 6C. A triple-axis rotation mechanism or a single-axis rotation mechanism may be used instead of the double-axis rotation mechanism. Also, even in the case of the double-axis rotation mechanism, the double-axis rotation mechanism illustrated in FIG. 6C is merely one example of exemplifications. Thus, various double-axis rotation mechanisms of different structures are available.

FIG. 6C is a schematic bird's-eye view, which illustrates the plate-shaped cuboid serving as the first base-plate of the first picker 13R by double-dotted lines and explains the relationship between the double-axis rotation mechanism embracing the first capturing-probe $P_{iRj}$ and the first base-plate. The plate-shaped cuboid illustrated by double-dotted lines is described by the absolute coordinate system—global coordinate system—. The double-axis rotation mechanism embracing the first capturing-probe $P_{iRj}$ has a roll-axis-base 51 made of a cuboid fixed to the first base-plate illustrated by double-dotted lines. In FIG. 6C, an orientation is selected in which among quadruple faces implementing the roll-axis-base 51, a normal direction of the opposite double faces is assigned to Z-axis direction, a normal direction of the opposite double faces is assigned to X-axis direction, and a normal direction of the remaining opposite double faces is assigned to Y-axis direction. However, the above orientation is merely an illustrative exemplification, and the X-axis and Y-axis directions can be selected arbitrarily. As illustrated in FIG. 6C, the double-axis rotation mechanism of the first capturing-probe $P_{iRj}$ further encompasses a roll principal-shaft 52 of cylindrical-shape, which extends along the X-axis direction, and a pitch axis-base 53 made of cuboid that has a penetration hole for housing the roll principal-shaft 52. The roll principal-shaft 52 is provided on one of the faces of the roll-axis-base 51, and the X-axis direction is assigned to the normal direction of the one of the faces of the roll-axis-base 51.

Although illustration of a driving apparatus such as an actuator and the like for driving the roll-rotation is omitted, the pitch axis-base 53 can freely roll-rotate around the roll principal-shaft 52. Since the pitch axis-base 53 can rotate around the roll principal-shaft 52, the normal direction of the opposite double faces among the quadruple faces implementing the pitch axis-base 53 is defined as the X-axis direction. Out of the quadruple faces implementing the pitch axis-base 53, the normal direction of the other opposite double faces and the normal direction of the remaining opposite double faces are changed by the roll-rotation of the pitch axis-base 53. For the sake of convenience, FIG. 6C illustrates an exemplary configuration, in which the normal direction of the opposite double faces is assigned to the Y-axis direction, and the normal direction of the remaining opposite double faces is assigned to the Z-axis direction, among the quadruple faces implementing the pitch axis-base 53.

And, as illustrated in FIG. 6C, the double-axis rotation mechanism of the first capturing-probe $P_{iRj}$ further encompasses a pitch principal-shaft 54 of cylindrical-shape and an action-bar base-shaft 55 having a cuboid rod. The pitch principal-shaft 54, which extends along the Y-axis direction, is provided on one of the faces of the pitch axis-base 53, and the Y-axis direction is assigned to the normal direction of the one of the faces of the pitch axis-base 53. At an end side of the action-bar base-shaft 55, a penetration hole for housing the pitch principal-shaft 54 is cut in the action-bar base-shaft 55. Since the action-bar base-shaft 55 can rotate around the pitch principal-shaft 54, among the quadruple faces of cuboid rods implementing the action-bar base-shaft 55, the normal direction of the opposite double faces becomes the Y-axis direction, if the pitch principal-shaft 54 is oriented along the Y-axis direction. Although FIG. 6C exemplifies a case in which the pitch principal-shaft 54 extends along the Y-axis direction, due to the roll-rotation of the pitch axis-base 53, among the quadruple faces of the cuboid rod implementing the action-bar base-shaft 55, the normal direction of the opposite double faces will become a direction differing from the Y-axis direction. In a configuration in which the pitch principal-shaft 54 illustrated in FIG. 6C extends along the Y-axis direction, the longitudinal direction of the cuboid rod of in the action-bar base-shaft 55 becomes the Z-axis.

Although illustration of a driving apparatus such as an actuator and the like for driving the pitch-rotation is omitted, since the action-bar base-shaft 55 can freely pitch-rotated around the pitch principal-shaft 54, the longitudinal direction of the cuboid rod of in the action-bar base-shaft 55 can be changed in directions differing from the Z-axis direction. That is, due to the roll-rotation of the pitch axis-base 53 and the pitch-rotation of the action-bar base-shaft 55, any direction differing from the direction illustrated in FIG. 6C can be selected for longitudinal directions of the cuboid-shaped action-bar base-shaft 55. An end-face opposite to the side of the pitch principal-shaft 54 of the action-bar base-shaft 55 is connected to the electromagnet-enclosure 126 housing the electromagnet. An end surface opposite to the action-bar base-shaft 55 of the electromagnet-enclosure 126 is hemispherical convex. And, the hemi-spherical convex portion and a part of the cylinder being connected to the hemi-spherical convex portion side exhibit a recessed-structure in which the first capturing-face 125 is exposed in a flat area covering the hemi-spherical convex portion, as illustrated in FIG. 6C.

The first capturing-face 125, provided in the structure in which a part of the cylinder whose end surface is hemispherical is recessed up to a depth of a center along radial direction, is a flat plane in which the core 121 of an electromagnet is exposed (see FIGS. 4A and 4B). Since a surface portion other than the first capturing-face 125 is cylindrical surface (curved surface), magnetic distances between the first micro-element $X_{iRj}$ and the core 121 become relatively long, which lead to conditions in which the first micro-element $X_{iRj}$ is less likely to be picked up. Thus, as illustrated in FIGS. 3A, 3B, 5 and the like, the first magnetic-force receptor $R_{iRj}$ of the first micro-element $X_{iRj}$ is selectively picked up by the first capturing-face 125. The subject matter is equivalent to a situation that the first functional face of the first micro-element $X_{iRj}$ and the first identification latus selected by the above functional face can be described by the reference coordinate system (r, p, y) at the first capturing-probe $P_{iRj}$. Accordingly, the first micro-element $X_{iRj}$ is picked up by selecting the chip-orientation.

Due to the roll-rotation of the pitch axis-base 53 implementing the double-axis rotation mechanism illustrated in FIG. 6C and the pitch-rotation of the action-bar base-shaft 55, the face-orientation of the first capturing-face 125 can be controlled in any direction. Thus, by setting the X-Y-Z coordinates of the reference coordinate system so that a plane parallel to the first capturing-face 125 is assigned to the plum line direction, it is possible to increase the controlling performance of the rotation around a fulcrum in the pitch-angle $\varphi$ direction by gravity "g", the fulcrum is defined at the position of the first magnetic-force receptor $R_{iRj}$, as illustrated in FIG. 6B. As a result, by finely adjusting errors with respect to an optimal chip-orientation required by design to within ±45 degrees or less, the chip-orientation of the first micro-element $X_{iRj}$ can be set to the chip-orientation of the nonprovisional-captured state.

On the second row of the first picker 13R, the array model of skipping every two chips is illustrated in FIG. 6A. The array model of skipping every two chips is expressed via inserted double virtual chips represented by broken lines, and the virtual chips are schematically indicated between a left first capturing-probe $P_{2R1}$ and a right first capturing-probe $P_{2R2}$, for setting a stride between the left first capturing-probe $P_{2R1}$ and the right first capturing-probe $P_{2R2}$ to three times of the row-direction pitch of the concaves $Q_{21}$, $Q_{22}$, $Q_{23}$, - - - . That is, the left first capturing-probe $P_{2R1}$ is assigned at a position of the concave $Q_{22}$, and the right first capturing-probe $P_{2R2}$ is assigned at a position of the concave $Q_{25}$, respectively, achieving the array of skipping every two chips. The left first capturing-probe $P_{2R1}$ and the right first capturing-probe $P_{2R2}$ are illustrated as elongated bar-shaped structures, extending in inclined configurations in a lower left direction. In addition, a topology in which the first capturing-probe $P_{2R1}$ is assigned at the position of the concave $Q_{22}$, and the first capturing-probe $P_{2R2}$ is assigned at the position of the concave $Q_{25}$ is merely an illustrative exemplification, for convenience's sake of simple explanation. So, the topology can be changed depending on the first array-pattern defined by a pixel design of a targeted LED display.

For example, another array, such as a topology in which the left first capturing-probe $P_{2R1}$ is arrayed at a position of the concave $Q_{21}$, and the right first capturing-probe $P_{2R2}$ is arrayed at a position of the concave $Q_{24}$ or others, may be used as a first array-pattern. And, the first MFA portion of the bar-shaped first capturing-probe $P_{2R1}$ captures the first micro-element $X_{2R1}$ through the first magnetic-force receptor $R_{2R1}$ by the first magnetic lines, and the first MFA portion of the first capturing-probe $P_{2R2}$ captures the first micro-element $X_{2R2}$ through the first magnetic-force receptor $R_{2R2}$ by the first magnetic lines. FIG. 6A illustrates the nonprovisional-captured state after the chip-orientation of the first micro-element $X_{2R1}$ is finely adjusted, under a condition that the chip for the first micro-element $X_{2R1}$ is pitch-rotated around a fulcrum in the pitch-angle $\varphi$ direction by gravity "g", the fulcrum is defined at the first MFA portion of the left first capturing-probe $P_{2R1}$. Also, FIG. 6A illustrates the nonprovisional-captured state after the orientation-adjustment process of the first micro-element $X_{2R2}$, under a condition that the chip for the first micro-element $X_{2R2}$ is pitch-rotated around a fulcrum in the pitch-angle $\varphi$ direction by gravity "g", the fulcrum is defined at the first MFA portion of the right first capturing-probe $P_{2R2}$.

On the third row of the first picker 13R, the first array-pattern of skipping every two chips is illustrated in FIG. 6A. The first array-pattern of skipping every two chips is expressed via inserted double virtual chips represented by broken lines, and the virtual chips are schematically indicated between a left first capturing-probe $P_{3R1}$ and a right first capturing-probe $P_{3R2}$, for setting a stride between the left first capturing-probe $P_{3R1}$ and the right first capturing-probe $P_{3R2}$ to three times of the row-direction pitch of the concaves $Q_{31}$, $Q_{32}$, $Q_{33}$, - - - . That is, the left first capturing-probe $P_{3R1}$ is assigned at a position of the concave $Q_{33}$, and the right first capturing-probe $P_{3R2}$ is assigned at a position of the concave $Q_{36}$, respectively, to achieve the array of skipping every two chips. The left first capturing-probe $P_{3R1}$ and the right first capturing-probe $P_{3R2}$ are illustrated an elongated bar-shaped structure bodies extending in an inclined configurations in a lower left direction. In addition, the first array-pattern in which the first capturing-probe $P_{3R1}$ is assigned at the position of the concave $Q_{33}$, and the first capturing-probe $P_{3R2}$ is assigned at the position of the concave $Q_{36}$ is merely an illustrative exemplification, for convenience's sake of simple explanation. Thus, the above pattern is not limited to the array topology illustrated in FIG. 6A.

For example, if the first capturing-probe $P_{2R1}$ is assigned at the position of the concave $Q_{21}$ and the first capturing-probe $P_{2R2}$ is assigned at the position of the concave $Q_{24}$, the first capturing-probe $P_{3R1}$ may be arrayed at the position of the concave $Q_{31}$, and the first capturing-probe $P_{3R2}$ may be arrayed at the position of the concave $Q_{34}$. And, the first MFA portion of the bar-shaped first capturing-probe $P_{3R1}$ captures the first micro-element $X_{3R1}$ through the first magnetic-force receptor $R_{3R1}$ by the first magnetic lines, and the first MFA portion of the first capturing-probe $P_{3R2}$ captures the first micro-element $X_{3R2}$ through the first magnetic-force receptor $R_{3R2}$ by the first magnetic lines. FIG. 6A illustrates the nonprovisional-captured state after the orientation-adjustment process by the rotational movement of the chip caused by gravity "g", as to the first micro-element $X_{3R1}$, in the first MFA portion of the left first capturing-probe $P_{3R1}$. Similarly, FIG. 6A illustrates the nonprovisional-captured state after the rotation of the chip is finely adjusted by gravity "g", as to the first micro-element $X_{3R2}$, in the first MFA portion of the right first capturing-probe $P_{3R2}$.

The rough alignment-apparatus in the alignment system of the representative embodiment encompasses the second picker 13G illustrated in FIG. 7A and the third picker 13B illustrated in FIG. 7B, in addition to the first picker 13R illustrated in FIG. 6A. As illustrated in FIG. 7A, the second picker 13G for capturing the second micro-elements $X_{1G1}$, $X_{1G2}$, $X_{2G1}$, $X_{2G2}$, $X_{3G1}$ and $X_{3G2}$, which are green LEDs, in chip-orientations orientated in a desirable range uses the plate-shaped cuboid as a second base-plate, similarly to the first picker 13R. The second picker 13G encompasses second capturing-probes $P_{1G1}$, $P_{1G2}$, $P_{2G1}$, $P_{2G2}$, $P_{3G1}$ and $P_{3G2}$ whose array pitch is designed as a second array-pattern, which has a stride corresponding to three times of row-direction pitch of the concaves $Q_{11}$, $Q_{12}$, $Q_{13}$, $Q_{21}$, - - - , $Q_{31}$, - - - of the precise alignment-tray 14 illustrated in FIG. 8A, on the second base-plate, by employing technology like the micro-mirror array. As can be understood from a mutual comparison between FIGS. 6A and 7A or a mutual comparison between FIGS. 9A and 9B, the first array-pattern and the second array-pattern are made related to the array of a mounting substrate, as patterns that are equal in pitch and different in phase. By using the technology of MEMS, the second capturing-probes $P_{1G1}$, $P_{1G2}$, $P_{2G1}$, $P_{2G2}$, $P_{3G1}$ and $P_{3G2}$ are designed to be equal in dimension, shape, structure and direction.

Owing to the manufacturing technology of MEMS, the second capturing-probes $P_{1G1}$, $P_{1G2}$, $P_{2G1}$, $P_{2G2}$, $P_{3G1}$ and $P_{3G2}$ are provided with the same dimension, shape, structure and direction as the first capturing-probes $P_{1R1}$, $P_{1R2}$, $P_{2R1}$, $P_{2R2}$, $P_{3R1}$ and $P_{3R2}$ of the first picker 13R. Due to the same structure, each of the second capturing-probes $P_{1G1}$, $P_{1G2}$, $P_{2G1}$, $P_{2G2}$, $P_{3G1}$ and $P_{3G2}$ encompasses the rotation mechanism based on the technology of MEMS and the second capturing-face and the like, as illustrated in FIG. 6C as one example. If the first capturing-probes $P_{1R1}$, $P_{1R2}$, $P_{2R1}$, $P_{2R2}$, $P_{3R1}$ and $P_{3R2}$ do not have the rotation mechanism, each of the second capturing-probes $P_{1G1}$, $P_{1G2}$, $P_{2G1}$, $P_{2G2}$, $P_{3G1}$ and $P_{3G2}$ will not have the rotation mechanism and becomes fixed structure. The second capturing-face is the flat plane like the first capturing-face 125. In addition, for the sake of illustration convenience, a feature that the sextuple second capturing-probes $P_{1G1}$, $P_{1G2}$, $P_{2G1}$, $P_{2G2}$, $P_{3G1}$ and $P_{3G2}$ are simply indicated is like the situation illustrated in FIG. 6A. Depending on the number of the second micro-elements (green micro-LEDs and the like) practically required by an LED display or the like targeted for assembling, the number of the second capturing-probes illustrated in FIG. 7A can be 10,000 to 1,000,000.

For example, an array stride between a left second capturing-probes $P_{1G1}$ and a right second capturing-probes $P_{1G2}$ on the first row on a principal-face of the second base-plate of cuboid is set to three times of the row-direction pitch of the concaves $Q_{11}$, $Q_{12}$, $Q_{13}$, - - - . Namely, the second array-pattern of skipping every two chips, which is expressed with aid of virtual chips represented by broken lines, is schematically drawn between the second capturing-probe $P_{1G1}$ and the second capturing-probe $P_{1G2}$. That is, the second capturing-probe $P_{1G1}$ is assigned at a position of the concave $Q_{12}$, and the second capturing-probe $P_{1G2}$ is assigned at a position of the concave $Q_{15}$, respectively, to establish the second array-pattern of skipping every two chips, and the second capturing-probe $P_{1G1}$ and the second capturing-probe $P_{1G2}$ are drawn as inclined elongated bar-shaped structures, extending in lower left direction. And the second MFA portion of the bar-shaped second capturing-probe $P_{1G1}$ captures the second micro-element $X_{1G1}$ through the second magnetic-force receptor $R_{1G1}$ by the second magnetic lines, and the second MFA portion of the second capturing-probe $P_{1G2}$ captures the second micro-element $X_{1G2}$ through the second magnetic-force receptor $R_{1G2}$ by the second magnetic lines. FIG. 7A illustrates a configuration in which with the second MFA portion of the left second capturing-probe $P_{1G1}$, the chip for the second micro-element $X_{1G1}$ is pitch-rotated around a fulcrum in a pitch-angle $\varphi$ direction by gravity "g", and the second micro-element $X_{1G1}$ is finely adjusted to the chip-orientation at the nonprovisional-captured stage. Also, FIG. 7A illustrates a configuration in which a chip for the second micro-element $X_{1G2}$ is pitch-rotated around a fulcrum by gravity "g", the fulcrum is defined at the second MFA portion of the right second capturing-probe $P_{1G2}$, and the second micro-element $X_{1G2}$ is finely adjusted to the chip-orientation at the nonprovisional-captured stage.

On the second row of the second picker 13G illustrated in FIG. 7A, a stride between a left second capturing-probe $P_{2G1}$ and a right second capturing-probe $P_{2G2}$ is set to three times of the row-direction pitch of the concaves $Q_{21}$, $Q_{22}$, $Q_{23}$, - - - for establishing the second array-pattern of skipping every two chips, which are expressed via inserted double virtual chips represented by broken lines, and the virtual chips are schematically drawn between the left second capturing-probe $P_{2G1}$ and the right second capturing-probe $P_{2G2}$. That is, the left second capturing-probe $P_{2G1}$ is assigned at a position of the concave $Q_{23}$, and the right second capturing-probe $P_{2G2}$ is assigned at a position of the concave $Q_{26}$, respectively, to establish the second array-pattern of skipping every two chips. The left second capturing-probe $P_{2G1}$ and the right second capturing-probe $P_{2G2}$ are illustrated as inclined elongated bar-shaped structures, extending in lower left direction. In addition, the second array-pattern in which the second capturing-probe $P_{2G1}$ is assigned at the position of the concave $Q_{23}$, and the second capturing-probe $P_{2G2}$ is assigned at the position of the concave $Q_{26}$ is merely an illustrative exemplification, for convenience's sake of simple explanation. The second array-pattern is not limited to the array topology illustrated in FIG. 7A.

For example, if a design specification of a subject LED display requires a second array-pattern such that the first capturing-probe $P_{2R1}$ illustrated in FIG. 6A is disposed at the position of the concave $Q_{22}$ and the first capturing-probe $P_{2R2}$ is disposed at the position of the concave $Q_{24}$, it is absolutely obvious that the second capturing-probe $P_{2G1}$ shall be assigned at the corresponding position of the concave $Q_{22}$ and the second capturing-probe $P_{2G2}$ shall be assigned at the corresponding position of the concave $Q_{25}$. And, the second MFA portion of the bar-shaped second capturing-probe $P_{2G1}$ captures the second micro-element $X_{2G1}$ through the second magnetic-force receptor $R_{2G1}$ by the second magnetic lines, and the second MFA portion of the second capturing-probe $P_{2G2}$ captures the second micro-element $X_{2G2}$ through the second magnetic-force receptor $R_{2G2}$ by the second magnetic lines. FIG. 7A illustrates a configuration in which a chip for the second micro-element $X_{2G1}$ is pitch-rotated around a fulcrum, which is defined at the second MFA portion of the left second capturing-probe $P_{2G1}$, in a pitch-angle $\varphi$ direction by gravity "g", and finely adjusted to the chip-orientation at the nonprovisional-captured stage. Similarly, FIG. 7A illustrates a configuration in which a chip for the second micro-element $X_{2G2}$ is pitch-rotated around a fulcrum, which is defined at the second MFA portion of the right second capturing-probe $P_{2G2}$, by gravity "g", and finely adjusted to the chip-orientation at the nonprovisional-captured stage.

On the third row of the second picker 13G illustrated in FIG. 7A, an array stride between a left second capturing-probes $P_{3G1}$ and a right second capturing-probes $P_{3G2}$ is set to three times of the row-direction pitch of the concaves $Q_{31}$, $Q_{32}$, $Q_{33}$, - - - , for establishing the second array-pattern of skipping every two chips, which is expressed via inserted double virtual chips represented by broken lines. The virtual chips are schematically drawn between the left second capturing-probe $P_{3G1}$ and the right second capturing-probe $P_{3G2}$. That is, the left second capturing-probe $P_{3G1}$ is assigned at a position of the concave $Q_{31}$, and the right second capturing-probe $P_{3G2}$ is assigned at a position of the concave $Q_{34}$, respectively, to establish the second array-pattern of skipping every two chips. The left second capturing-probe $P_{3G1}$ and the right second capturing-probe $P_{3G2}$ are illustrated as inclined elongated bar-shaped structures, extending in lower left direction. By the way, the second array-pattern in which the second capturing-probe $P_{3G1}$ is assigned at the position of the concave $Q_{31}$, and the second capturing-probe $P_{3G2}$ is assigned at the position of the concave $Q_{34}$ is merely an illustrative exemplification, for convenience's sake of simple explanation, and therefore, the second array-pattern is not limited to the array topology illustrated in FIG. 7A.

If the second capturing-probe $P_{2G1}$ is assigned at the position of the concave $Q_{22}$ and the second capturing-probe $P_{2G2}$ is assigned at the position of the concave $Q_{25}$, the second capturing-probe $P_{3G1}$ may be arrayed at the position of a concave $Q_{32}$, and the second capturing-probe $P_{3G2}$ may be arrayed at the position of the concave $Q_{35}$. And, the second MFA portion of the bar-shaped second capturing-probe $P_{3G1}$ captures the second micro-element $X_{3G1}$ through the second magnetic-force receptor $R_{3G1}$ by the second magnetic lines, and the second MFA portion of the second capturing-probe $P_{3G2}$ captures the second micro-element $X_{3G2}$ through the second magnetic-force receptor $R_{3G2}$ by the second magnetic lines. FIG. 7A illustrates a configuration in which a chip for the second micro-element $X_{3G1}$ is pitch-rotated around a fulcrum, which is defined at the second MFA portion of the left second capturing-probe $P_{3G1}$, by gravity "g", and finely adjusted to the chip-orientation at the nonprovisional-captured stage. Similarly, FIG. 7A illustrates a configuration in which a chip for the second micro-element $X_{3G2}$ is pitch-rotated around a fulcrum, which is defined at the second MFA portion of the right second capturing-probe $P_{3G2}$, by gravity "g", and finely adjusted to the chip-orientation at the nonprovisional-captured stage.

The rough alignment-apparatus in the alignment system of the representative embodiment encompasses the third picker 13B illustrated in FIG. 7B, in addition to the first picker 13R illustrated in FIG. 6A and the second picker 13G illustrated in FIG. 7A. As illustrated in FIG. 7B, the third picker 13B encompasses a plate-shaped cuboid as a third base-plate for capturing the third micro-elements $X_{1B1}$, $X_{1B2}$, $X_{2B1}$, $X_{2B2}$, $X_{3B1}$ and $X_{3B2}$, which are blue LEDs, in chip-orientations orientated in a desirable range, similarly to the first picker 13R and the second picker 13G. The third picker 13B further encompasses third capturing-probes $P_{1B1}$, $P_{1B2}$, $P_{2B1}$, $P_{2B2}$, $P_{3B1}$ and $P_{3B2}$ whose array pitch is designed as a third array-pattern, which has a stride corresponding to three times of row-direction pitch of the concaves $Q_{11}$, $Q_{12}$, $Q_{13}$, $Q_{21}$, - - - , $Q_{31}$, - - - of the precise alignment-tray 14 illustrated in FIG. 8A, on the third base-plate, by employing technology like the micro-mirror array. By using the technology of MEMS, the third capturing-probes $P_{1B1}$, $P_{1B2}$, $P_{2B1}$, $P_{2B2}$, $P_{3B1}$ and $P_{3B2}$ are manufactured to be equal in dimension, shape, structure and direction. As can be understood from mutual comparisons between FIGS. 6A, 7A and 7B, or mutual comparisons between FIGS. 9A to 9C, the first to third array-patterns are made related to a mounting substrate, as patterns that are equal in pitch and different in phase.

Also, by using the technology of MEMS, the third capturing-probes $P_{1B1}$, $P_{1B2}$, $P_{2B1}$, $P_{2B2}$, $P_{3B1}$ and $P_{3B2}$ are provided with the same dimension, shape, structure and direction as the first capturing-probes $P_{1R1}$, $P_{1R2}$, $P_{2R1}$, $P_{2R2}$, $P_{3R1}$ and $P_{3R2}$ of the first picker 13R. Due to the same structure, each of the third capturing-probes $P_{1B1}$, $P_{1B2}$, $P_{2B1}$, $P_{2B2}$, $P_{3B1}$ and $P_{3B2}$ has the double-axis rotation mechanism, illustrated in FIG. 6C as one example, and the third capturing-face and the like. In a configuration that the first capturing-probes $P_{1R1}$, $P_{1R2}$, $P_{2R1}$, $P_{2R2}$, $P_{3R1}$ and $P_{3R2}$ do not have the rotation mechanism, each of the third capturing-probes $P_{1B1}$, $P_{1B2}$, $P_{2B1}$, $P_{2B2}$, $P_{3B1}$ and $P_{3B2}$ will not have the rotation mechanism and becomes fixed structure. The third capturing-face is a flat plane like the first capturing-face 125 and the second capturing-face. In addition, for the sake of illustration convenience, a feature that FIG. 7B simply illustrates the configurations of the sextuple third capturing-probes $P_{1B1}$, $P_{1B2}$, $P_{2B1}$, $P_{2B2}$, $P_{3B1}$ and $P_{3B2}$ is like the cases of FIGS. 6A and 7A. Depending on the number of the third micro-elements (blue micro-LEDs and the like) practically required by an LED display or the like targeted for assembling, the number of the third capturing-probes illustrated in FIG. 7B can be 10,000 to 1,000,000.

For example, in order for setting an array stride between the left third capturing-probe $P_{1B1}$ and the right third capturing-probe $P_{1B2}$ on the first row on a principal-face of the third base-plate of cuboid to three times of the row-direction pitch of the concaves $Q_{11}$, $Q_{12}$, $Q_{13}$, - - - , a third array-pattern of skipping every two chips, which is expressed with aid of virtual chips represented by broken lines, is schematically drawn between the left third capturing-probe $P_{1B1}$ and the right third capturing-probe $P_{1B2}$. That is, the third capturing-probe $P_{1B1}$ is assigned at a position of the concave $Q_{13}$, and the third capturing-probe $P_{1B2}$ is assigned at a position of the concave $Q_{16}$, respectively, which is defined by the third array-pattern of skipping every two chips. The left third capturing-probe $P_{1B1}$ and the right third capturing-probe $P_{1B2}$ are illustrated as inclined elongated bar-shaped structures, extending in lower left direction. And, the third MFA portion of the bar-shaped third capturing-probe $P_{1B1}$ captures the third micro-element $X_{1B1}$ through the third magnetic-force receptor $R_{1B1}$ by the third magnetic lines, and the third MFA portion of the third capturing-probe $P_{1B2}$ captures the third micro-element $X_{1B2}$ through the third magnetic-force receptor $R_{1B2}$ by the third magnetic lines. FIG. 7B illustrates a configuration in which a chip for the third micro-element $X_{1B1}$ is pitch-rotated around a fulcrum, which is defined at the third MFA portion of the left third capturing-probe $P_{1B1}$, by gravity "g", and finely adjusted to the chip-orientation at the nonprovisional-captured stage. Similarly, FIG. 7B illustrates a configuration in which a chip for the third micro-element $X_{1B2}$ is pitch-rotated around a fulcrum, which is defined at the third MFA portion of the right third capturing-probe $P_{1B2}$, by gravity "g", and finely adjusted to the chip-orientation at the nonprovisional-captured stage.

For establishing an array stride between a left third capturing-probes $P_{2B1}$ and a right third capturing-probes $P_{2B2}$ on the second row of the third picker 13B illustrated in FIG. 7B to three times of the row-direction pitch of the concaves $Q_{21}$, $Q_{22}$, $Q_{23}$, - - - , the third array-pattern of skipping every two chips, which is expressed with aid of virtual chips represented by broken lines, is schematically drawn between the left third capturing-probe $P_{2B1}$ and the right third capturing-probe $P_{2B2}$. That is, the left third capturing-probe $P_{2B1}$ is assigned at a position of the concave $Q_{21}$, and the right third capturing-probe $P_{2B2}$ is assigned at a position of the concave $Q_{24}$, respectively, to be defined by the third array-pattern of skipping every two chips. The left third capturing-probe $P_{2B1}$ and the right third capturing-probe $P_{2B2}$ are illustrated as inclined elongated bar-shaped structures, extending in lower left direction. By the way, the third array-pattern in which the third capturing-probe $P_{2B1}$ is assigned at a position of the concave $Q_{21}$ and the third capturing-probe $P_{2B2}$ is assigned at a position of the concave $Q_{24}$ is merely an illustrative exemplification, for convenience's sake of simple explanation, and the third array-pattern is not limited to the array topology illustrated in FIG. 6C. And, the third MFA portion of the bar-shaped third capturing-probe $P_{2B1}$ captures the third micro-element $X_{2B1}$ through the third magnetic-force receptor $R_{2B1}$ by the third magnetic lines, and the third MFA portion of the third capturing-probe $P_{2B2}$ captures the third micro-element $X_{2B2}$ through the third magnetic-force receptor $R_{2B2}$ by the third magnetic lines. FIG. 7B illustrates a configuration in which the third micro-element $X_{2B1}$ is pitch-rotated around a fulcrum, which is defined at the third MFA portion of the left third capturing-probe $P_{2B1}$, by gravity "g", and finely adjusted to the chip-orientation at the nonprovisional-captured stage. Similarly, FIG. 7B illustrates a configuration in which the third micro-element $X_{2B2}$ is pitch-rotated around a fulcrum, which is defined at the third MFA portion of the right third capturing-probe $P_{2B2}$, by gravity "g", and finely adjusted to the chip-orientation at the nonprovisional-captured stage.

On the third row of the third picker 13B illustrated in FIG. 7B, an array stride between a left third capturing-probe $P_{3B1}$ and a right third capturing-probes $P_{3B2}$ is set to three times of the row-direction pitch of the concaves $Q_{31}$, $Q_{32}$, $Q_{33}$, - - -, for establishing the third array-pattern of skipping every two chips, which is expressed with aid of virtual chips represented by broken lines. The virtual chips are schematically drawn between the left third capturing-probe $P_{3B1}$ and the right third capturing-probe $P_{3B2}$. That is, the third capturing-probe $P_{3B1}$ is assigned at a position of the concave $Q_{32}$, and the third capturing-probe $P_{3B2}$ is assigned at a position of the concave $Q_{35}$, respectively, as inclined elongated bar-shaped structures, extending in lower left direction. The positions of the third capturing-probe $P_{3B1}$ and the third capturing-probe $P_{3B2}$ are defined according to the third array-pattern of skipping every two chips.

By the way, the third array-pattern in which the third capturing-probe $P_{3B1}$ is assigned at the position of the concave $Q_{32}$, and the third capturing-probe $P_{3B2}$ is assigned at the position of the concave $Q_{35}$ is merely an illustrative exemplification, for convenience's sake of simple explanation, and is not limited to the array topology illustrated in FIG. 6C. And, the third MFA portion of the bar-shaped third capturing-probe $P_{3B1}$ captures the third micro-element $X_{3B1}$ through the third magnetic-force receptor $R_{3B1}$ by the third magnetic lines, and the third MFA portion of the third capturing-probe $P_{3B2}$ captures the third micro-element $X_{3B2}$ through the third magnetic-force receptor $R_{3B2}$ by the third magnetic lines. FIG. 7B illustrates a configuration in which the third micro-element $X_{3B1}$ is pitch-rotated around a fulcrum by gravity "g", the fulcrum is defined at the third MFA portion of the left third capturing-probe $P_{3B1}$, and the third micro-element $X_{3B1}$ is finely adjusted to the chip-orientation at the nonprovisional-captured stage. Similarly, FIG. 7B illustrates a configuration in which the third micro-element $X_{3B2}$ is pitch-rotated around a fulcrum by gravity "g", the fulcrum is defined at the third MFA portion of the right third capturing-probe $P_{3B2}$, and the third micro-element $X_{3B2}$ is finely adjusted to the chip-orientation at the nonprovisional-captured stage.

As mentioned above, according to the first picker 13R implementing the rough alignment-apparatus in the alignment system of the representative embodiment, the chip-orientations of the first micro-elements $X_{iRj}$ (the directions of vectors from the barycenter positions of the chips for the first micro-elements $X_{iRj}$ to the first ridge-to-be-mated) can be finely adjusted in the range of ±45 degrees or less. Similarly, according to the second picker 13G implementing the rough alignment-apparatus in the alignment system, the chip-orientations of the second micro-elements $X_{iGj}$ (the directions of vectors from the barycenter positions of the chips for the second micro-elements $X_{iGj}$ to the second ridge-to-be-mated) can be finely adjusted in the range of ±45 degrees or less. Also, according to the third picker 13B implementing the rough alignment-apparatus, the chip-orientations of the third micro-elements $X_{iBj}$ (directions of vectors from the barycenter positions of the chips for the third micro-elements $X_{iBj}$ to the third ridge-to-be-mated) can be finely adjusted within a range of ±45 degrees or less. Although the instant explanation has illustrated examples of adjusting the chip-orientations of the first micro-element $X_{iRj}$, the second micro-element $X_{iGj}$ and the third micro-element $X_{iBj}$, even in a case of a module and the like in which a plurality of semiconductor elements and the like are incorporated in a single structured body, a module orientation can be similarly adjusted within a desired angular range.

Precise Alignment-Apparatus for Alignment System

A precise alignment-apparatus implementing the alignment system of the representative embodiment of the present invention encompasses a precise alignment-tray illustrated in FIG. 8A and the like. The array of the concaves $Q_{11}$, $Q_{12}$, $Q_{13}$, $Q_{21}$, - - -, $Q_{31}$, - - - of the precise alignment-tray illustrated in FIG. 8A and the like is the array of the concaves $Q_{11}$, $Q_{12}$, $Q_{13}$, $Q_{21}$, - - -, $Q_{31}$, - - - to which the first to third array-patterns illustrated in FIGS. 6A, 7A and 7B can be assigned respectively. That is, as schematically illustrated in FIG. 8B that is the cross-sectional view in which FIG. 8A is cut along the flat plane D, in the rough alignment-apparatus in the alignment system of the representative embodiment, at first, the first picker 13R at the nonprovisional-captured stage is transported to a location above the precise alignment-tray 14 illustrated in FIG. 8A, and their mutual faces are made opposite and in parallel to each other. An anode electrode $82_{1R1}$ is indicated on the left side of the bottom-face of the first micro-element $X_{1R1}$ located above the concave $Q_{11}$ of the precise alignment-tray 14 in FIG. 8B, and a cathode electrode $83_{1R1}$ is indicated on the right side of the bottom-face of the first micro-element $X_{1R1}$. Also, an anode electrode $82_{1R2}$ is indicated on the left side of the bottom-face of the first micro-element $X_{1R2}$ located above the concave $Q_{14}$ of the precise alignment-tray 14 in FIG. 8B, and a cathode electrode $83_{1R2}$ is indicated on the right side of the bottom-face of the first micro-element $X_{1R2}$.

The positions of the first micro-elements $X_{1R1}$, $X_{1R2}$, $X_{2R1}$, $X_{2R2}$, $X_{3R1}$ and $X_{3R2}$ picked up by the first magnetic lines by employing the first picker 13R are designed according to the first array-pattern, which has the stride with integer times (k times) of the row-direction pitch of the concaves $Q_{11}$, $Q_{12}$, $Q_{13}$, $Q_{21}$, - - -, $Q_{31}$, - - - in the precise alignment-tray 14 (k is a positive integer of double or more). Namely, in case that a large number of first micro-elements are required to be collectively fed into a first specified array-portion of the concaves $Q_{ij}$ in the precise alignment-tray 14 on one occasion as a batch feeding, the first specified array-portion corresponds to array-positions in the first array-pattern, because the first micro-elements are picked up by thinning out the first micro-elements, at a stride with three times of the row-direction pitch of the concaves $Q_{11}$, $Q_{12}$, $Q_{13}$, $Q_{21}$, - - -, $Q_{31}$, - - -, employing the electromagnetic attracting actions by the first picker 13R, and the first micro-elements are collectively fed into the first specified array-portion of the concaves $Q_{ij}$ in the precise alignment-tray 14 on one occasion, the simultaneous entering of double or more first micro-elements into a single concave $Q_{ij}$ in the precise alignment-tray 14 can be protected.

And thereafter, the rough alignment-apparatus in the alignment system of the representative embodiment lowers a horizontal level of the first picker 13R relatively to a horizontal level of the precise alignment-tray 14, while keeping the parallel relation illustrated in FIG. 8B, and makes the level of the first picker 13R closest to the level of the plane (top face) of the precise alignment-tray 14. In a configuration that the first picker 13R is made closest to the plane (top face) of the precise alignment-tray 14, the positions of the plurality of concaves $Q_{11}$, $Q_{14}$, $Q_{22}$, $Q_{25}$, $Q_{33}$ and $Q_{36}$ illustrated in FIG. 8A is horizontally aligned with the positions of the first micro-elements $X_{1R1}$, $X_{1R2}$, $X_{2R1}$, $X_{2R2}$, $X_{3R1}$ and $X_{3R2}$ picked up by the first magnetic lines spread from the first picker 13R, respectively. For example, a laser interferometer, an optical microscope, or the like is used to adjust the relative position. In a configuration that the positions of the concaves $Q_{11}$, $Q_{14}$, $Q_{22}$, $Q_{25}$, $Q_{33}$ and $Q_{36}$ in the precise alignment-tray 14 are positionally aligned with the positions of the first micro-elements $X_{1R1}$, $X_{1R2}$, $X_{2R1}$, $X_{2R2}$, $X_{3R1}$ and $X_{3R2}$ picked up by the first magnetic lines spread from the first picker 13R, the first micro-elements $X_{1R1}$, $X_{1R2}$, $X_{2R1}$, $X_{2R2}$, $X_{3R1}$ and $X_{3R2}$ are released, by stopping the electric supply to the electromagnet in the first picker 13R. and thereby, extinguishing the magnetic-force.

Figure 9A:
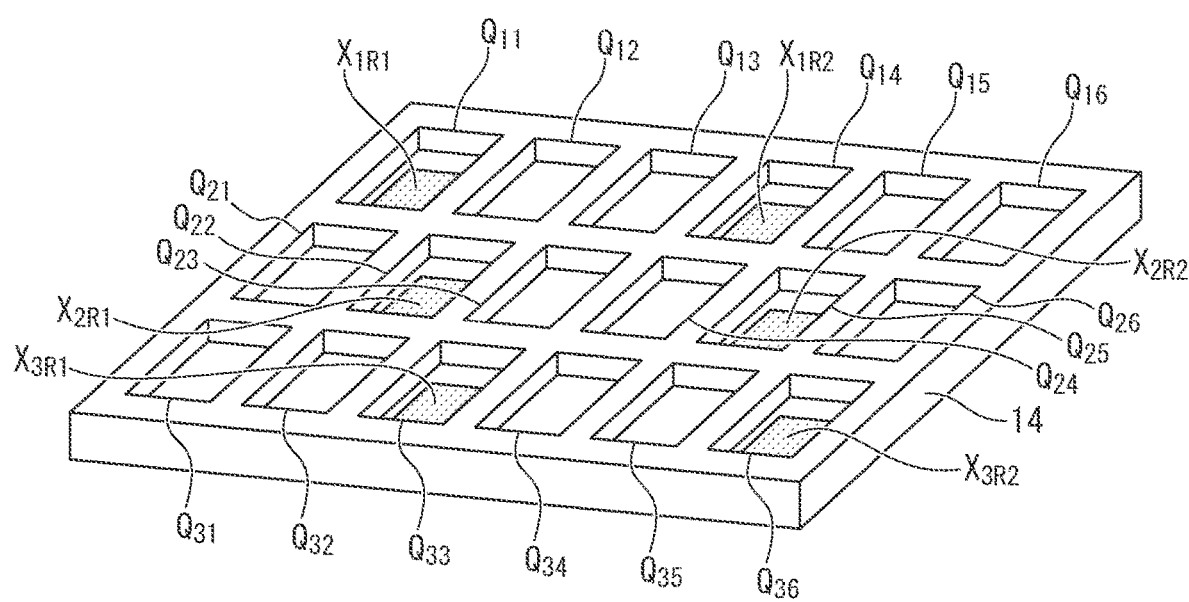
FIG. 9A is a schematic bird's-eye view explaining a situation in which the first micro-elements are put into the concaves on the precise alignment-tray at a pitch of every two by employing the first picker.

After the first micro-elements $X_{1R1}$, $X_{1R2}$, $X_{2R1}$, $X_{2R2}$, $X_{3R1}$ and $X_{3R2}$ have been released from the first picker 13R as illustrated in FIG. 9A, the first micro-elements $X_{1R1}$, $X_{1R2}$, $X_{2R1}$, $X_{2R2}$, $X_{3R1}$ and $X_{3R2}$ are fed into the first specified array-portion of the concaves $Q_{11}$, $Q_{14}$, $Q_{22}$, $Q_{25}$, $Q_{33}$ and $Q_{36}$ in the precise alignment-tray 14, respectively, and arranged in the concaves $Q_{11}$, $Q_{14}$, $Q_{22}$, $Q_{25}$, $Q_{33}$ and $Q_{36}$. The chip-orientations of the micro-elements are finely adjusted to the direction required by nonprovisional-captured stage, which is adjusted within the range in which errors of the chip-orientations are ±45 degrees or less, by the orientation-adjustment process by gravity "g" as illustrated in FIG. 6B, by employing the first picker 13R. Thus, the first micro-elements $X_{1R1}$, $X_{1R2}$, $X_{2R1}$, $X_{2R2}$, $X_{3R1}$ and $X_{3R2}$ can be entered into the concaves $Q_{11}$, $Q_{14}$, $Q_{22}$, $Q_{25}$, $Q_{33}$ and $Q_{36}$ in the precise alignment-tray 14, respectively, while rotation angles of the chips are set within the range in which the deviation from the optimal value is ±45 degrees or less, without any error of the inversion between the top and bottom faces of the chip.

On the other hand, in the rough alignment-apparatus in the alignment system of the representative embodiment, by employing the second picker 13G illustrated in FIG. 7B, the chip-orientations of the micro-elements can be finely adjusted to a chip-orientation required by nonprovisional-captured stage, through the orientation-adjustment process using gravity "g" similar to that illustrated in FIG. 6B. Therefore, the second micro-elements $X_{1G1}$, $X_{1G2}$, $X_{2G1}$, $X_{2G2}$, $X_{3G1}$ and $X_{3G2}$ can be put into the concaves $Q_{12}$, $Q_{15}$, $Q_{23}$, $Q_{26}$, $Q_{31}$ and $Q_{34}$ in the precise alignment-tray 14, respectively, while rotation angles of the chips are set within the range in which the deviation from the optimal value is ±45 degrees or less, without any error of the inversion between the top and bottom faces of the chip.

Figure 9B:
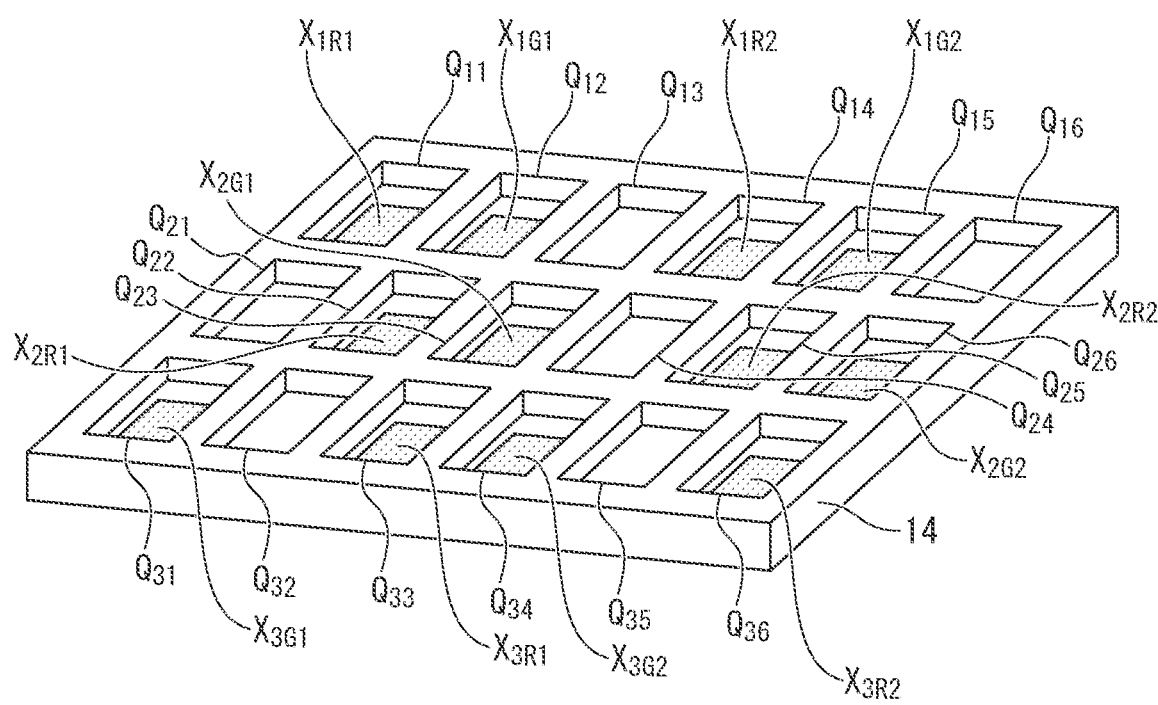
FIG. 9B is a schematic bird's-eye view explaining a situation in which the second micro-elements are put into the concaves on the precise alignment-tray at the pitch of every two by employing the second picker.

The second picker 13G at the nonprovisional-captured stage illustrated in FIG. 7B is transported to a location above the precise alignment-tray 14 illustrated in FIG. 9B, and the principal-faces of the second picker 13G and the precise alignment-tray 14 are made opposite and in parallel to each other, similarly to that illustrated in FIG. 8B. The positions of the second micro-elements $X_{1G1}$, $X_{1G2}$, $X_{2G1}$, $X_{2G2}$, $X_{3G1}$ and $X_{3G2}$ picked up by the second magnetic lines spread from the second picker 13G are designed according to the second array-pattern, which has the stride with integer times (k times) of the pitch for the concaves $Q_{11}$, $Q_{12}$, $Q_{13}$, $Q_{21}$, - - - , $Q_{31}$, - - - in the precise alignment-tray 14. And thereafter, the rough alignment-apparatus in the alignment system of the representative embodiment lowers a horizontal level of the second picker 13G relatively to a horizontal level of the precise alignment-tray 14 and makes the level of the second picker 13G closest to the level of a top face in the precise alignment-tray 14. In a configuration that the second picker 13G is made closest to the level of the top face in the precise alignment-tray 14, the positions of the plurality of concaves $Q_{12}$, $Q_{15}$, $Q_{23}$, $Q_{26}$, $Q_{31}$ and $Q_{34}$ illustrated in FIG. 9B are horizontally aligned with the relative positions of the second micro-elements $X_{1G1}$, $X_{1G2}$, $X_{2G1}$, $X_{2G2}$, $X_{3G1}$ and $X_{3G2}$ picked up by the second magnetic lines spread from the second picker 13G, by the laser interferometer, the optical microscope, or the like.

In a configuration that the positions of the concaves $Q_{12}$, $Q_{15}$, $Q_{23}$, $Q_{26}$, $Q_{31}$ and $Q_{34}$ in the precise alignment-tray 14 are positionally aligned with the positions of the second micro-elements $X_{1G1}$, $X_{1G2}$, $X_{2G1}$, $X_{2G2}$, $X_{3G1}$ and $X_{3G2}$ picked up by the second magnetic lines spread from the second picker 13G, respectively, the second micro-elements $X_{1G1}$, $X_{1G2}$, $X_{2G1}$, $X_{2G2}$, $X_{3G1}$ and $X_{3G2}$ are released into the precise alignment-tray 14, by stopping the electric supply to the electromagnet in the second picker 13G and thereby, extinguishing the magnetic-force. That is, by releasing the second micro-elements $X_{1G1}$, $X_{1G2}$, $X_{2G1}$, $X_{2G2}$, $X_{3G1}$ and $X_{3G2}$ from the second picker 13G, as illustrated in FIG. 9B, the second micro-elements $X_{1G1}$, $X_{1G2}$, $X_{2G1}$, $X_{2G2}$, $X_{3G1}$ and $X_{3G2}$ are fed into a second specified array-portion of the concaves $Q_{12}$, $Q_{15}$, $Q_{23}$, $Q_{26}$, $Q_{31}$ and $Q_{34}$ in the precise alignment-tray 14, respectively, the second specified array-portion corresponds to array-positions in the second array-pattern, and the second micro-elements $X_{1G1}$, $X_{1G2}$, $X_{2G1}$, $X_{2G2}$, $X_{3G1}$ and $X_{3G2}$ are arranged in the concaves $Q_{12}$, $Q_{15}$, $Q_{23}$, $Q_{26}$, $Q_{31}$ and $Q_{34}$.

Moreover, in the rough alignment-apparatus in the alignment system of the representative embodiment, by employing the third picker 13B illustrated in FIG. 7C, the chip-orientations of the micro-elements can be finely adjusted to a chip-orientation required by nonprovisional-captured stage, through the orientation-adjustment process using gravity "g" similar to the exemplification in FIG. 6B. Thus, the third micro-elements $X_{1B1}$, $X_{1B2}$, $X_{2B1}$, $X_{2B2}$, $X_{3B1}$ and $X_{3B2}$ can be put into the concaves $Q_{13}$, $Q_{16}$, $Q_{21}$, $Q_{25}$, $Q_{32}$ and $Q_{35}$ in the precise alignment-tray 14, respectively, while rotation angles of the chips are set within the range in which the deviation from the optimal value is ±45 degrees or less, without any error of the inversion between the top and bottom faces of the chip.

Figure 9C:
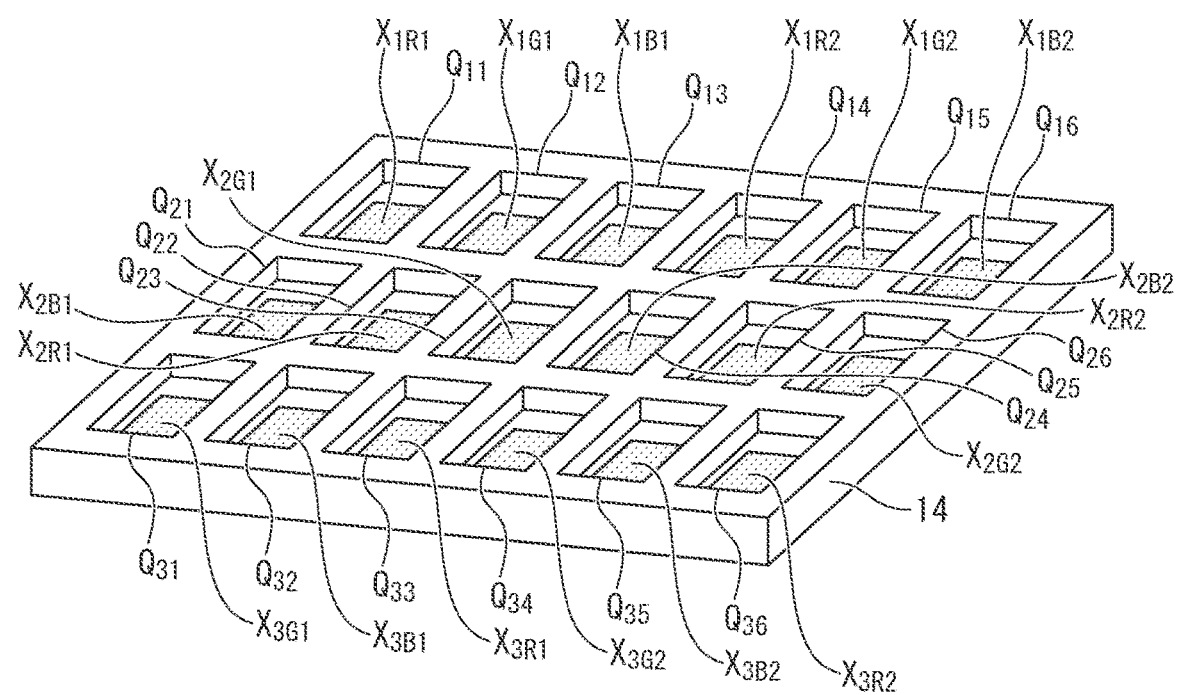
FIG. 9C is a schematic bird's-eye view explaining a situation in which the third micro-elements are put into the concaves on the precise alignment-tray at the pitch of every two by employing the third picker.

The third picker 13B at the nonprovisional-captured stage illustrated in FIG. 7C is transported to a location above the precise alignment-tray 14 illustrated in FIG. 9C, and the principal-faces of the third picker 13B and the precise alignment-tray 14 are made opposite and in parallel to each other, similarly to that illustrated in FIG. 8B. The positions of the third micro-elements $X_{1B1}$, $X_{1B2}$, $X_{2B1}$, $X_{2B2}$, $X_{3B1}$ and $X_{3B2}$ picked up by the third magnetic lines spread from the third picker 13B are designed according to the third array-pattern, which has the stride with integer times (k times) of the row-direction pitch of the concaves $Q_{11}$, $Q_{12}$, $Q_{13}$, $Q_{21}$, - - - , $Q_{31}$, - - - in the precise alignment-tray 14. And thereafter, the rough alignment-apparatus in the alignment system of the representative embodiment lowers a horizontal level of the third picker 13B relatively to a horizontal level of the precise alignment-tray 14, and makes the level of the third picker 13B closest to the level of a top face in the precise alignment-tray 14. In a configuration that the third picker 13B is made closest to the level of the top face in the precise alignment-tray 14, the positions of the plurality of concaves $Q_{13}$, $Q_{16}$, $Q_{21}$, $Q_{25}$, $Q_{32}$ and $Q_{35}$ illustrated in FIG. 9C is positionally aligned with the relative positions of the third micro-elements $X_{1B1}$, $X_{1B2}$, $X_{2B1}$, $X_{2B2}$, $X_{3B1}$ and $X_{3B2}$ picked up by the third magnetic lines spread from the third picker 13B, by the laser interferometer or the like.

In a configuration that the positions of the concaves $Q_{13}$, $Q_{16}$, $Q_{21}$, $Q_{25}$, $Q_{32}$ and $Q_{35}$ in the precise alignment-tray 14 are positionally aligned with the positions of the third micro-elements $X_{1B1}$, $X_{1B2}$, $X_{2B1}$, $X_{2B2}$, $X_{3B1}$ and $X_{3B2}$ picked up by the third magnet lines spread from the third picker 13B, the third micro-elements $X_{1B1}$, $X_{1B2}$, $X_{2B1}$, $X_{2B2}$, $X_{3B1}$ and $X_{3B2}$ are released into the precise alignment-tray 14, by stopping the electric supply to the electromagnet in the third picker 13B and thereby, extinguishing the magnetic-force. That is, by releasing the third micro-elements $X_{1B1}$, $X_{1B2}$, $X_{2B1}$, $X_{2B2}$, $X_{3B1}$ and $X_{3B2}$ from the third picker 13B, as illustrated in FIG. 9C, the third micro-elements $X_{1B1}$, $X_{1B2}$, $X_{2B1}$, $X_{2B2}$, $X_{3B1}$ and $X_{3B2}$ are fed into a third specified array-portion of the concaves $Q_{13}$, $Q_{16}$, $Q_{21}$, $Q_{25}$, $Q_{32}$ and $Q_{35}$ in the precise alignment-tray 14, respectively, the third specified array-portion corresponds to array-positions in the third array-pattern, and the third micro-elements $X_{1B1}$, $X_{1B2}$, $X_{2B1}$, $X_{2B2}$, $X_{3B1}$ and $X_{3B2}$ from the third picker 13B are arranged in the concaves $Q_{13}$, $Q_{16}$, $Q_{21}$, $Q_{25}$, $Q_{32}$ and $Q_{35}$.

As mentioned above, according to the rough alignment-apparatus in the alignment system of the representative embodiment, the first micro-elements (red micro-elements) $X_{1R1}$ to $X_{3R2}$ are filled by employing the first picker 13R, the second micro-elements (green micro-elements) $X_{1G1}$ to $X_{3G2}$ are filled by employing the second picker 13G, and the third micro-elements (blue micro-elements) $X_{1B1}$ to $X_{3B2}$ are filled by employing the third picker 13B, in three-separated times, into the concaves $Q_{11}$, $Q_{12}$, $Q_{13}$, $Q_{21}$, - - - , $Q_{31}$, - - - in the precise alignment-tray 14. According to the first picker 13R, the second picker 13G and the third picker 13B, after the microchips exhibiting the random chip-orientation are picked up by the first to third magnetic lines so as not to induce any error of the inversion between the top and bottom faces and brought into provisional-capturing state, the chip-orientations can be finely adjusted by gravity "g" and led to the nonprovisional-captured state. Therefore, the microchips can be put in the concaves $Q_{11}$, $Q_{12}$, $Q_{13}$, $Q_{21}$, - - - , $Q_{31}$, - - - in the precise alignment-tray 14, by setting the deviations of the chip-orientations in the range of ±45 degrees or less, without any error of the inversion between the top and bottom faces of the microchip.

By using the first picker 13R, the second picker 13G and the third picker 13B in turn, a plurality (a large number) of first micro-elements $X_{iRj}$, second micro-elements $X_{iGj}$ and third micro-elements $X_{iBj}$ are put into the concaves $Q_{j(i-1)}$, $Q_{ji}$, $Q_{j(i+1)}$ in the precise alignment-tray 14, in three-separated times, as illustrated in FIG. 10. FIG. 10 illustrates situations in which the first micro-element $X_{iRj}$, the second micro-element $X_{iGj}$ and the third micro-element $X_{iBj}$ are arranged in the concaves $Q_{j(i-1)}$, $Q_{ji}$, $Q_{j(i+1)}$ with anode electrodes and cathode electrodes which are provided on their bottom faces. Although symbols are omitted, the anode electrodes and the cathode electrodes are similar to the anode electrode $82_{1R1}$ and cathode electrode $83_{1R1}$ on the bottom-face side of the first micro-element $X_{1R1}$ in FIG. 8B and the anode electrode $82_{1R2}$ and cathode electrode $83_{1R2}$ on the bottom-face side of the first micro-element $X_{1R2}$.

As illustrated in FIG. 10, the right side-face of the first micro-element $X_{iRj}$ is separated by a distance 81 from the right side-wall of the concave $Q_{j(i-1)}$. Also, as illustrated in FIG. 10, the right side-face of the second micro-element $X_{iGj}$ is separated by a distance $\delta_2$ from the right side-wall of the concave $Q_{ji}$, and the right side-face of the third micro-element $X_{iBj}$ is separated by a distance $\delta_3$ from the right side-wall of the concave $Q_{j(i+1)}$. FIG. 10 exemplifies a case of $\delta_1 > \delta_2 > \delta_3$, which is merely an illustrative exemplification. For example, in various configurations such a $s\delta_2 > \delta_1 > \delta_3$, $\delta_3 > \delta_2 > \delta_1$, and the like, the first micro-element $X_{iRj}$, the second micro-element $X_{iGj}$ and the third micro-element $X_{iBj}$ are arranged at rough precisions in the concaves $Q_{j(i-1)}$, $Q_{ji}$, $Q_{j(i+1)}$. Thus, a variation in which the position-alignment-accuracy exceeds one micrometer is generated at the step illustrated in FIG. 10. However, the deviation of the designed chip-orientation is set to the range of ±45 degrees or less.

The purpose of the precise alignment-apparatus implementing the alignment system of the representative embodiment lies in an architecture, in which a large number of 10,000 to 20,000 or more diced chips, or a large number of first micro-elements $X_{iRj}$, second micro-elements $X_{iGj}$ and third micro-elements $X_{iBj}$ can be mounted on a mounting substrate, by collectively aligning the first micro-elements $X_{iRj}$, the second micro-elements $X_{iGj}$ and the third micro-elements $X_{iBj}$ with a high-precision pitch on one occasion, which facilitates a position-alignment of the first micro-elements $X_{iRj}$, the second micro-elements $X_{iGj}$ and the third micro-elements $X_{iBj}$ to a pattern of the mounting substrate with a precision of one micrometer or less. In FIGS. 9A to 9C, schematic expression of a simple matrix of 3*6 is used for the sake of convenience. In industrial meaning, for example, if i=1 to m, j=1 to n and m=n=100, the total number of the first micro-elements $X_{iRj}$, the second micro-elements $X_{iGj}$ and the third micro-elements $X_{iBj}$ becomes 30,000. Or, if m=n=1000, the total number of the first micro-elements $X_{iRj}$, the second micro-elements $X_{iGj}$ and the third micro-elements $X_{iBj}$ becomes 3,000,000.

Figure 11A:
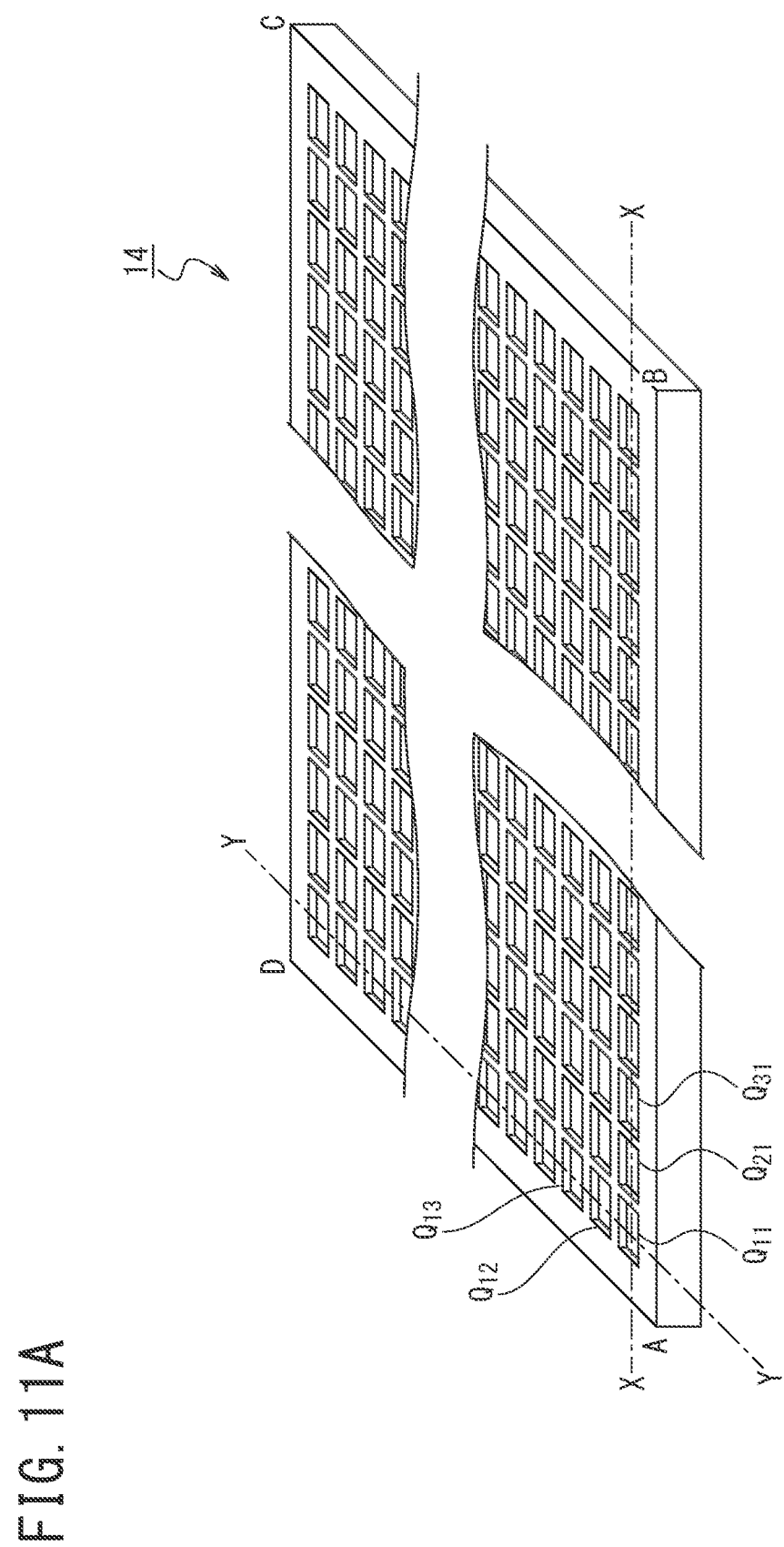
FIG. 11A is a perspective view illustrating the detail of the precise alignment-tray used in the assembling method pertaining to the representative embodiment.

Then, as a configuration close to more realistic situation, if a more practical precise alignment-tray 14 is illustrated as illustrated in FIGS. 11A and 11B, the number of a plurality of concaves $Q_{11}$, $Q_{12}$, $Q_{13}$, $Q_{21}$, - - - , $Q_{31}$, - - - will become far greater than the number of FIGS. 9A to 9C. In FIGS. 11A and 11B, a plurality of concaves $Q_{11}$, $Q_{12}$, $Q_{13}$, $Q_{21}$, - - - , $Q_{31}$, - - - which individually store each of a plurality—a large number—of first micro-elements $X_{iRj}$, second micro-elements $X_{iGj}$ and third micro-elements $X_{iBj}$ are illustrated. Each of micro-elements has quadruple side-faces, in which adjacent side-faces intersect each other at right angle. The first micro-elements $X_{iRj}$, the second micro-elements $X_{iGj}$ and the third micro-elements $X_{iBj}$ are arrayed in accordance with a layout required by a design of the mounting substrate, on which the first micro-elements $X_{iRj}$, the second micro-elements $X_{iGj}$ and the third micro-elements $X_{iBj}$ are mounted according to the layout.

By the way, since a specific layout of a periodic matrix on the mounting substrate is assumed, FIGS. 11A and 11B merely exemplify an array of matrix-shaped concaves $Q_{11}$, $Q_{12}$, $Q_{13}$, $Q_{21}$, - - - , $Q_{31}$, - - - . If a non-periodic layout is required on the mounting substrate, an array of the respective concaves $Q_{11}$, $Q_{12}$, $Q_{13}$, $Q_{21}$, - - - , $Q_{31}$, - - - in the precise alignment-tray will be determined by a pattern, to which the non-periodic layout is projected. Therefore, an array-pattern of the respective concaves $Q_{11}$, $Q_{12}$, $Q_{13}$, $Q_{21}$, - - - , $Q_{31}$, - - - in the precise alignment-tray of the present invention is not limited to the periodic layout illustrated in FIGS. 11A and 11B. In the alignment system of the representative embodiment, one of quadruple inscribed-ridges defined by quadruple side-wall planes in each of the concaves $Q_{11}$, $Q_{12}$, $Q_{13}$, $Q_{21}$, - - - , $Q_{31}$, - - - in the precise alignment-tray 14 is selected as an interface-ridge. That is, one of quadruple corners, at which the quadruple side-wall planes intersected in each of the concaves $Q_{11}$, $Q_{12}$, $Q_{13}$, $Q_{21}$, - - -, $Q_{31}$, - - -, is selected as "an interface-corner E" in each of the concaves $Q_{11}$, $Q_{12}$, $Q_{13}$, $Q_{21}$, - - - , $Q_{31}$, - - -, as illustrated in FIGS. 11A and 11B, and each of the interface-corners E is selected as "an interface-ridge" defined in WO 2022/249431A.

Figure 12A:
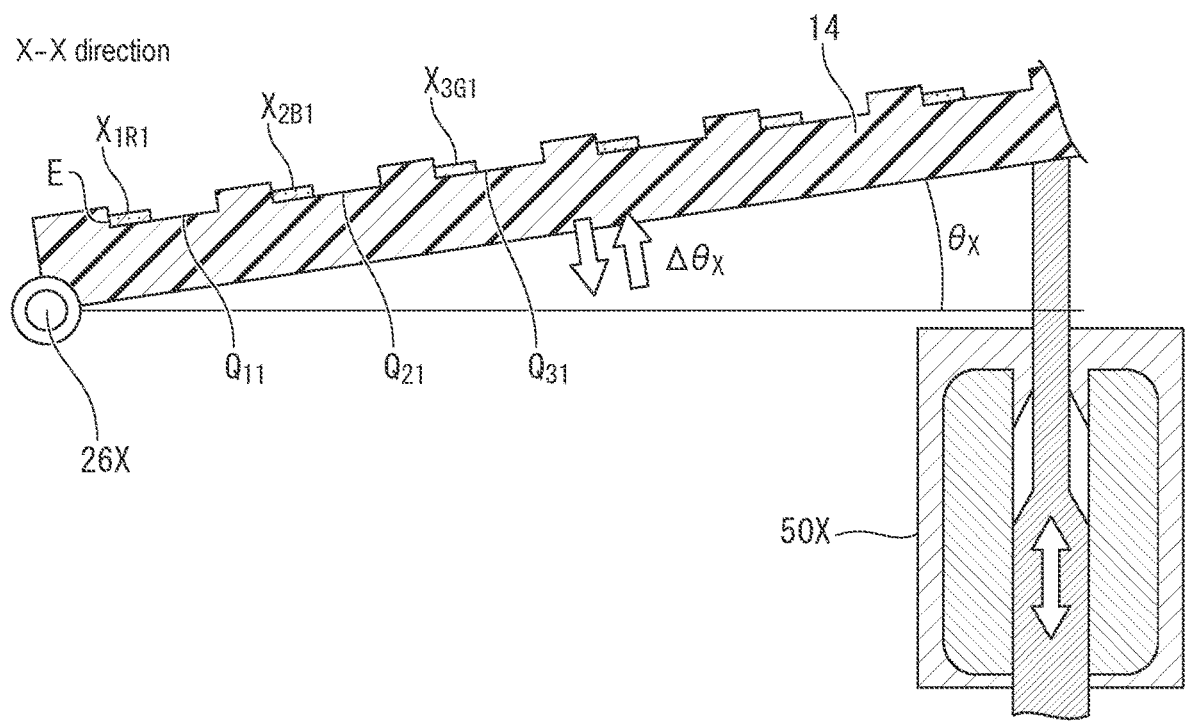
FIG. 12A is a view, which explains a part of double-axes rocking-drive architecture on a cross-section along an X-X line in FIG. 11A and illustrates mating (interfacing) operations of the micro-elements to corresponding corners in the concaves, which are cut in the precise alignment-tray, by driving the precise alignment-tray.
Figure 12B:
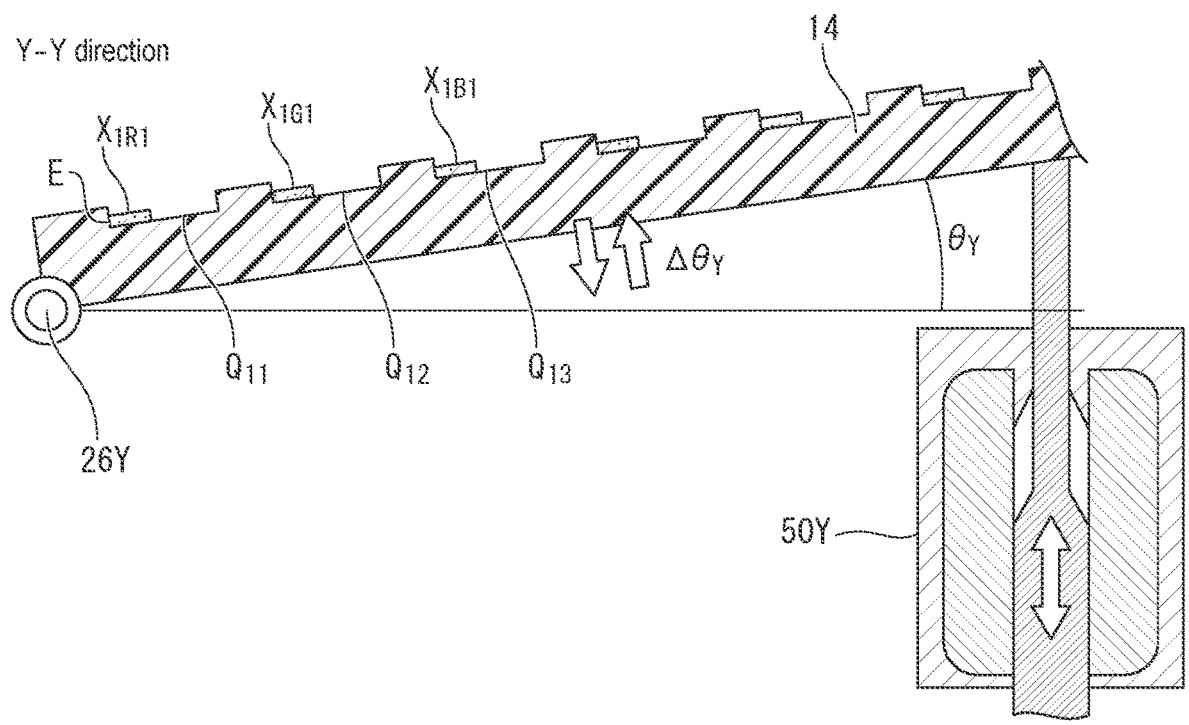
FIG. 12B is a view, which explains another part of double-axes rocking-drive architecture on a cross-section along a Y-Y line in FIG. 11A and illustrates mating/interfacing operations of the micro-elements to corresponding corners in the concaves, which are cut in the precise alignment-tray, by driving the precise alignment-tray.
Figure 12C:
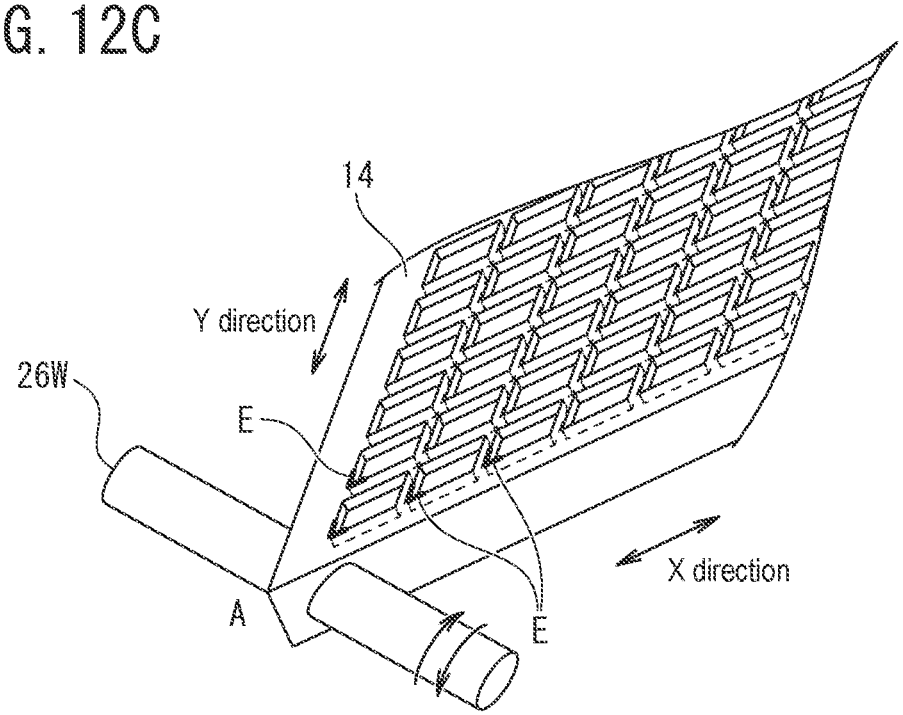
FIG. 12C is a view illustrating mating/interfacing operations of the micro-elements to corresponding corners in the concaves, which are cut in the precise alignment-tray, by performing a single-axis shaking drive on the precise alignment-tray.

As defined in WO 2022/249431A, "the interface-ridge" is one of ridges at which the inner wall-planes of each of the concaves $Q_{11}$, $Q_{12}$, $Q_{13}$, $Q_{21}$, - - -, $Q_{31}$, - - - intersect in the three-dimensional Euclidean space. A driver (50X, 50Y) rock-drives the precise alignment-tray 14 in such a way that displacement-driving forces for displacing the first to third ridges-to-be-mated in each of the plurality of first micro-elements $X_{iRj}$, second micro-elements $X_{iGj}$ and third micro-elements $X_{iBj}$ to the interface-ridges, which are elected for the interface-corners E of each of the concaves $Q_{11}$, $Q_{12}$, $Q_{13}$, $Q_{21}$, - - -, $Q_{31}$, - - - in the precise alignment-tray 14, are applied to each of a plurality of rectangular elements, as illustrated in FIGS. 12A to 12C. Besides, in the following explanations, when "the first to third ridges-to-be-mated" are not especially distinguished, they are generically referred to simply as "a ridge-to-be-mated".

Also, in the following explanations in FIGS. 12A to 12C, the first micro-elements (red micro-elements) $X_{iRj}$, the second micro-elements (green micro-elements) $X_{iGj}$ and the third micro-elements (blue micro-elements) $X_{iBj}$ are simplified and represented as "micro-elements $X_{iRj}$, $X_{iGj}$ and $X_{iBj}$" for the sake of convenience without being distinguished. The precise alignment-tray 14 is a member for batch alignment process of a large number of micro-elements $X_{iRj}$, $X_{iGj}$ and $X_{iBj}$, which are roughly aligned at pitches having variations. By the batch alignment process, a two-dimensional pitch accuracy of the micro-elements $X_{iRj}$, $X_{iGj}$ and $X_{iBj}$ is made high, to achieve the microscopic-minuteness and high-precision. And then, the precise alignment-tray 14 encompasses a plate-shaped main body and a plurality of concaves $Q_{11}$, $Q_{12}$, $Q_{13}$, $Q_{21}$, - - -, $Q_{31}$, - - - which are arranged in a shape of matrix at one of the principal-faces of the main body, and in which the large number of micro-elements $X_{iRj}$, $X_{iGj}$ and $X_{iBj}$ are arranged, as illustrated in FIGS. 11A and 11B. Viewed as a whole, the precise alignment-tray 14 is shaped similarly to a waffle of baked crisp-cake. As illustrated in FIG. 11A, although the precise alignment-tray 14 is a tetragon having quadruple ridges A, B, C and D, a size of each of the concaves $Q_{11}$, $Q_{12}$, $Q_{13}$, $Q_{21}$, - - -, $Q_{31}$, - - - is assumed to be larger than a size of each of the micro-elements $X_{iRj}$, $X_{iGj}$ and $X_{iBj}$.

For example, the design size of each of the concaves $Q_{11}$, $Q_{12}$, $Q_{13}$, $Q_{21}$, - - -, $Q_{31}$, - - - is preferred so that a diagonal-length of each of the concaves $Q_{11}$, $Q_{12}$, $Q_{13}$, $Q_{21}$, - - -, $Q_{31}$, - - - is longer by 50% or more than a diagonal-length of each of the micro-elements $X_{1R1}$, $X_{1G1}$, $X_{1B1}$, $X_{2B1}$, - - -, $X_{3G1}$, - - - in a corresponding direction, when the concaves $Q_{11}$, $Q_{12}$, $Q_{13}$, $Q_{21}$, - - -, $Q_{31}$, - - - are viewed as a flat pattern. More concretely, if a size of each of the micro-elements $X_{1R1}$, $X_{1G1}$, $X_{1B1}$, $X_{2B1}$, - - -, $X_{3G1}$, - - - is assumed to be 55 micrometers (longitudinal: X direction)*30 micrometers (lateral: Y direction)*15 micrometers (depth), the size of the concaves $Q_{11}$, $Q_{12}$, $Q_{13}$, $Q_{21}$, - - -, $Q_{31}$, - - - may be set to a dimension of 100 micrometers (longitudinal: X direction)*55 micrometers (lateral: Y direction)*20 micrometers (depth), so that the longitudinal and lateral sizes are about two times greater and the depth is greater than the size of the micro-elements $X_{1R1}$, $X_{1G1}$, $X_{1B1}$, $X_{2B1}$, - - -, $X_{3G1}$, - - - .

The precise alignment-tray 14 is made of rigid material such as silicon, ceramics, metal or the like that can be easily processed. As illustrated in FIG. 11B, each of the concaves $Q_{11}$, $Q_{12}$, $Q_{13}$, $Q_{21}$, - - -, $Q_{31}$, - - - has on a side of ridge A, an interface-corner E with which a circumscribing-ridge of each of rectangular micro-elements $X_{1R1}$, $X_{1G1}$, $X_{1B1}$, $X_{2B1}$, - - -, $X_{3G1}$, - - - is scheduled to be mated. "The interface-corner E" is "the interface-ridge" that is selected as one of quadruple inscribed-ridges, at which vertical sidewall planes extending in X-axis direction and vertical sidewall planes extending in Y-axis direction intersect at right angle. Hereafter, although a case in which on the side of ridge A, the interface-corner E including the interface-ridge, to which one circumscribing-ridge of the micro-elements $X_{1R1}$, $X_{1G1}$, $X_{1B1}$, $X_{2B1}$, - - -, $X_{3G1}$, - - - is scheduled to be mated, is possessed by the concaves $Q_{11}$, $Q_{12}$, $Q_{11}$, $Q_{21}$, - - - , $Q_{31}$, - - - is explained, as an illustrative exemplification, other right-angle corners where one circumscribing-ridge (one ridge-to-be-mated) of the micro-elements $X_{1R1}$, $X_{1G1}$, $X_{1B1}$, $X_{2B1}$, - - -, $X_{3G1}$, - - - is mated with one of ridges B, C and D can be elected, instead of the ridge A.

By using the first picker 13R, the second picker 13G and the third picker 13B, the chip-orientations of the micro-elements $X_{1R1}$, $X_{1G1}$, $X_{1B1}$, $X_{2B1}$, - - -, $X_{3G1}$, - - - are set to a range in which the deviations from the optimal value are ±45 degrees or less. Thus, as explained in WO 2022/249431A, the ridge-to-be-mated can be interfaced with the corresponding interface-ridge efficiently, accurately and closely.

By the driver (50X, 50Y), the precise alignment-tray 14 is shaken, and driven from right to left and up and down, in a configuration such that the positions of the interface-corners E of each of the concaves $Q_{11}$, $Q_{12}$, $Q_{13}$, $Q_{21}$, - - - , $Q_{31}$, - - - are allocated downward along the gravity direction. Thus, the ridges-to-be-mated, each of which is one corner of the large number of micro-elements $X_{1R1}$, $X_{1G1}$, $X_{1B1}$, $X_{2B1}$, - - -, $X_{3G1}$, - - - in the concaves $Q_{11}$, $Q_{12}$, $Q_{13}$, $Q_{21}$, - - -, $Q_{31}$, - - -, are mated, or are interfaced with the interface-ridges at interface-corner E in each of the concaves $Q_{11}$, $Q_{12}$, $Q_{13}$, $Q_{21}$, - - -, $Q_{31}$, - - -, and aligned in the concaves $Q_{11}$, $Q_{12}$, $Q_{13}$, $Q_{21}$, - - -, $Q_{31}$, - - -. Due to an angle relationship between the ridge-to-be-mated and the interface-ridge, each of which has an angle defined in the same three-dimensional Euclidean space, a position-alignment with the pattern of the mounting substrate for the large number of 10,000 to 20,000 or more micro-elements, or the batch alignment with microscopic-minuteness and high-precision, which is excellent in two-dimensional pitch accuracy, can be easily performed. Here, the precise alignment-tray 14 of the representative embodiment has a design-premise that each shape of the large number of micro-elements is generally used rectangular, according to the design-premise, the shape of each of the concaves $Q_{11}$, $Q_{12}$, $Q_{13}$, $Q_{21}$, - - -, $Q_{31}$, - - - is represented as rectangular.

FIG. 12A is a schematic view illustrating a scheme in which the precise alignment-tray 14 is shaken and driven, around a pitch axis 26X. The pitch axis 26X is provided along the Y-axis provided at an end-face side of ridge A of the precise alignment-tray 14 as a rotational axis. The pitch axis 26X is assigned to a direction from the ridge A to the ridge D illustrated in FIG. 11A. On the other hand, FIG. 12B is a schematic view illustrating a scheme in which the precise alignment-tray 14 is shaken and driven with a roll axis 26Y, which is assigned along the X-axis provided at the end-face side of ridge A as a rotational axis. The roll axis 26Y is assigned along a direction from the ridge A to the ridge B illustrated in FIG. 11A. As illustrated in FIG. 12A, if the precise alignment-tray 14 is shaken and driven by a pitch-angle shaking-driver 50X so that the location of the most pitch axis 26X is always positioned downward from other portions of the precise alignment-tray 14, the pitch axis 26X serves as a rotational axis. Then, the micro-elements $X_{1R1}$, $X_{2B1}$ and $X_{3G1}$ are aligned so that the ridges-to-be-mated, each of which is one ridge of the micro-elements $X_{1R1}$, $X_{2B1}$ and $X_{3G1}$, are mated with the interface-ridges elected for the interface-corner E, which is defined by vertical side-wall planes intersecting at 90 degrees, the interface-ridges are provided in each of the concaves $Q_{11}$, $Q_{21}$ and $Q_{31}$.

For example, as illustrated in FIG. 12A, by inclining the precise alignment-tray 14, for example, until a pitch-angle $\theta_X=40$ degrees is established with respect to a horizontal plane passing through the pitch axis 26X, a position of latus B-C, which span from the ridge B to the ridge C, is raised. If the precise alignment-tray 14 is inclined until the pitch-angle $\theta_X=40$ degrees is obtained, each of the micro-elements $X_{1R1}$, $X_{2B1}$ and $X_{3G1}$ illustrated in FIG. 12A is displaced to the direction of the pitch axis 26X to closely contact with the corresponding side-wall of each of the concaves $Q_{11}$, $Q_{21}$ and $Q_{31}$, the side-walls are in parallel with the pitch axis 26X. Moreover, with the angle $\theta_X=40$ degrees as a center, the precise alignment-tray 14 may be shaken and driven, for example, between the pitch-angle $\theta_X=45$ degrees and the pitch-angle $\theta_X=35$ degrees. After that, while the inclination of the pitch-angle $\theta_X=40$ degrees is kept, as illustrated in FIG. 12B, the precise alignment-tray 14 is shaken and driven by the roll-angle shaking-driver 50Y, so that the location of the roll axis 26Y is positioned always downward from other portions of the precise alignment-tray 14, with the roll axis 26Y as a rotational axis.

For example, as illustrated in FIG. 12B, by inclining the precise alignment-tray 14, for example, until a roll-angle $\theta_Y=40$ degrees is established with respect to a horizontal plane passing through the roll axis 26Y, a position of a latus D-C spanning from the ridge D to the ridge C illustrated in FIG. 11A is raised. If the precise alignment-tray 14 is inclined until the roll-angle $\theta_Y=40$ degrees is established, while the location of the roll axis 26Y is positioned downward, each of the micro-elements $X_{1R1}$, $X_{1G1}$ and $X_{1B1}$ illustrated in FIG. 12B is displaced to the direction of the roll axis 26Y, thereby being closely contacted with the side-wall of each of the concaves $Q_{11}$, $Q_{12}$ and $Q_{13}$, the side-walls are in parallel with the roll axis 26Y. Moreover, with the roll-angle $\theta_Y=40$ degrees as a center, the precise alignment-tray 14 may be vibrated, for example, between the roll-angle $\theta_Y=45$ degrees and the roll-angle $\theta_Y=35$ degrees.

As just described, through the orientation-adjustment process for finely adjusting the chip-orientation by gravity "g", a double-axis shaking drive, which uses the pitch axis 26X and the roll axis 26Y, is performed with the location at side of ridge A being kept always downward, after the rough arrangement illustrated in FIG. 10. Since the double-axis shaking drive is performed, each of the large number of 10,000 to 20,000 or more micro-elements $X_{iRj}$, $X_{iGj}$ and $X_{iBj}$ (see FIG. 10) is aligned so as to be interfaced with the circumscribing-ridge of the interface-ridge at the interface-corner E of each of the concaves $Q_{j(i-1)}$, $Q_{ji}$, $Q_{j(i+1)}$ when one circumscribing-ridge (ridge-to-be-mated) of the micro-elements $X_{iRj}$, $X_{iGj}$ and $X_{iBj}$ is accurately selected. In the double-axis shaking drive, after the roll-rotation with the roll axis 26Y as a center is performed, the pitch-rotation with the pitch axis 26X as a center may be performed. Or, the roll-rotation and the pitch-rotation may be performed simultaneously.

Or, as illustrated in FIG. 12C, a rotation axis 26W orthogonal to the diagonal direction of the X-axis and the Y-axis is provided near the ridge A, and with the rotation axis 26W as a center, in such a way that the ridge A becomes lower than the other ridges B, C and D, single-axis shaking drive may be performed on the precise alignment-tray 14 by a shaking drive unit (whose illustration is omitted). That is, even by performing the single-axis shaking drive for inclining the precise alignment-tray 14 so that the location of the rotation axis 26W is always positioned downward, and a location of a diagonal line B-D, which span from the ridge B to the ridge D, is positioned upward, while the rotation axis 26W is kept in parallel with the horizontal plane, the first ridge-to-be-mated of each of the large number of 10,000 to 20,000 or more micro-elements $X_{iRj}$, $X_{iGj}$ and $X_{iBj}$ is accurately selected and interfaced with the circumscribing-ridge of the interface-ridge at the interface-corner E of each of the concaves $Q_{p(i-1)}$, $Q_{pi}$, $Q_{p(i+1)}$, the alignment arrangement of a constant pitch can be achieved.

Owing to the shaking drive process illustrated in FIGS. 12A to 12C, the chip-orientations and array positions of the micro-elements $X_{iRj}$, $X_{iGj}$ and $X_{iBj}$ can be determined precisely at the same pitch. Thus, anode electrodes of the micro-elements $X_{iRj}$ can be positionally aligned on the mounting substrate at a high-precision of one micrometer or less so as to be able to be connected to corresponding anode bumps, respectively. Similarly, cathode electrodes of the micro-elements $X_{iRj}$ can be positionally aligned at the high-precision, which facilitates the bump-connection with corresponding cathode bumps, respectively. Also, the anode electrodes of the micro-elements $X_{iGj}$ can be positionally aligned on the mounting substrate at the high-precision, which facilitates the bump-connection with corresponding anode bumps, respectively.

As just described, according to the precise alignment-apparatus implementing the alignment system of the representative embodiment, by employing the first picker 13R, the second picker 13G, the third picker 13B and the precise alignment-tray 14, a precise batch alignment of large number of micro-elements $X_{iRj}$, $X_{iGj}$ and $X_{iBj}$, for example 10,000 to 20,000 or more micro-elements $X_{iRj}$, $X_{iGj}$ and $X_{iBj}$, and assembling the large number of the micro-elements $X_{iRj}$, $X_{iGj}$ and $X_{iBj}$ to the mounting substrate so as to be arrayed at the same pitch, without any inversion between the top and bottom faces, and without any abnormality of the chip-orientation, can be achieved. Similarly, even in a case of a module, in which a plurality of semiconductor elements is encapsulated into a single mold structure, a highly-precise batch alignment of a large number of modules and assembling the large number of modules to the mounting substrate, to be arrayed at the same pitch, can be performed, without any abnormality of the chip-orientation. Thus, even if film thickness distributions of crystal growth are different, or even if there are variations of light-emission wavelengths between wafers, after shuffling the micro-elements, the highly-fine assembling technology for batch position-alignment with a large number of micro-elements, according to the pattern of the mounting substrate, can be provided at a high-precision.

Assembling Method

An assembling method pertaining to the representative embodiment of the present invention is explained by using an instance in which first micro-elements (red LEDs) $X_{iRj}$, second micro-elements (green LEDs) $X_{iGj}$ and third micro-elements (blue LEDs) $X_{iBj}$ are to be assembled on a mounting substrate for a micro-LED display. The current micro-LED display has a problem that color unevenness and the like are generated because various variations in optical intensity, central wavelength, width of light-emission wavelength and the like are existing. Because the respective properties of the first micro-element $X_{iRj}$, the second micro-element $X_{iGj}$ and the third micro-element $X_{iBj}$, which are used in the micro-LED display, are sensitively varied because of in-wafer distribution and inter-wafer distribution, which are caused by the changes of slight film thickness, impurity concentration, composition and the like, at a time of crystal growth. That is, the optical intensities, central wavelengths and bandwidths of light-emission wavelengths of the first micro-elements $X_{iRj}$ are respectively varied. Similarly, the optical intensities, central wavelengths and bandwidths of light-emission wavelengths of the second micro-elements $X_{iGj}$ and the optical intensities, central wavelengths and bandwidths of light-emission wavelengths of the third micro-elements $X_{iBj}$ are respectively varied.

Thus, in the current micro-LED display, in order to avoid the color unevenness and the like from being generated, the first micro-elements $X_{iRj}$, the second micro-elements $X_{iGj}$ and the third micro-elements $X_{iBj}$, which are provided by dicing process of the chip regions defined on the wafer, immediately after the crystal growth process, are not preferred to be mounted as its original diced states onto the mounting substrate. Thus, after the dicing process of the first micro-elements $X_{iRj}$, the second micro-elements $X_{iGj}$ and the second micro-elements $X_{iGj}$, the first micro-elements $X_{iRj}$, the second micro-elements $X_{iGj}$ and the second micro-elements $X_{iGj}$ shall be respectively shuffled one time. And then, the orientations of the first micro-elements $X_{iRj}$, the second micro-elements $X_{iGj}$ and the second micro-elements $X_{iGj}$ are changed from the shuffled random state to the precisely aligned state, having a microscopic-minuteness and high-precision, and thereafter, the first micro-elements $X_{iRj}$, the second micro-elements $X_{iGj}$ and the second micro-elements $X_{iGj}$ are transported to a location above a mounting substrate. And thereafter, the first micro-elements $X_{iRj}$, the second micro-elements $X_{iGj}$ and the second micro-elements $X_{iGj}$ are mounted on the mounting substrate, and electrically bonded to the electrodes on the mounting substrate.

That is to say, the assembling method of the representative embodiment requires shuffling process of a plurality of first micro-elements $X_{iRj(i-1)}$, $X_{iRj}$, $X_{jRj(i+1)}$, - - - which are equal in dimension and shape, and then builds a mountain by a group of the plurality of first micro-elements $X_{iRj(j-1)}$, $X_{iRj}$, $X_{iRj(j+1)}$, - - -, as illustrated in FIG. 5. Each of the plurality of first micro-elements $X_{iRj(j-1)}$, $X_{iRj}$, $X_{iRj(j+1)}$, - - - has a first functional face as a predetermined plane having a first FPO site, a first bottom face parallel to the first functional face, and a plurality of circumscribing-ridges connecting the first functional and bottom faces. And a maximum diagonal-length of the first functional face is one mm or less. Also, similarly to that illustrated in FIG. 5, a plurality of second micro-elements which are equal in dimension and shape to the plurality of first micro-elements $X_{iRj(j-1)}$, $X_{iRj}$, $X_{iRj(j+1)}$, - - - and each of which has a second functional face as a predetermined plane having a second FPO site, a second bottom face parallel to the second functional face and a plurality of circumscribing-ridges connecting the second functional face and the second bottom face shall be shuffled to build a mountain by a group of the plurality of second micro-elements. Moreover, a plurality of third micro-elements which are equal in dimension and shape to the plurality of first micro-elements $X_{iRj(j-1)}$, $X_{iRj}$, $X_{iRj(j+1)}$, Each of the third micro-elements has a third functional face as a predetermined plane having a third FPO site, a third bottom face parallel to the third functional face, and a plurality of circumscribing-ridges connecting the third functional face and the third bottom face. The plurality of third micro-elements shall be shuffled to build a mountain by a group of the plurality of third micro-elements, like the mountain illustrated in FIG. 5.

And, as illustrated in FIG. 5, a plurality of first capturing-probes $P_{iRj(j-1)}$, $P_{iRj}$, $P_{iRj(j+1)}$, - - - in which the first MFA portion is provided on each of the first capturing-faces, each of which implementing a flat plane, are inserted into a group of the plurality of shuffled first micro-elements $X_{iRj(j-1)}$, $X_{iRj}$, $X_{iRj(j+1)}$, - - -.

Similarly, a plurality of second capturing-probes, each of which is equal in dimension and shape to the first capturing-probes $P_{iRj(j-1)}$, $P_{iRj}$, $P_{iRj(j+1)}$, - - - is prepared. And, a second MFA portion is arranged on each of the second capturing-faces, each of which implementing a flat plane. The plural second capturing-probes are inserted into a group of the plurality of shuffled second micro-elements, like the situation illustrated in FIG. 5. Moreover, a plurality of third capturing-probes, each of which is equal in dimension and shape to the first capturing-probes $P_{iRj(j-1)}$, $P_{iRj}$, $P_{iRj(j+1)}$, - - - is prepared. And, a third MFA portion is arranged on each of the third capturing-faces, each of which implementing a flat plane. The plurality of third capturing-probes is inserted into a group of a plurality of shuffled third micro-elements, like the situation illustrated in FIG. 5.

Then, each of the first MFA portions of the plurality of first capturing-probes $P_{iRj(j-1)}$, $P_{iRj}$, $P_{iRj(j+1)}$, - - - applies the first magnetic-force to the first magnetic-force receptors $R_{iRj(j-1)}$, $R_{iRj}$, $R_{iRj(j+1)}$, - - -, each of which is allocated at a space other than the first FPO site on the first functional face of the first micro-elements $X_{iRj(j-1)}$, $X_{iRj}$, $X_{iRj(j+1)}$, - - - . Similarly, each of second MFA portions of the plurality of second capturing-probes applies second magnetic-force to second magnetic-force receptors, each of the second magnetic-force receptors is allocated at a space other than the second FPO site on the second functional face. Moreover, each of third MFA portions of the plurality of third capturing-probes applies third magnetic-force to third magnetic-force receptors, each of the third magnetic-force receptors is allocated at a space other than the third FPO site on the third functional face.

As a result, the plurality of first capturing-probes $P_{iRj(j-1)}$, $P_{iRj}$, $P_{iRj(j+1)}$, - - - capture the plurality of first micro-elements $X_{iRj(j-1)}$, $X_{iRj}$, $X_{iRj(j+1)}$, - - - whose number is identical to the number of the plurality of first capturing-probes $P_{iRj(j-1)}$, $P_{iRj}$, $P_{iRj(j+1)}$, - - - from the group of the plurality of first micro-elements $X_{iRj(j-1)}$, $X_{iRj}$, $X_{iRj(j+1)}$, - - -, as illustrated in FIG. 5. Similarly, each of the second MFA portions of the plurality of second capturing-probes captures the plurality of second micro-elements, whose number is identical to the number of the plurality of second capturing-probes, from the group of the plurality of second micro-elements, like the situation illustrated in FIG. 5. Moreover, each of the third MFA portions of the plurality of third capturing-probes captures the plurality of third micro-elements, whose number is identical to the number of the plurality of third capturing-probes, from the group of the plurality of third micro-elements.

Next, as illustrated in FIGS. 6A and 6B, after a situation that a plurality of first capturing-probes $P_{1R1}$, $P_{1R2}$, $P_{2R1}$, $P_{2R2}$, $P_{3R1}$ and $P_{3R2}$ of the first picker 13R capture a plurality of first micro-elements $X_{1R1}$, $X_{1R2}$, $X_{2R1}$, $X_{2R2}$, $X_{3R1}$ and $X_{3R2}$, respectively, the respective orientations of the plurality of first micro-elements $X_{1R1}$, $X_{1R2}$, $X_{2R1}$, $X_{2R2}$, $X_{3R1}$ and $X_{3R2}$ are finely adjusted by gravity "g". Also, as illustrated in FIG. 7A, after a situation that a plurality of second capturing-probes $P_{1G1}$, $P_{1G2}$, $P_{2G1}$, $P_{2G2}$, $P_{3G1}$ and $P_{3G2}$ of the second picker 13G capture a plurality of second micro-elements $X_{1G1}$, $X_{1G2}$, $X_{2G1}$, $X_{2G2}$, $X_{3G1}$ and $X_{3G2}$, respectively, the respective orientations of the plurality of second micro-elements $X_{1G1}$, $X_{1G2}$, $X_{2G1}$, $X_{2G2}$, $X_{3G1}$ and $X_{3G2}$ are finely adjusted by gravity "g". Moreover, as illustrated in FIG. 7B, after a situation that a plurality of third capturing-probes $P_{1B1}$, $P_{1B2}$, $P_{2B1}$, $P_{2B2}$, $P_{3B1}$ and $P_{3B2}$ of the third picker 13B capture a plurality of third micro-elements $X_{1B1}$, $X_{1B2}$, $X_{2B1}$, $X_{2B2}$, $X_{3B1}$ and $X_{3B2}$, respectively, the respective orientations of the plurality of third micro-elements $X_{1B1}$, $X_{1B2}$, $X_{2B1}$, $X_{2B2}$, $X_{3B1}$ and $X_{3B2}$ are finely adjusted by gravity "g".

And, in a situation that by the plurality of first capturing-probes $P_{1R1}$, $P_{1R2}$, $P_{2R1}$, $P_{2R2}$, $P_{3R1}$ and $P_{3R2}$, the respective orientations of the plurality of first micro-elements $X_{1R1}$, $X_{1R2}$, $X_{2R1}$, $X_{2R2}$, $X_{3R1}$ and $X_{3R2}$ are finely adjusted, the second picker 13G collectively transports each of the plurality of first micro-elements $X_{1R1}$, $X_{1R2}$, $X_{2R1}$, $X_{2R2}$, $X_{3R1}$ and $X_{3R2}$ to a location above a precise alignment-tray 14 on one occasion, in the precise alignment-tray 14 the plurality of concaves are arrayed. And, as illustrated in FIG. 8B, the precise alignment-tray 14 and the first picker 13R are made opposite and in parallel to each other, and the positions of the plurality of first micro-elements $X_{1R1}$, $X_{1R2}$, $X_{2R1}$, $X_{2R2}$, $X_{3R1}$ and $X_{3R2}$ are horizontally aligned with the positions of the plurality of concaves. And, the first picker 13R collectively drops the plurality of first micro-elements $X_{1R1}$, $X_{1R2}$, $X_{2R1}$, $X_{2R2}$, $X_{3R1}$ and $X_{3R2}$ into each of the concaves corresponding to the array of the first array-pattern, among the plurality of concaves in the precise alignment-tray 14, and collectively stores the first micro-elements $X_{1R1}$, $X_{1R2}$, $X_{2R1}$, $X_{2R2}$, $X_{3R1}$ and $X_{3R2}$ in each of the corresponding concaves on one occasion, as illustrated in FIG. 9A.

Also, after a state that, by using the plurality of second capturing-probes $P_{1G1}$, $P_{1G2}$, $P_{2G1}$, $P_{2G2}$, $P_{3G1}$ and $P_{3G2}$, the respective orientations of the plurality of second micro-elements $X_{1G1}$, $X_{1G2}$, $X_{2G1}$, $X_{2G2}$, $X_{3G1}$ and $X_{3G2}$ are finely adjusted, the second picker 13G collectively transports each of the plurality of second micro-elements $X_{1G1}$, $X_{1G2}$, $X_{2G1}$, $X_{2G2}$, $X_{3G1}$ and $X_{3G2}$ to a location above the precise alignment-tray 14 on one occasion. And, similarly to that illustrated in FIG. 8B, the precise alignment-tray 14 and the second picker 13G are made opposite and in parallel to each other, and the positions of second micro-elements $X_{1G1}$, $X_{1G2}$, $X_{2G1}$, $X_{2G2}$, $X_{3G1}$ and $X_{3G2}$ are horizontally aligned with the positions of the plurality of concaves, respectively. And, the second picker 13G collectively drops the plurality of second micro-elements $X_{1G1}$, $X_{1G2}$, $X_{2G1}$, $X_{2G2}$, $X_{3G1}$ and $X_{3G2}$ into each of the concaves corresponding to the second array-pattern, among the plurality of concaves in the precise alignment-tray 14, and collectively stores the second micro-elements $X_{1G1}$, $X_{1G2}$, $X_{2G1}$, $X_{2G2}$, $X_{3G1}$ and $X_{3G2}$ in each of the corresponding concaves on one occasion, as illustrated in FIG. 9B.

Moreover, after a state that, by using the plurality of third capturing-probes $P_{1B1}$, $P_{1B2}$, $P_{2B1}$, $P_{2B2}$, $P_{3B1}$ and $P_{3B2}$, the respective orientations of the plurality of third micro-elements $X_{1B1}$, $X_{1B2}$, $X_{2B1}$, $X_{2B2}$, $X_{3B1}$ and $X_{3B2}$ are finely adjusted, the third picker 13B collectively transports each of the plurality of third micro-elements $X_{1B1}$, $X_{1B2}$, $X_{2B1}$, $X_{2B2}$, $X_{3B1}$ and $X_{3B2}$ to a location above the precise alignment-tray 14 on one occasion. And, similarly to that illustrated in FIG. 8B, the precise alignment-tray 14 and the third picker 13B are made opposite and in parallel to each other, and the positions of the third micro-elements $X_{1B1}$, $X_{1B2}$, $X_{2B1}$, $X_{2B2}$, $X_{3B1}$ and $X_{3B2}$ are horizontally aligned with the positions of the plurality of concaves, respectively. And, the third picker 13B collectively drops the plurality of third micro-elements $X_{1B1}$, $X_{1B2}$, $X_{2B1}$, $X_{2B2}$, $X_{3B1}$ and $X_{3B2}$ into each of the concaves corresponding to the third array-pattern in the precise alignment-tray 14, and collectively stores them in each of the corresponding concaves on one occasion, as illustrated in FIG. 9C.

One out of a plurality of inscribed-ridges defined by side-wall planes of each of the concaves $Q_{11}$, $Q_{12}$, $Q_{13}$, $Q_{21}$, - - - , $Q_{31}$, - - - in the precise alignment-tray 14 is selected as an interface-ridge of each of the plurality of concaves. Each of first ridges-to-be-mated that is selected among the circumscribing-ridges, which are constructed by side-faces defining the three-dimensional shape of the first micro-elements $X_{iRj}$, as a site close to a corresponding interface-ridge. Each of second ridges-to-be-mated is selected among the circumscribing-ridges, which are constructed by side-faces defining the three-dimensional shape of the second micro-elements $X_{iGj}$, as a site close to a corresponding interface-ridge. And, each of third ridges-to-be-mated is selected among the circumscribing-ridges, which are constructed by side-faces defining the three-dimensional shape of the third micro-elements $X_{iBj}$, as a site close to a corresponding interface-ridge. The first to third ridges-to-be-mated are collectively displaced toward the corresponding interface-ridges of the concaves $Q_{11}$, $Q_{12}$, $Q_{13}$, $Q_{21}$, - - - , $Q_{31}$, - - - , respectively on one occasion. Since each of the first to third ridges-to-be-mated is scheduled to be mated with the corresponding interface-ridge of the concaves $Q_{11}$, $Q_{12}$, $Q_{13}$, $Q_{21}$, - - - , $Q_{31}$, - - - , respectively, the plurality of first micro-elements $X_{iRj}$, the second micro-elements $X_{iGj}$ and the third micro-elements $X_{iBj}$ can be collectively aligned, with microscopic-minuteness and high-precision, on one occasion.

Next, a transport-tray is transported to a location above the plurality of first micro-elements $X_{iRj}$, the second micro-elements $X_{iGj}$ and the third micro-elements $X_{iBj}$, which are stored in the concaves $Q_{11}$, $Q_{12}$, $Q_{13}$, $Q_{21}$, - - - , $Q_{31}$, - - - in the precise alignment-tray 14. If the transport-tray can collectively transport the large number of first micro-elements $X_{iRj}$, second micro-elements $X_{iGj}$ and third micro-elements $X_{iBj}$ on the mounting substrate on one occasion, while the positional relationships between the large number of first micro-elements $X_{iRj}$, the second micro-elements $X_{iGj}$ and the third micro-elements $X_{iBj}$ and the pitch accuracies are kept, the schemes of the transport-trays are not limited to a particular architecture. For example, by using attraction forces due to static electricity, an electrostatic wafer, or an electrostatic chuck that can pick up a large number of micro-elements, or 10,000 to 20,000 or more micro-elements, for example, can be used as the transport-tray for transporting the micro-elements on the mounting substrate. Also, a plate-shaped substrate—main body—which has hydrophilic areas (holding portion) and hydrophobic areas, for example, a picker (chuck) made of plastic substrate may be used as the transport-tray for transporting the micro-elements on the mounting substrate. The hydrophilic areas of the picker can be made of, for example, a silicon dioxide ($SiO_2$) film having hydrophilicity. In addition to the $SiO_2$ film, a silicon nitride film ($Si_3N_4$), a double layer film of aluminum and alumina ($Al/Al_2O_3$), a double layer film of tantalum and tantalum oxide ($Ta/Ta_2O_5$), or the like can be used. The hydrophobic areas of the picker can be made of single-crystalline silicon (Si), silicone resin, fluorinated resin, polyimide resin, resist, wax, benzo-cyclo-butene (BCB), or the like.

To each of the hydrophilic areas on the transport-tray having the hydrophilic and hydrophobic areas, a liquid is attached which absorbs the plurality of first micro-elements $X_{iRj}$, the second micro-elements $X_{iGj}$ and the third micro-elements $X_{iBj}$ (hereinafter, referred to as "the micro-elements $X_{iRj}$, $X_{iGj}$ and $X_{iBj}$"). And, the positions of the liquid are horizontally aligned with the micro-elements $X_{iRj}$, $X_{iGj}$ and $X_{iBj}$. After the completion of the operation for the horizontal alignment of the positions of the liquid with the positions of the plurality of micro-elements $X_{iRj}$, $X_{iGj}$ and $X_{iBj}$, a horizontal level of the transport-tray is lowered relatively with respect to a horizontal level of the precise alignment-tray 14, and the liquid is made to closely contact with the plurality of micro-elements $X_{iRj}$, $X_{iGj}$ and $X_{iBj}$, and the transport-tray can pick up the plurality of micro-elements $X_{iRj}$, $X_{iGj}$ and $X_{iBj}$.

In a configuration that the transport-tray picks up the plurality of micro-elements $X_{iRj}$, $X_{iGj}$ and $X_{iBj}$, the horizontal level of the transport-tray is raised relatively with respect to the horizontal level of the precise alignment-tray 14, and the concaves $Q_{11}$, $Q_{12}$, $Q_{13}$, $Q_{21}$, - - -, $Q_{31}$, - - - in the precise alignment-tray 14 are made empty. Next, the transport-tray is transported to a location above the mounting substrate. The mounting substrate may be a target back-plane or re-configuration wafer, which is used in a manufacturing process for a microchip display. A matrix of pixels, which are arrayed equal in pitch, each of pixels embraces a set of anode and cathode bumps, is delineated on the mounting substrate. And then, the first to third array-patterns are assigned in the matrix of the pixels. Since each of the array-positions of the micro-elements $X_{iRj}$, $X_{iGj}$ and $X_{iBj}$ is defined to be equal in pitch, with microscopic-minuteness and high-precision, by the precise alignment-tray 14, the anode electrode of the first micro-elements $X_{iRj}$ can be horizontally aligned at a high-precision of one micrometer or less, facilitating a bump-connection with the anode bump. Similarly, the cathode electrode of the micro-elements $X_{iRj}$ can be horizontally aligned at a high-precision, facilitating the bump-connection with the cathode bump. Also, the anode electrode of the micro-elements $X_{iGj}$ can be horizontally aligned at a high-precision, facilitating the bump-connection with an anode bump. After the completion of the position-alignment, when the transport-tray is heated to vaporize the liquid, the micro-elements $X_{iRj}$, $X_{iGj}$ and $X_{iBj}$ are released from the transport-tray, respectively. After that, by performing a process for applying an ultrasonic wave or heating, the anode electrode and anode bump of the micro-elements $X_{iRj}$ are bump-connected, and the cathode electrode and the cathode bump are bump-connected. At the same time, the anode electrode and anode bump of the micro-elements $X_{iGj}$ are bump-connected.

As described above, according to the assembling method of the representative embodiment, by using the rough alignment-apparatus, which encompasses the first picker 13R, the second picker 13G and the third picker 13B, and by using the precise alignment-apparatus including the precise alignment-tray 14, the work for assembling the large number of micro-elements $X_{iRj}$, $X_{iGj}$ and $X_{iBj}$, or 10,000 to 20,000 or more micro-elements $X_{iRj}$, $X_{iGj}$ and $X_{iBj}$, at a same pitch with a high microscopic-minuteness can be performed easily at high-precision, without any occurrence of the abnormality in the chip-orientations. Similarly, even in a case of modules, in each of which a plurality of semiconductor elements and the like are encapusulated in a single mold (structure body), the work for assembling many modules at the same pitch with microscopic-minuteness and high-precision without any occurrence of the abnormality of the module orientation can be performed easily at high-precision. Thus, according to the assembling method pertaining to the representative embodiment, a microscopic-minuteness integration-technology, which facilitates a high-precision position-alignment with the pattern of the mounting substrate and an assembling of the hybrid integrated circuit, can be achieved in a simple system configuration, after the large number of micro-elements are randomly shuffled, without reducing the yield and the throughput.

Other Embodiments

As mentioned above, the present invention has been explained illustratively by the representative embodiment. However, the descriptions and drawings that form the part of the disclosure should not be understood to limit the present invention. From the disclosure, various alternative embodiments, examples, and operating techniques may be apparent to those skilled in the art. For example, at the nonprovisional-captured state illustrated in FIG. 6B, a fine adjustment of the chip-orientations of the first micro-elements $X_{iRj}$ at provisional-capturing stage, via pitch-rotations by gravity "g", becomes easy by reducing the currents flowing through the coils 122 has been explained. If the first magnetic lines applied by the first MFA portion becomes too weak, there is a risk that the first micro-elements $X_{iRj}$ might be dropped off, during the orientation is adjusted. Ideally, if there is a magnetic-force which enables the first capturing-probe $P_{iRj}$ to attract the first magnetic-force receptor $R_{iRj}$ of the first micro-elements $X_{iRj}$ by a point contact, the chip-orientations of the first micro-elements $X_{iRj}$ can be finely adjusted by the pitch-rotation without any association with friction force, via the point contact provided at a fulcrum location. However, it is practically difficult to attract the first magnetic-force receptor $R_{iRj}$ of the first micro-elements $X_{iRj}$ by the point contact.

Figure 13:
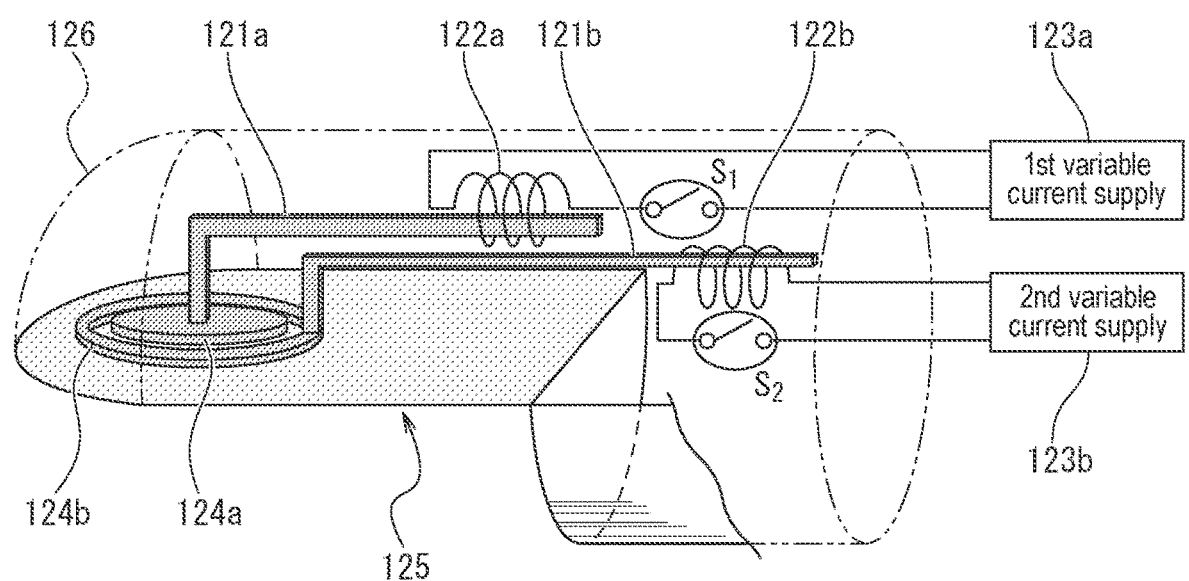
FIG. 13 is a bird's-eye view exemplifying a structure of a first capturing-probe used in an alignment system pertaining to another embodiment of the present invention.

So, as illustrated in FIG. 13, in a structure in which a circular fulcrum area 124a and an annular auxiliary-area 124b concentrically provided around the fulcrum area 124a are provided, by changing magnetic-force distributions between the provisional-capturing state and the nonprovisional-captured state, the drop-off of the first micro-elements $X_{iRj}$ in the orientation adjusting process at the nonprovisional-captured stage can be avoided, and therefore, can perform an efficient pitch-rotation. That is, if at the provisional-capturing state illustrated in FIG. 5, the attracting force is strengthen by using both of magnetic-forces from the fulcrum area 124a and the auxiliary-area 124b, and thereafter, at the nonprovisional-captured state, the magnetic-force of the auxiliary-area 124b is selectively weakened or extinguished, the process of the fine adjustment by the pitch-rotation in the chip-orientations of the first micro-elements $X_{iRj}$ can be conducted efficiently. To selectively change the magnetic-force of the auxiliary-area 124b, as illustrated in FIG. 13, the first capturing-probe $P_{iRj}$ may encompass a first coil 122a, a first core 121a penetrating in a space of the first coil 122a, a second coil 122b, and a second core 121b penetrating in a space of the second coil 122b.

Although FIG. 13 schematically illustrates the first core 121a and the second core 121b as square prisms which are equal in thickness, when each outer diameter of the first core 121a and the second core 121b are thick, magnetic flux densities can be increased as explained in contexts pertaining to FIGS. 4A and 4B. Then, practically, the outer shape of the first core 121a shall be cylindrical having an outer diameter being close to an inner diameter of the first coil 122a at a position of the first coil 122a, but the illustration of the cylindrical shape is simplified to the square prism rod in FIG. 13. Similarly, the outer shape of the second core 121b shall be cylindrical having an outer diameter being close to an inner diameter of the second coil 122b at a position of the second coil 122b, but the illustration of the cylindrical shape is simplified to the square prism rod in FIG. 13.

The first core 121a extending in a lower left direction as a rod of square prism is bent in a right-angled direction to be connected to a pattern of the circular fulcrum area 124a provided on the first capturing-face 125. Also, the second core 121b extending in the lower left direction as a rod of square prism is bent in a right-angled direction to be connected to a pattern of the annular auxiliary-area 124b, which is concentrically provided around the fulcrum area 124a of the first capturing-face 125. As illustrated in FIG. 13, the bottom patterns of the fulcrum area 124a and the auxiliary-area 124b are exposed onto the flat-shaped first capturing-face 125, and the bottom faces of the concentric circular pattern and the annular pattern are level-homologized with the first capturing-face 125 in their external faces.

A first variable current supply 123a and a first switch $S_1$ are connected in series to the first coil 122a so that a current flowing through the first coil 122a can be controlled by the first variable current supply 123a. Similarly, a second variable current supply 123b and a second switch $S_2$ are connected in series to the second coil 122b so that a current flowing through the second coil 122b can be controlled by the second variable current supply 123b. Thus, in the orientation adjusting process at the nonprovisional-captured stage illustrated in FIG. 6B, by decreasing the current flowing through the second coil 122b, the magnetic-force of the auxiliary-area 124b is made weak. Or, by turning off the second switch $S_2$, the magnetic-force of the auxiliary-area 124b can be extinguished.

While the magnetic-force of the auxiliary-area 124b is made weak, if the value of the current flowing through the first coil 122a is kept or made high, it is possible to avoid the first micro-elements $X_{iRj}$ from being dropped off, in the orientation adjusting process in which the chip-orientations of the first micro-elements $X_{iRj}$ at the provisional-capturing state is finely adjusted via the pitch-rotation by gravity "g". By the way, in a scheduled case that the first micro-elements $X_{iRj}$ at the nonprovisional-captured state illustrated in FIG. 8B will be dropped into the concaves, which are cut in the precise alignment-tray 14, it is enough to turn off the first switch $S_1$ that is connected in series to the first coil 122a and the first variable current supply 123a, as a matter of course.

It should be noted that the present invention is not limited to the description of the representative embodiment described above, and various modifications can be made, such as the configurations in which the respective configurations explained in the above-mentioned embodiments are arbitrarily applied, which are also included within the scope of the invention. Therefore, the scope of the present invention is defined only by the technical features specifying the present invention, which are prescribed by claims. And therefore, the words and terms in the claims shall be reasonably construed from the subject matters recited in the present specification.

What is claimed is:

1. An alignment system configured to arrange a plurality of micro-elements at scheduled positions on a mounting substrate, each of the micro-elements including a functional face, a bottom face parallel to the functional face, a plurality of circumscribing- ridges connecting the functional and bottom faces, and a magnetic-force receptor allocated at a limited site on the functional face, the micro-elements are equal in dimension and shape, the system comprising a rough alignment-apparatus including a picker having:
   a plurality of capturing-probes, each of which having a capturing-face made of flat plane and a magnetic-force applying portion provided on the capturing-face; and
   a base-plate on which the plurality of capturing-probes is arrayed with a predetermined array-pattern,
   wherein each of the magnetic-force applying portions applies magnetic lines on the magnetic-force receptor to capture one of the micro-elements, respectively, and positions of a particular circumscribing-ridge elected among the plurality of circumscribing-ridges and the functional face are identified by the magnetic-force receptor.

2. The alignment systems of claim 1, wherein a maximum diagonal-length on the functional face is one mm or less.

3. The alignment system of claim 2, wherein the functional face is assigned as "a first functional face", the bottom face is assigned as "a first bottom face" the micro-elements is assigned as "a first micro-elements", the capturing-face is assigned as "a first capturing-face", the magnetic-force applying portion is assigned as "a first magnetic-force applying portion", the capturing-probe is assigned as "a first capturing-probe", the array-pattern is assigned as "a first array-pattern", the base-plate is assigned as "a first base-plate-plate", the picker is assigned as "a first picker", and the magnetic-force receptor is assigned as "a first magnetic-force receptor", and the rough alignment-apparatus further including a second picker having:
   a plurality of second capturing-probes, each of which is equal in dimension and shape to the first capturing-probes, and each of which having a second capturing-face made of flat plane, and a second magnetic-force applying portion is arranged on each of the second capturing-faces, and
   a second base-plate-plate, on which the plurality of second capturing- probes is arrayed in a second array-pattern that is defined related to the first array-pattern on the mounting substrate,
   wherein each of the second magnetic-force applying portions applies second magnetic lines to a second magnetic-force receptor provided on a second functional face defined on one of second micro-elements, respectively, under a same rule as the first magnetic-force receptor and captures the one of the second micro-elements.

4. The alignment system of claim 3, further comprising a precise alignment-apparatus having a precise alignment-tray with an array of a plurality of concaves to which the first and second array-pattern is assigned,
   wherein each of the plurality of concaves has inscribed angles which are equal to an angle of a first ridge-to-be-mated selected from a plurality of circumscribing-ridges connecting the first functional and bottom faces, and are equal to an angle of a second ridge-to-be-mated selected from the plurality of circumscribing-ridges connecting the second functional and bottom faces, which are same angle as the first ridge-to-be-mated, respectively.

* * * * *